(12) United States Patent
Kumura et al.

(10) Patent No.: US 7,095,068 B2
(45) Date of Patent: Aug. 22, 2006

(54) SEMICONDUCTOR MEMORY DEVICE HAVING FERROELECTRIC CAPACITOR AND METHOD OF MANUFACTURING THE SAME

(75) Inventors: Yoshinori Kumura, Yokohama (JP); Iwao Kunishima, Yokohama (JP); Tohru Ozaki, Tokyo (JP); Hiroyuki Kanaya, Yokohama (JP); Shinichi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/455,376

(22) Filed: Jun. 6, 2003

(65) Prior Publication Data

US 2004/0195601 A1 Oct. 7, 2004

(30) Foreign Application Priority Data

Apr. 7, 2003 (JP) .............................. 2003-102974

(51) Int. Cl.
*H01L 29/76* (2006.01)
*H01L 27/108* (2006.01)

(52) U.S. Cl. ...................... 257/295; 257/311
(58) Field of Classification Search ........ 257/295–313, 257/905–908; 438/240–241, 253–254, 396–398
See application file for complete search history.

(56) References Cited

U.S. PATENT DOCUMENTS

| | | | | | |
|---|---|---|---|---|---|
| 5,903,492 | A | * | 5/1999 | Takashima | 365/145 |
| 5,990,507 | A | * | 11/1999 | Mochizuki et al. | 257/295 |
| 6,107,136 | A | * | 8/2000 | Melnick et al. | 438/253 |
| 6,218,197 | B1 | * | 4/2001 | Kasai | 438/3 |
| 6,458,602 | B1 | * | 10/2002 | Yunogami et al. | 438/3 |
| 6,500,677 | B1 | * | 12/2002 | Bergmann et al. | 438/3 |
| 6,521,929 | B1 | | 2/2003 | Ozaki | |

FOREIGN PATENT DOCUMENTS

JP 10-255483 9/1998

* cited by examiner

*Primary Examiner*—Ori Nadav
(74) *Attorney, Agent, or Firm*—Oblon, Spivak, McClelland, Maier & Neustadt, P.C.

(57) ABSTRACT

A semiconductor memory device includes a semiconductor substrate, a first transistor formed on the semiconductor substrate and including a first gate electrode and first and second diffusion layers, a first contact connected to the first diffusion layer, a first conductive oxygen barrier film electrically connected to the first contact and covering at least the upper surface of the first contact, a first ferroelectric capacitor including a first electrode, a second electrode, and a first ferroelectric film interposed between the first and second electrodes, and a first connecting member connected to the first electrode and to the first conductive oxygen barrier film.

27 Claims, 60 Drawing Sheets

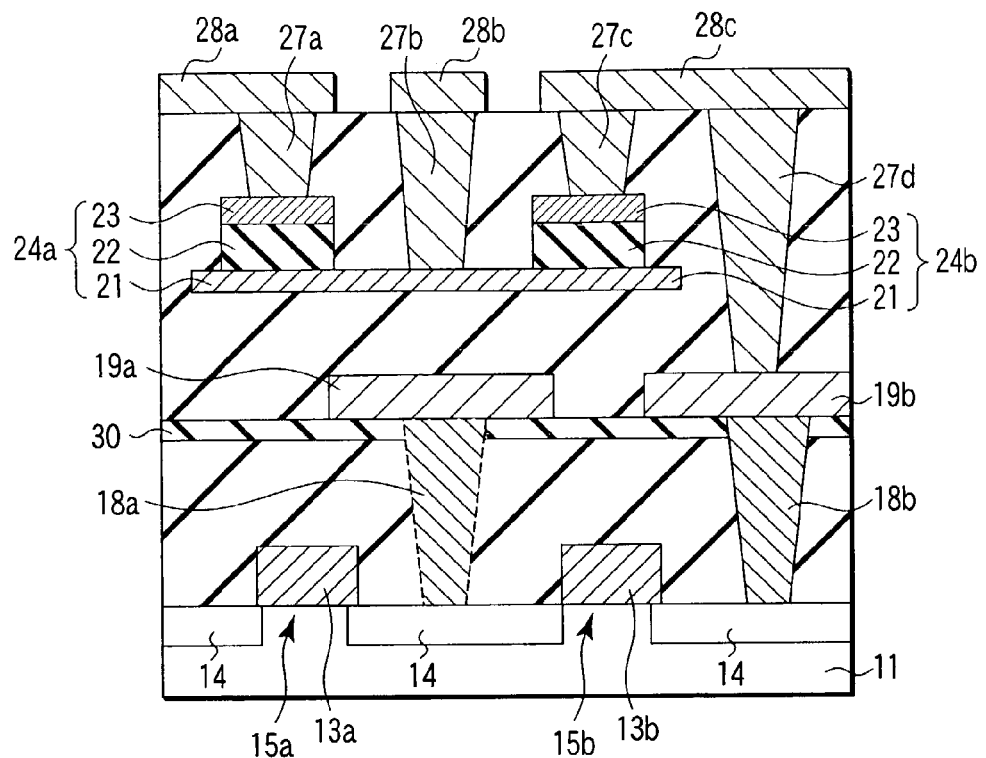
F I G. 15
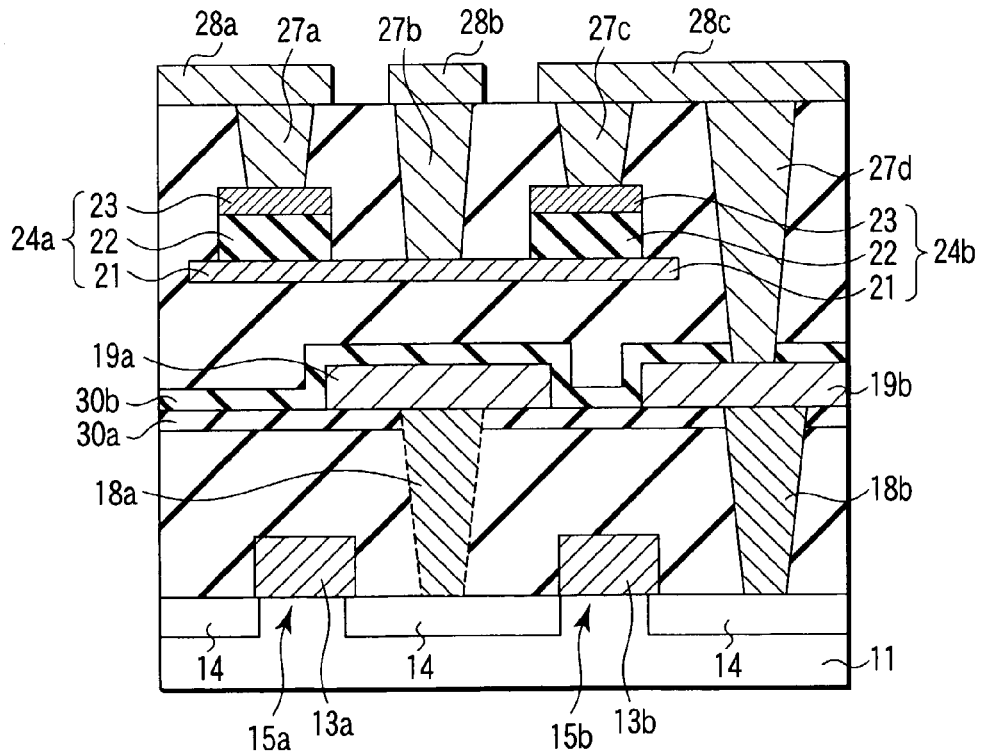
F I G. 16

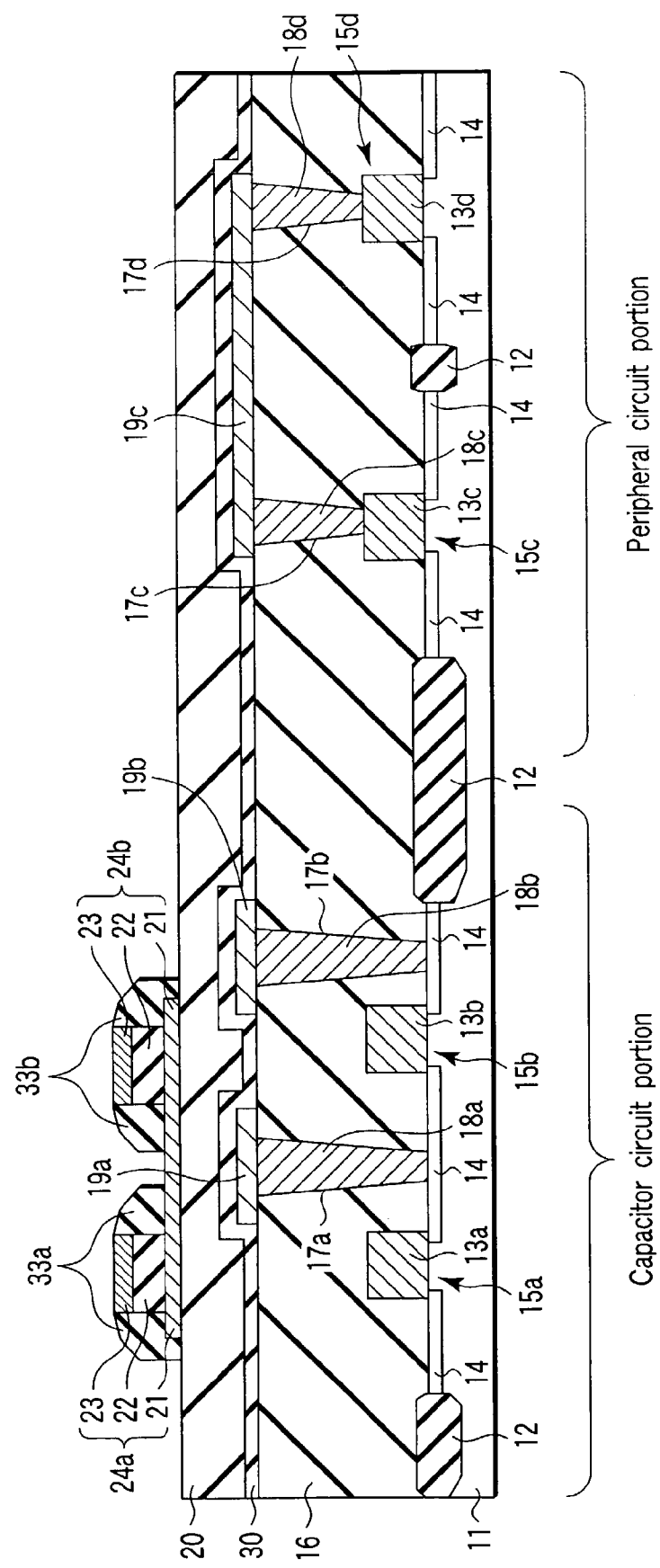
F I G. 27

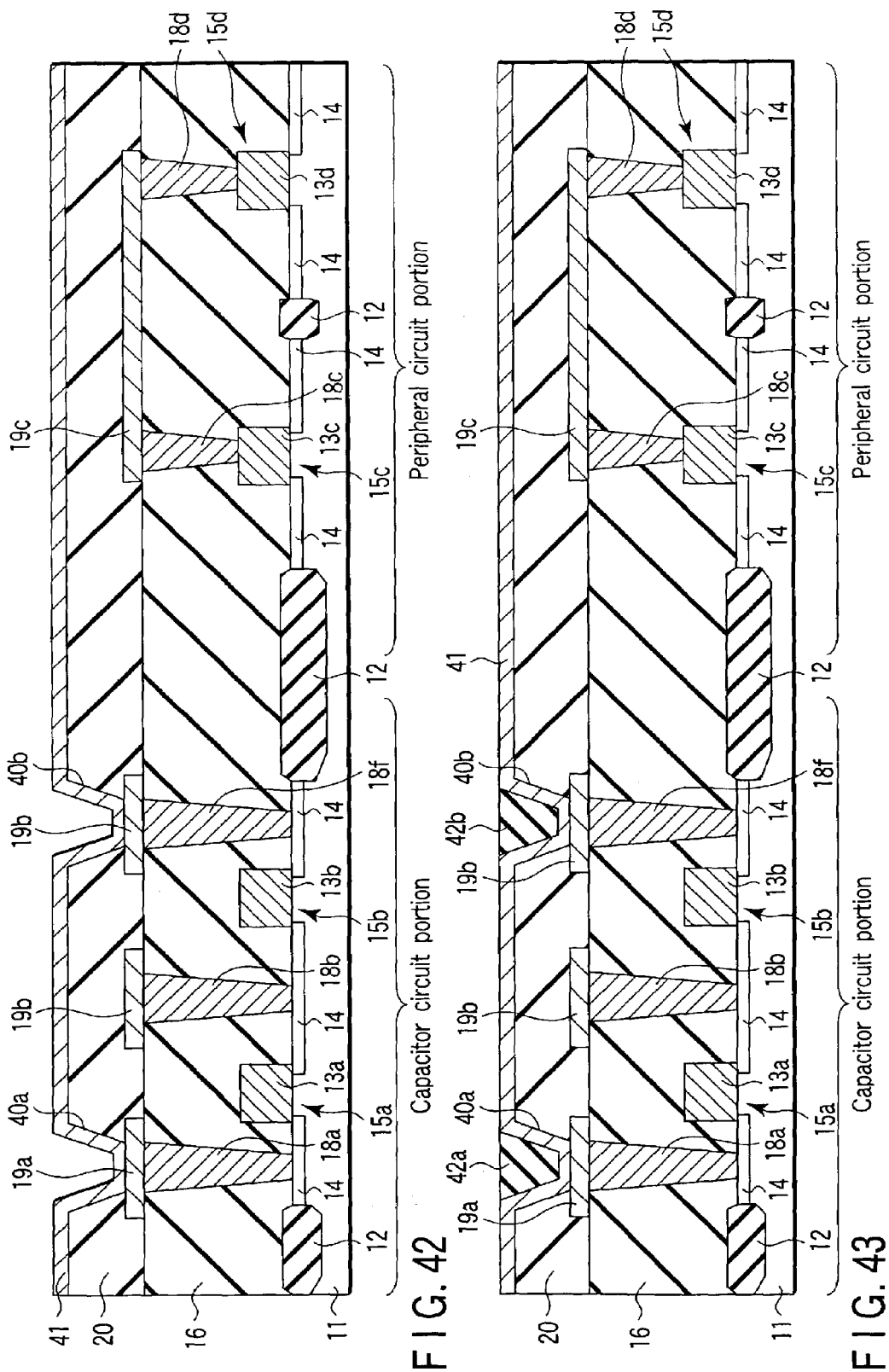

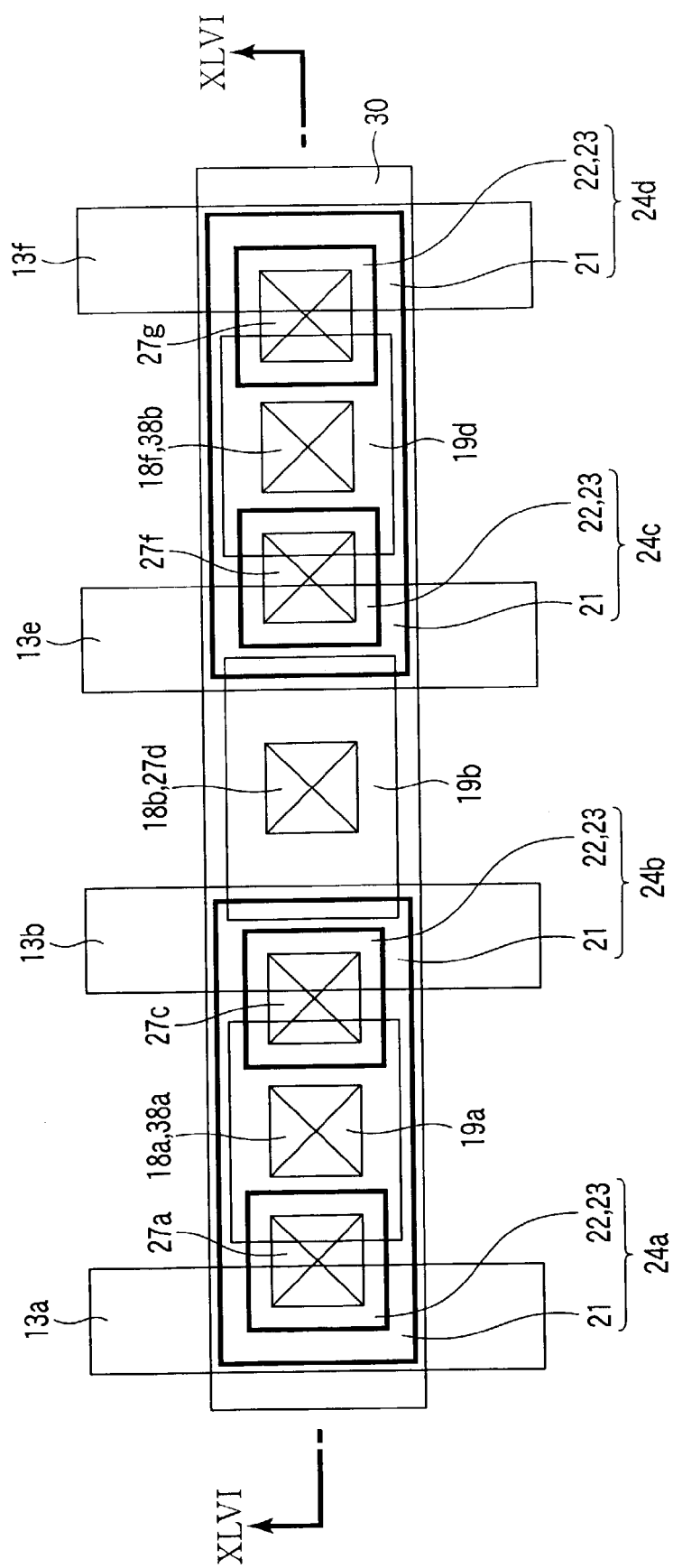
F I G. 45

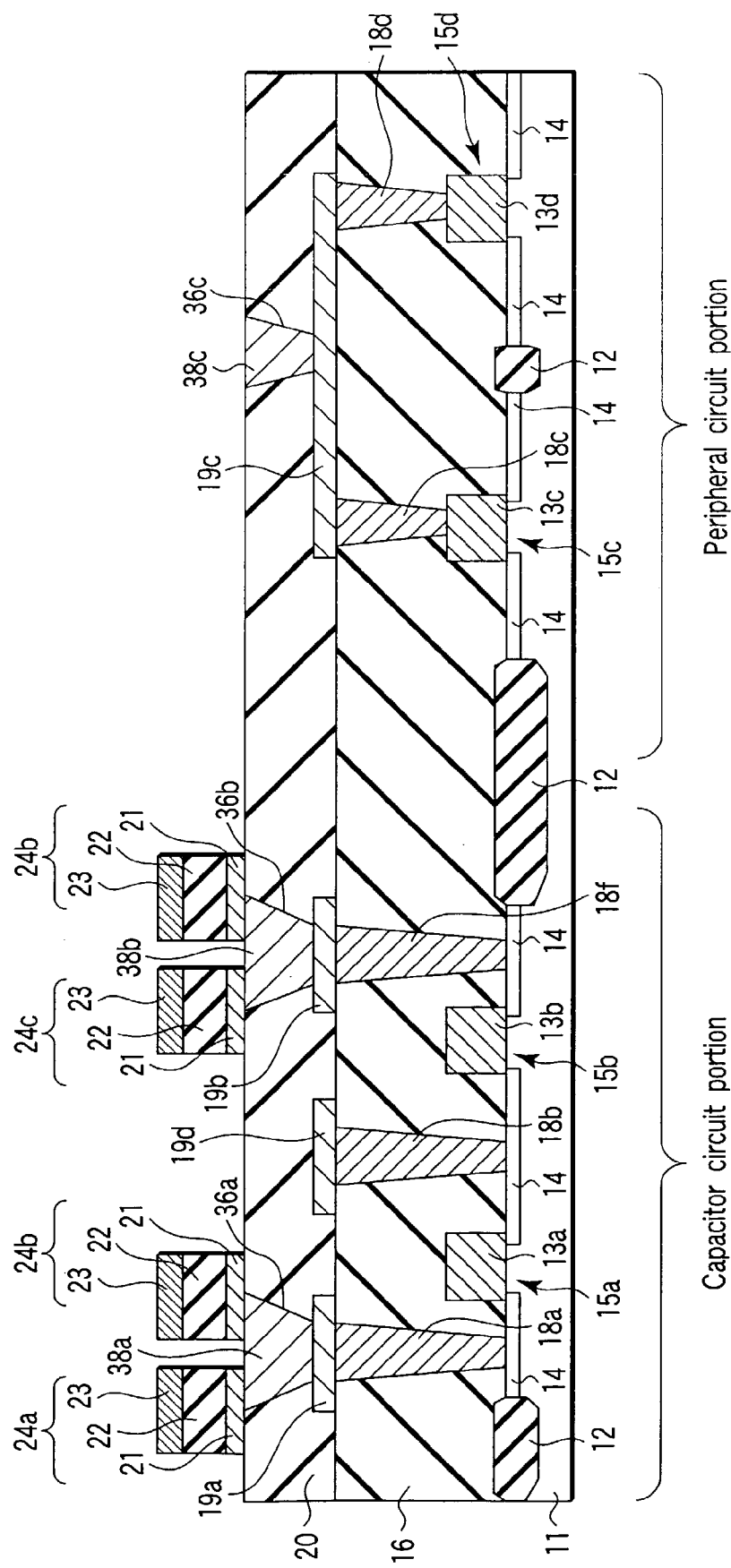
F I G. 55

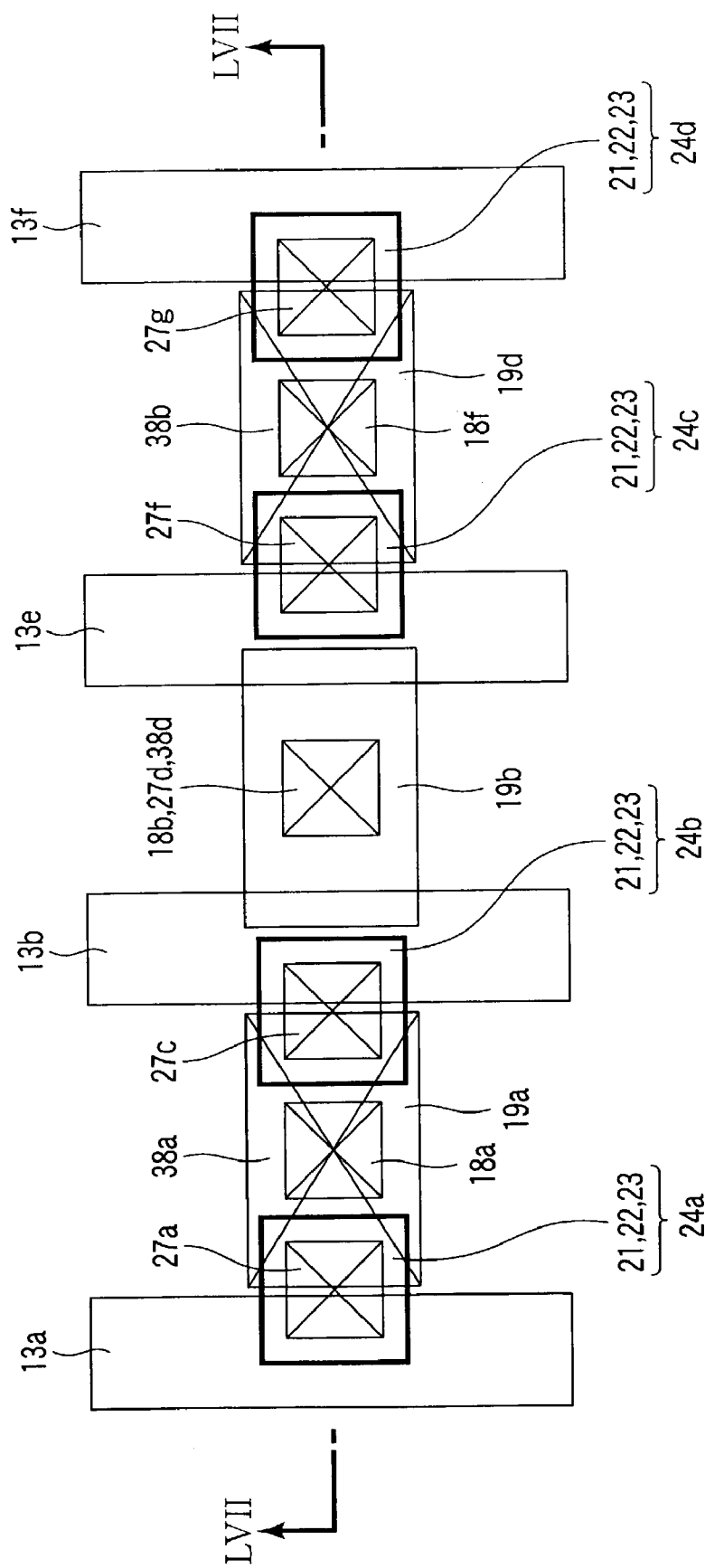
F I G. 56

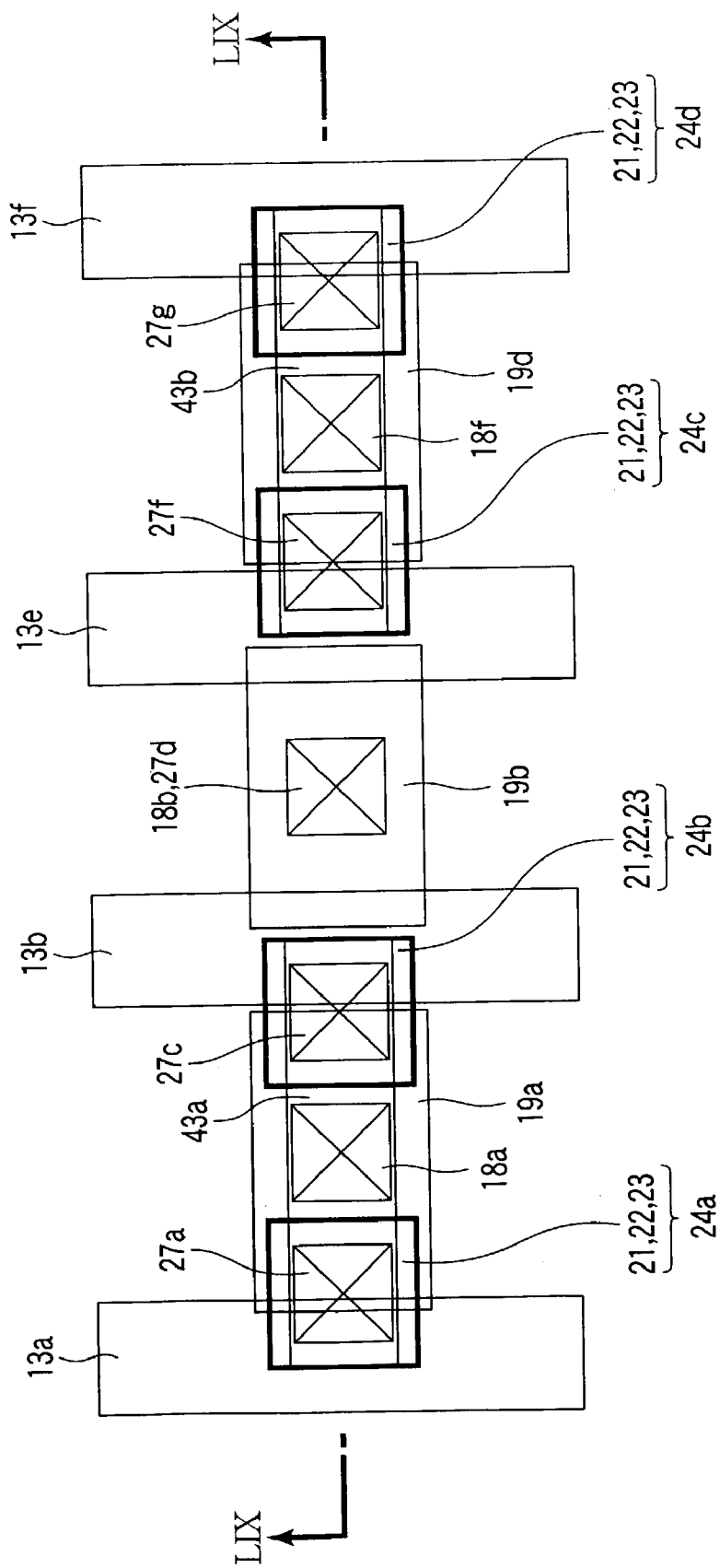
F I G. 58

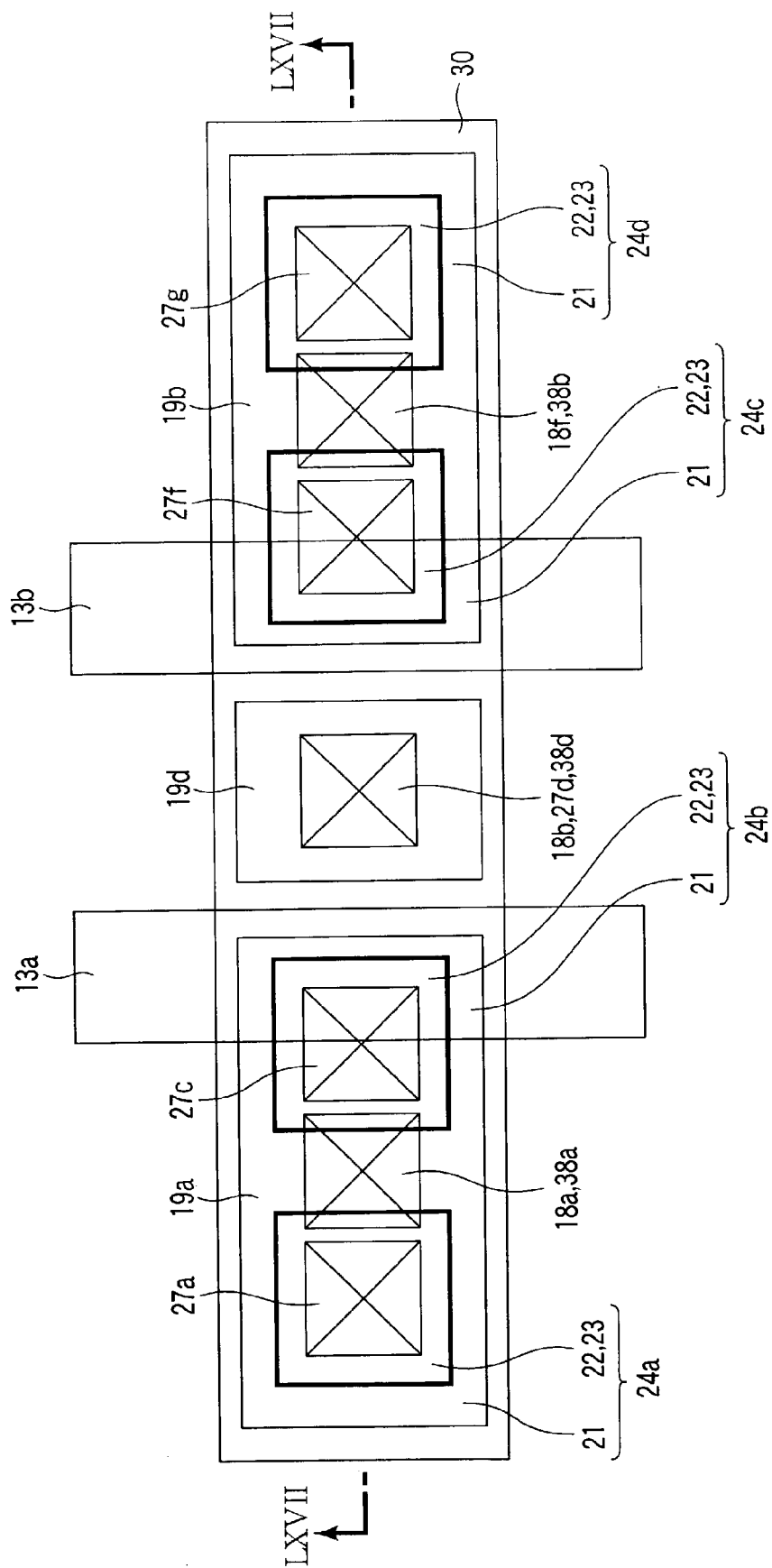
F I G. 66

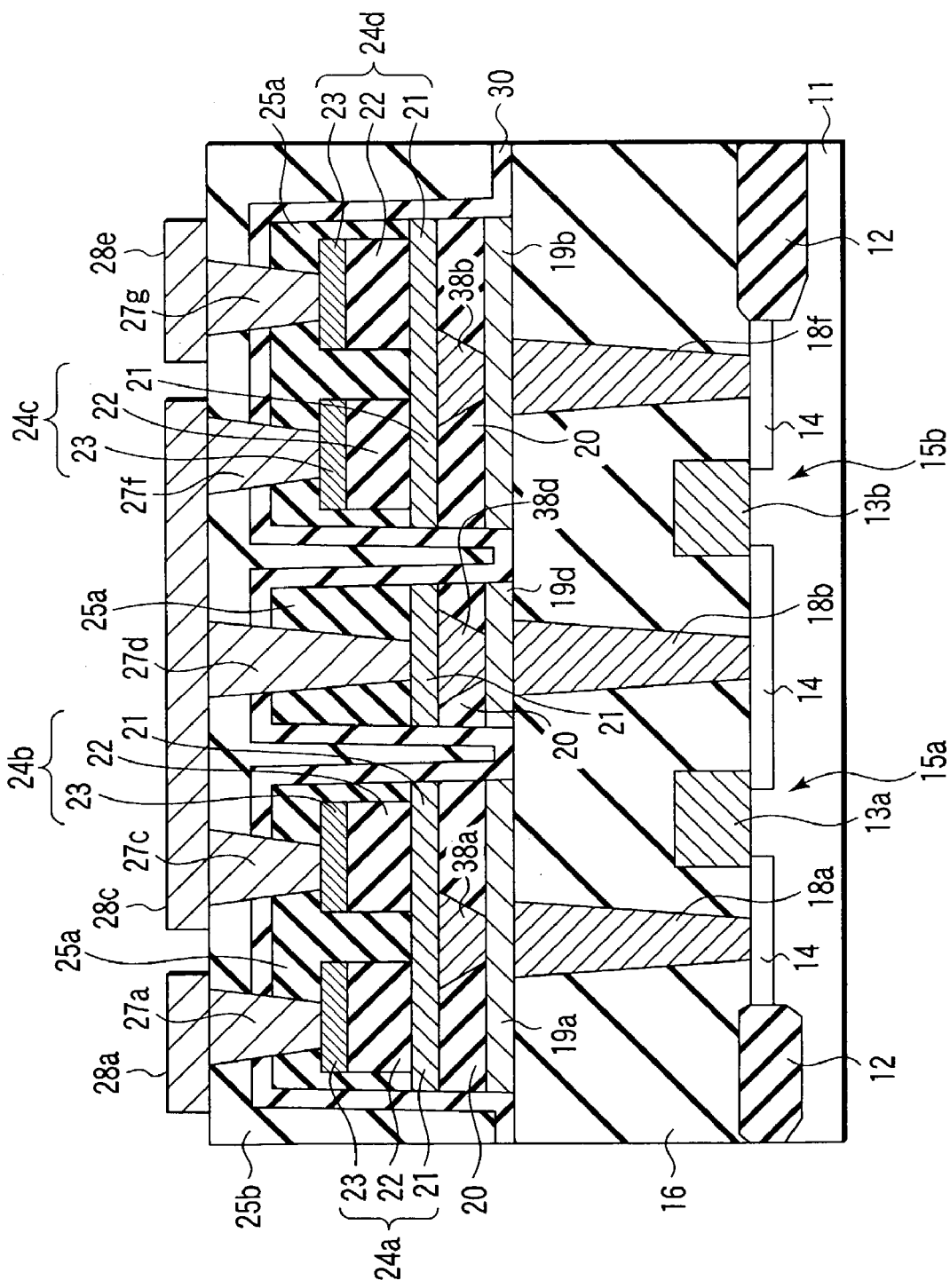
F I G. 67

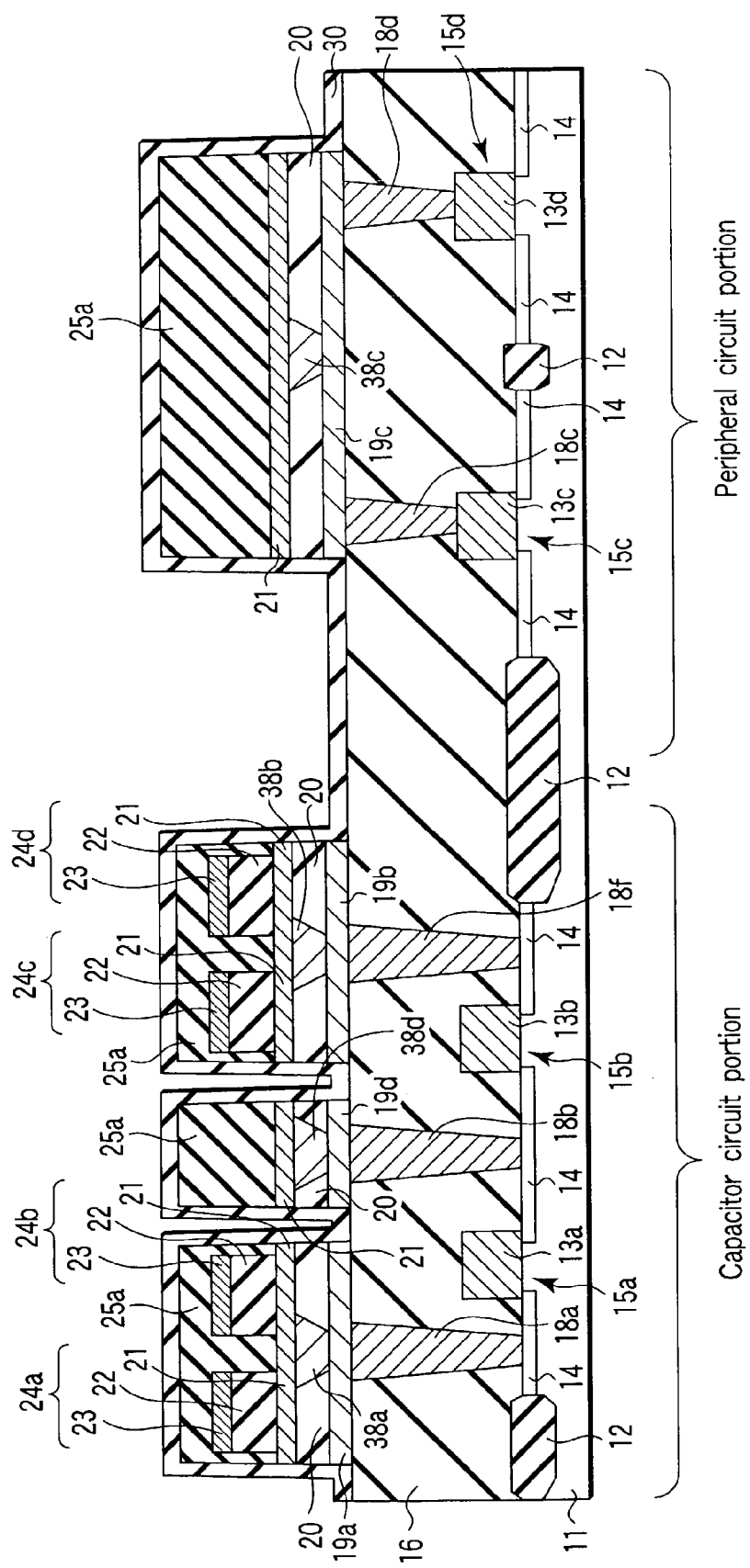
F I G. 74

SEMICONDUCTOR MEMORY DEVICE HAVING FERROELECTRIC CAPACITOR AND METHOD OF MANUFACTURING THE SAME

CROSS-REFERENCE TO RELATED APPLICATIONS

This application is based upon and claims the benefit of priority from the prior Japanese Patent Application No. 2003-102974, filed Apr. 7, 2003, the entire contents of which are incorporated herein by reference.

BACKGROUND OF THE INVENTION

1. Field of the Invention

The present invention relates to a semiconductor memory device having a ferroelectric capacitor and a method of manufacturing the same.

2. Description of the Related Art

In recent years, a nonvolatile memory using a ferroelectric capacitor (FeRAM), as disclosed in, for example, Jpn. Pat. KOKAI Publication No. 10-255483, attracts attentions as one of semiconductor memory devices.

The memory cell of the FeRAM is constructed, for example, as follows. Specifically, a gate electrode is formed on a semiconductor substrate and a pair of source/drain diffusion layers is formed in surface region of the semiconductor substrate in a manner to have the gate electrode sandwiched therebetween, thereby forming a transistor. An interlayer insulating layer is formed on the transistor, and a first contact connected to one of the source/drain diffusion layers of the transistor is formed in the interlayer insulating layer. A second contact is formed on the first contact, and a ferroelectric capacitor including a lower electrode, a ferroelectric film and an upper electrode is connected to the second contact.

In the conventional structure described above, the ferroelectric capacitor is formed first, followed by forming the second contact connected to the first contact. Therefore, it is known to the art that, if an opening for the second contact is formed on the first contact, damage is done to the ferroelectric capacitor. In order to overcome the damage done to the ferroelectric capacitor, it is necessary to carry out a heat treatment under a high temperature after formation of the opening for the second contact.

However, the first contact is formed of a material that is easily oxidized such as W (tungsten). Therefore, if an oxygen annealing is carried out under a high temperature in order to overcome the damage done to the ferroelectric capacitor, the first contact is oxidized, with the result that it was impossible to carry out an oxygen annealing under a high temperature. Such being the situation, it was impossible to overcome completely the damage done to the ferroelectric capacitor, leading to reduction of the yield.

BRIEF SUMMARY OF THE INVENTION

According to a first aspect of the present invention, there is provided a semiconductor memory device comprising a semiconductor substrate; a first transistor formed on the semiconductor substrate and including a first gate electrode and first and second diffusion layers; a first contact connected to the first diffusion layer; a first conductive oxygen barrier film electrically connected to the first contact and covering at least the upper surface of the first contact; a first ferroelectric capacitor including a first electrode, a second electrode and a first ferroelectric film interposed between the first and second electrodes; and a first connecting member connected to the first electrode and to the first conductive oxygen barrier film.

According to a second aspect of the present invention, there is provided a method of manufacturing a semiconductor memory device, comprising forming on a semiconductor substrate a first transistor including a first gate electrode and first and second diffusion layers; forming a first contact connected to the first diffusion layer; forming on the first contact a first conductive oxygen barrier film covering at least the upper surface of the first contact; forming above the first conductive oxygen barrier film a first ferroelectric capacitor including a first electrode, a second electrode, and a first ferroelectric film interposed between the first and second electrodes; and forming a first connecting member connected to the first electrode and to the first conductive oxygen barrier film.

BRIEF DESCRIPTION OF THE SEVERAL VIEWS OF THE DRAWING

FIG. 15 is a cross sectional view showing the construction of another semiconductor memory device according to the second embodiment of the present invention;

FIG. 16 is a cross sectional view showing the construction of another semiconductor memory device according to the second embodiment of the present invention;

FIGS. 27, 28 and 29 are cross sectional views collectively showing a manufacturing process of the semiconductor memory device according to the fourth embodiment of the present invention;

FIGS. 42, 43 and 44 are cross sectional views collectively showing a manufacturing process of the semiconductor memory device according to the seventh embodiment of the present invention;

FIG. 45 is a plan view showing the construction of a semiconductor memory device according to an eighth embodiment of the present invention;

FIGS. 53, 54 and 55 are cross sectional views collectively showing a manufacturing process of the semiconductor memory device according to the eleventh embodiment of the present invention;

FIG. 56 is a plan view showing the construction of a semiconductor memory device according to a twelfth embodiment of the present invention;

FIG. 58 is a plan view showing the construction of a semiconductor memory device according to a thirteenth embodiment of the present invention;

FIG. 66 is a plan view showing the construction of a semiconductor memory device according to a seventeenth embodiment of the present invention;

FIG. 67 is a cross sectional view of the semiconductor memory device along the line LXVII—LXVII shown in FIG. 66;

FIGS. 68, 69, 70, 71, 72, 73, 74, and 75 are cross sectional views collectively showing a manufacturing process of semiconductor memory device according to the seventeenth embodiment of the present invention.

DETAILED DESCRIPTION OF THE INVENTION

Figure 1:
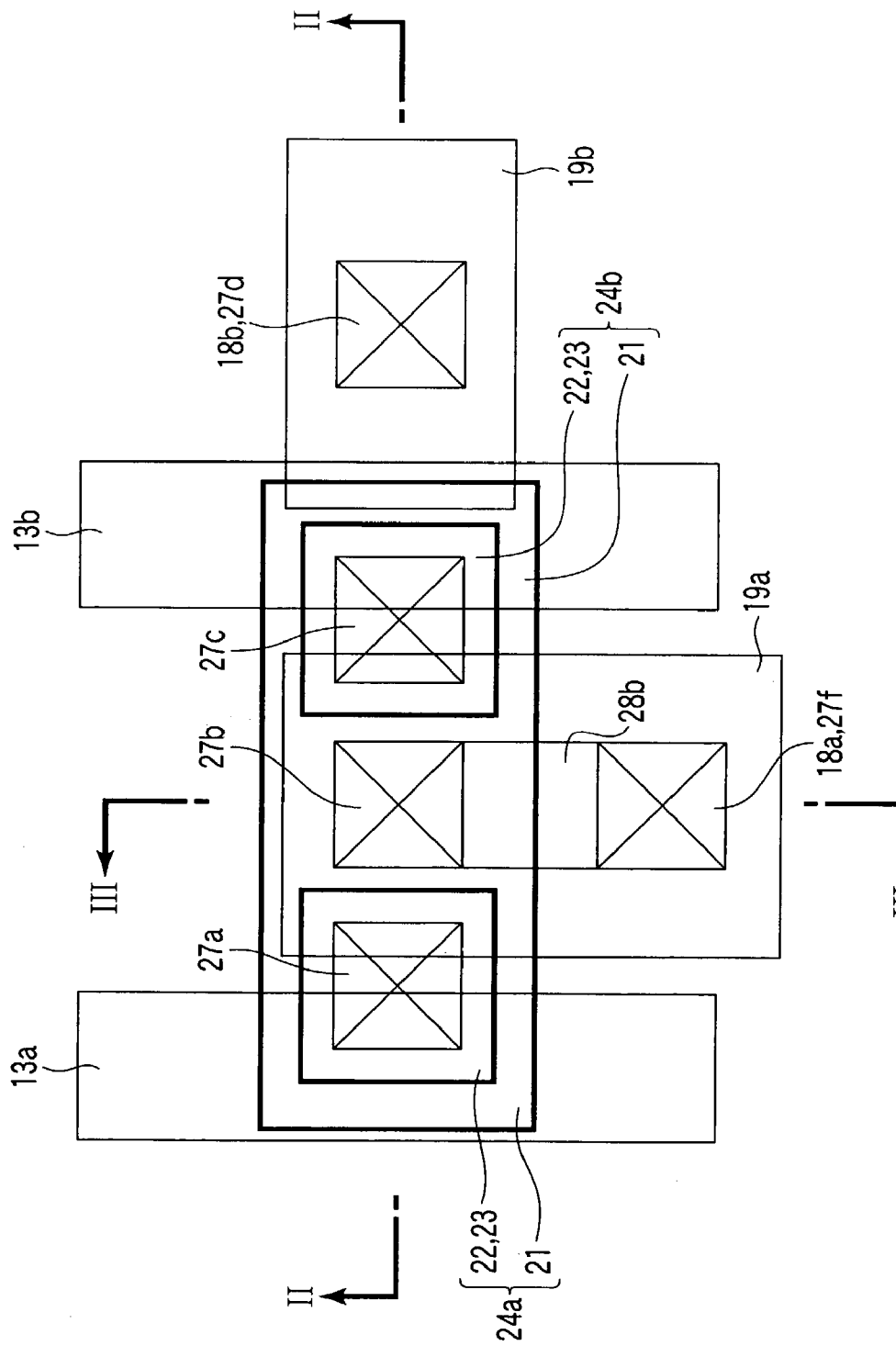
FIG. 1 is a plan view showing the construction of a semiconductor memory device according to a first embodiment of the present invention.

Some embodiments of the present invention will now be described with reference to the accompanying drawings. Through the accompanying drawings, the common portions of the semiconductor memory device are denoted by the same reference numerals.

Incidentally, each of the embodiments described in the following is directed to the construction of a TC parallel unit series connection type ferroelectric memory device. However, the present invention is not limited to the construction of the particular ferroelectric memory device, and it is possible to apply the technical idea of the present invention to the constructions of the various ferroelectric memory devices. Incidentally, the TC parallel unit series connection type ferroelectric memory device referred to above is constructed such that ends of a capacitor (C) are connected between the source and drain regions of a cell transistor (T) so as to form a cell unit, and a plurality of cell units thus formed are connected in series.

FIRST EMBODIMENT

A first embodiment of the present invention is directed to the construction that a conductive oxygen barrier film is formed on a contact connected to a transistor.

Figure 2:
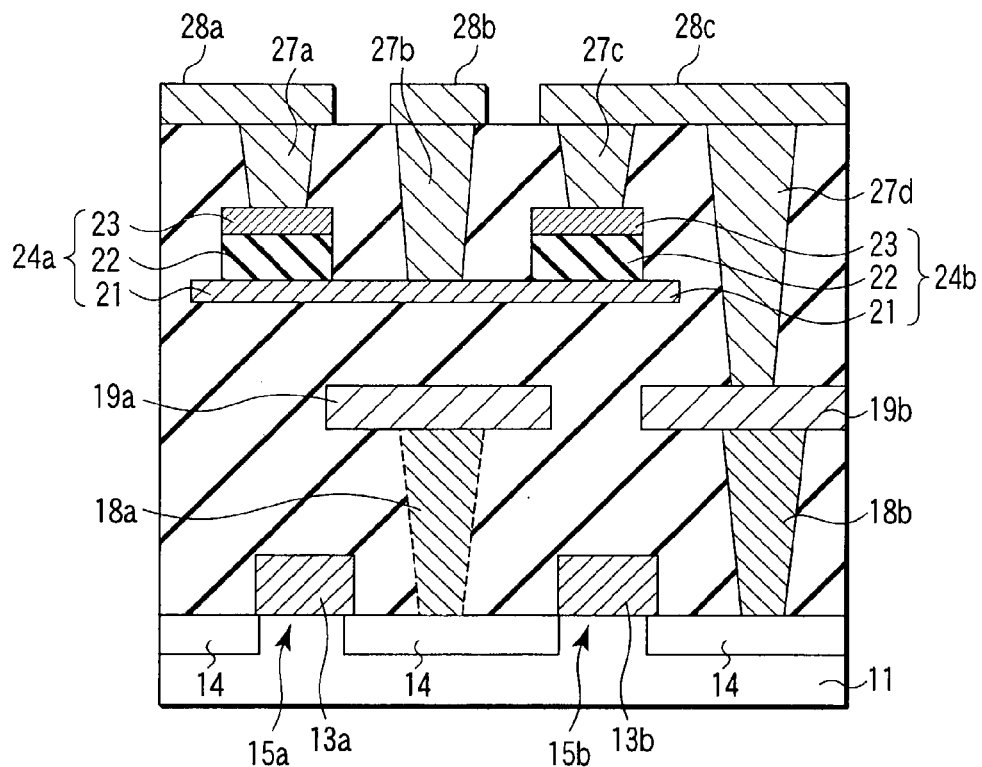
FIG. 2 is a cross sectional view of the semiconductor memory device along the line II—II shown in FIG. 1.
Figure 3:
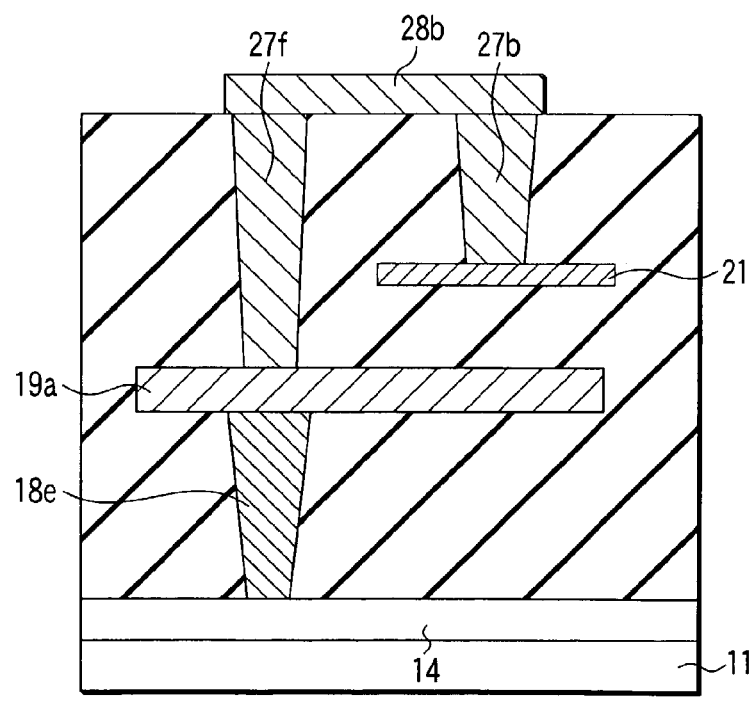
FIG. 3 is a cross sectional view of the semiconductor memory device along the line III—III shown in FIG. 1.

FIGS. 1 to 3 are a plan view and cross sectional views collectively showing the construction of a semiconductor memory device according to the first embodiment of the present invention. The construction of the semiconductor memory device according to the first embodiment of the present invention will now be described with reference to FIGS. 1 to 3.

As shown in FIGS. 1 to 3, source/drain diffusion layers 14 are formed in a silicon substrate 11, and gate electrodes 13a, 13b are formed on the silicon substrate 11, thereby forming transistors 15a, 15b. A contact 18a is connected to one of the source/drain diffusion layers 14 of the transistor 15b, and another contact 18b is connected to the other of the source/drain diffusion layers 14 of the transistor 15b. Each of these contacts 18a, 18b is formed of a polycrystalline silicon (polysilicon) doped with an impurity or W (tungsten).

Conductive oxygen barrier films 19a, 19b are formed on the contacts 18a, 18b, respectively. These contacts 18a, 18b are electrically connected to these conductive oxygen barrier films 19a, 19b. It is possible for the conductive oxygen barrier films 19a, 19b to cover at least partially the upper surfaces of the contacts 18a, 18b, respectively. However, it is desirable for the conductive oxygen barrier films 19a, 19b to have areas larger than the areas of the upper surfaces of the contacts 18a, 18b, respectively. Each of the conductive oxygen barrier films 19a, 19b is formed of a material containing one of, for example, Ir, $IrO_2$, Ru, and $RuO_2$. Also, it is possible for each of the conductive oxygen barrier films 19a, 19b to be of a single layer structure or a laminate structure.

Ferroelectric capacitors 24a, 24b are formed above the conductive oxygen barrier film 19a. Each of these ferroelectric capacitors 24a, 24b comprises a lower electrode 21, an upper electrode 23 and a ferroelectric film 22 interposed between the lower electrode 21 and the upper electrode 23. These two ferroelectric capacitors 24a and 24b share the lower electrode 21. In other words, the lower electrode 21 is not separated for each of the ferroelectric capacitors 24a and 24b.

The upper electrode 24a of the ferroelectric capacitor 24a is connected to a metal wiring 28a via a contact 27a. The lower electrode 21 shared by the two ferroelectric capacitors 24a, 24b is connected to a metal wiring 28b via a contact 27b, and the metal wiring 28b is connected to the conductive oxygen barrier film 19a via a contact 27f. The upper electrode 23 of the ferroelectric capacitor 24b is connected to a metal wiring 28c via a contact 27c, and the metal wiring 28c is connected to the conductive oxygen barrier film 19b via a contact 27d. It should be noted that each of the contacts 27a, 27b, 27c, 27d and each of the metal wirings 28a, 28b, 28c is formed of a material containing one of, for example, W, Al, Cu and Ti.

FIGS. 4 to 11 are cross sectional views collectively showing as an example a manufacturing process of the semiconductor memory device according to the first embodiment of the present invention. The manufacturing method of the semiconductor memory device according to the first embodiment of the present invention will now be described with reference to FIGS. 4 to 11. The example of the manufacturing process shown in these drawings is directed to the case where a ferroelectric capacitor circuit portion in which the ferroelectric capacitors are present and a peripheral circuit portion for controlling the ferroelectric capacitor circuit portion are formed simultaneously.

Figure 4:
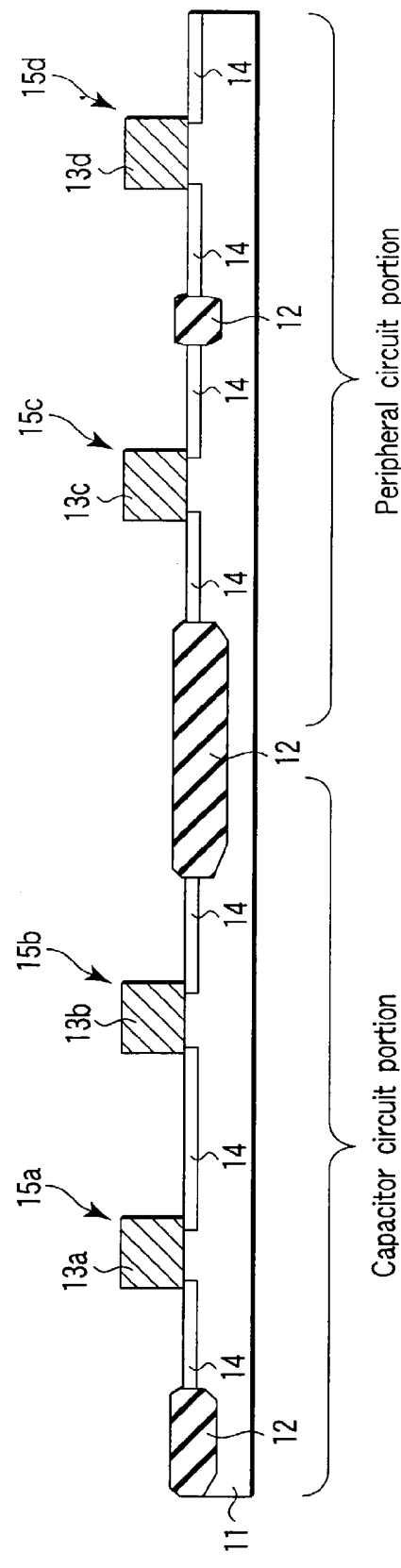
FIGS. 4, 5, 6, 7, 8, 9, 10 and 11 are cross sectional views collectively showing a manufacturing process of the semiconductor memory device according to the first embodiment of the present invention.

In the first step, an STI (Shallow Trench Isolation) region 12 for performing the element isolation is formed within a silicon substrate 11, as shown in FIG. 4. Then, gate electrodes 13a, 13b, 13c, and 13c are formed on the silicon substrate 11, and several pairs of source/drain diffusion layers 14 are formed such that each pair of source/drain diffusion layers 14 are positioned to have each of the gate electrodes 13a, 13b, 13c and 13d sandwiched there-between. As a result, formed are transistors 15, 15b included in the ferroelectric capacitor circuit portion and transistors 15c, 15d included in the peripheral circuit portion.

Figure 5:
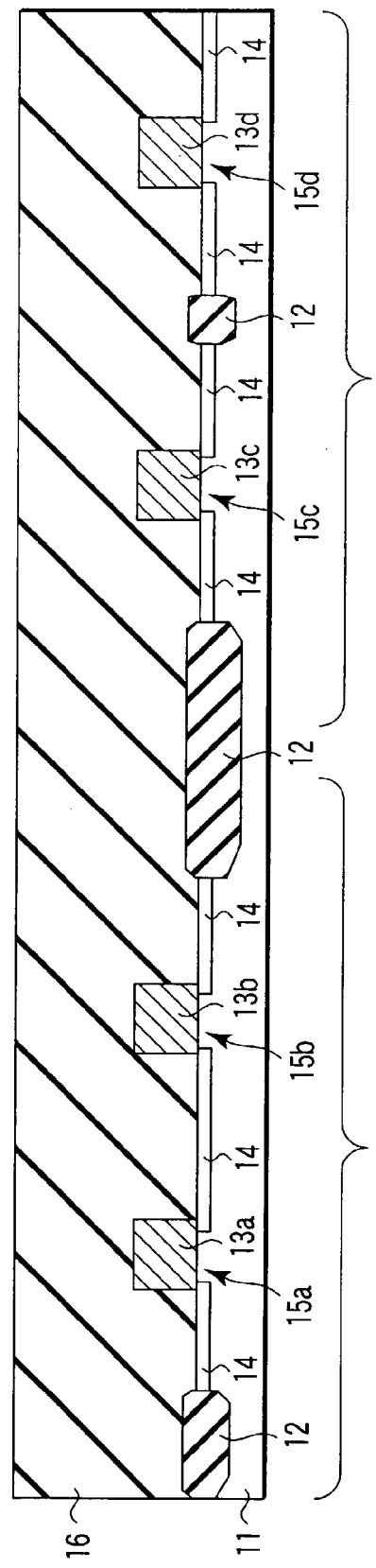

In the next step, an interlayer insulating film 16 is deposited to cover the silicon substrate 11 and the transistors 15a, 15b, 15c, 15d formed in the silicon substrate 11, followed by planarizing the upper surface of the interlayer insulating film 16 as shown in FIG. 5. The material of the interlayer insulating film 16 includes, for example, BPSG (Boron Phosphorus Silicate Glass) and P-TEOS (Plasma-Tetra Ethoxy Silane).

Figure 6:
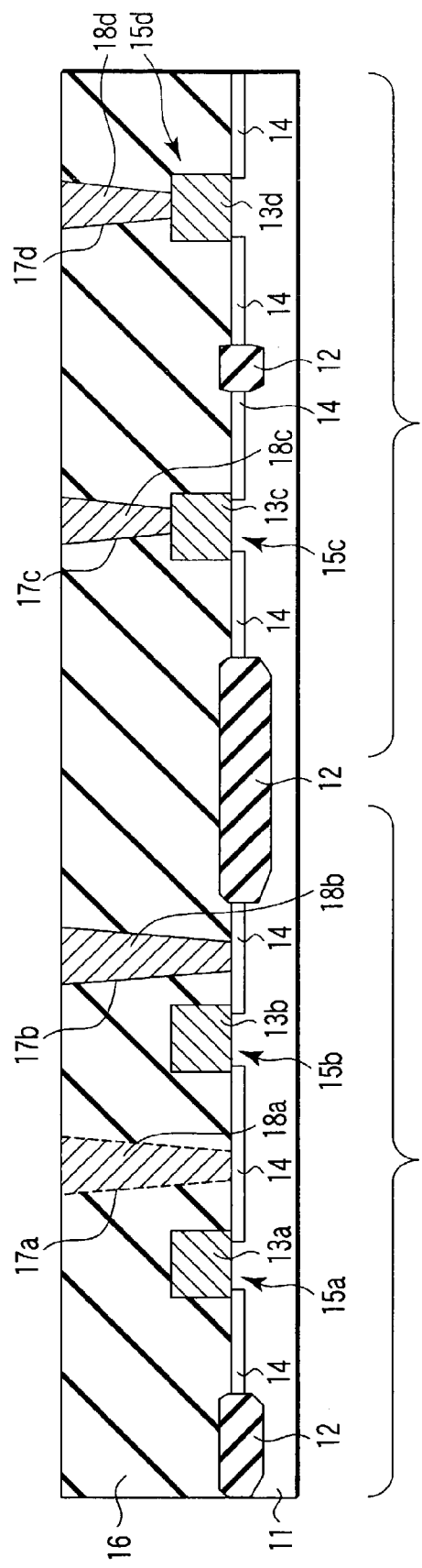

Then, the interlayer insulating film 16 is selectively removed so as to form contact holes 17a, 17b, 17c, 17d, as shown in FIG. 6, followed by filling these contact holes 17a, 17b, 17c, 17d with a metallic material and subsequently planarizing the metallic material so as to form contacts 18a, 18b, 18c and 18d. The material of the contacts 18a, 18b, 18c and 18d includes, for example, W and polysilicon doped with an impurity. The contacts 18a and 18b included in the ferroelectric capacitor circuit portion are connected to the source/drain diffusion layers 14, respectively, and the contacts 18c and 18d included in the peripheral circuit portion are connected to the gate electrodes 13c and 14d, respectively.

Figure 7:
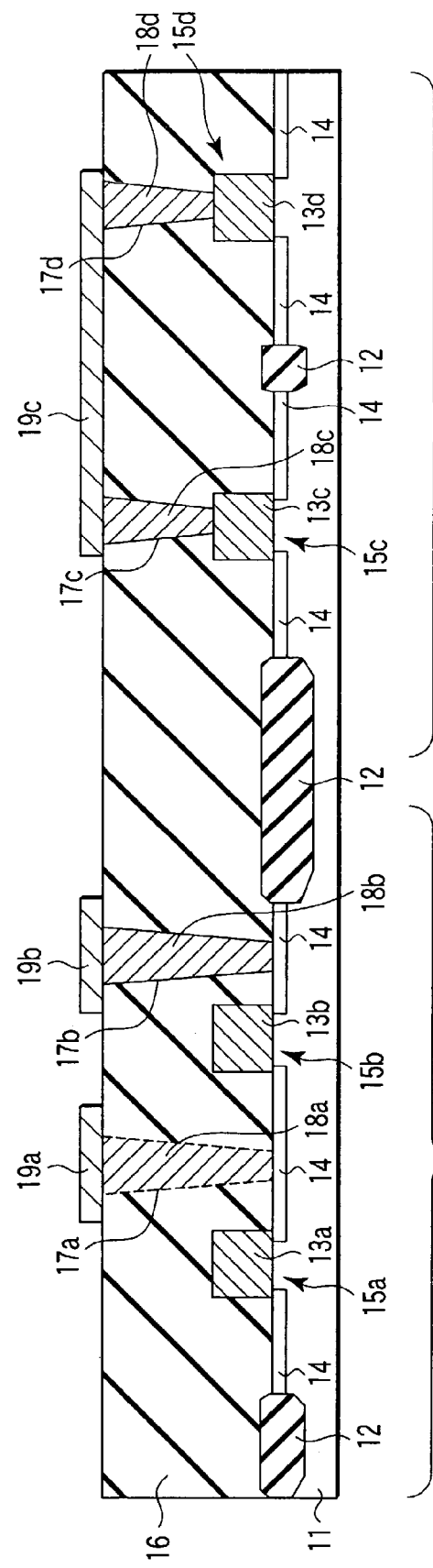

In the next step, conductive oxygen barrier films 19a, 19b, 19c are deposited on the interlayer insulating film 16 and on the contacts 18a, 18b, 18c, 18d, followed by patterning these conductive oxygen barrier films 19a, 19b, 19c, as shown in FIG. 7. Each of the conductive oxygen barrier films 19a, 19b, 19c is formed of a material containing one of Ir, $IrO_2$, Ru and $RuO_2$. The conductive oxygen barrier films 19a and 19b included in the ferroelectric capacitor circuit portion are connected to the contacts 18a and 18b, respectively. On the other hand, the conductive oxygen barrier film 19c in the peripheral circuit portion is connected to each of the contacts 18c and 19d and performs the function of a wiring.

Figure 8:
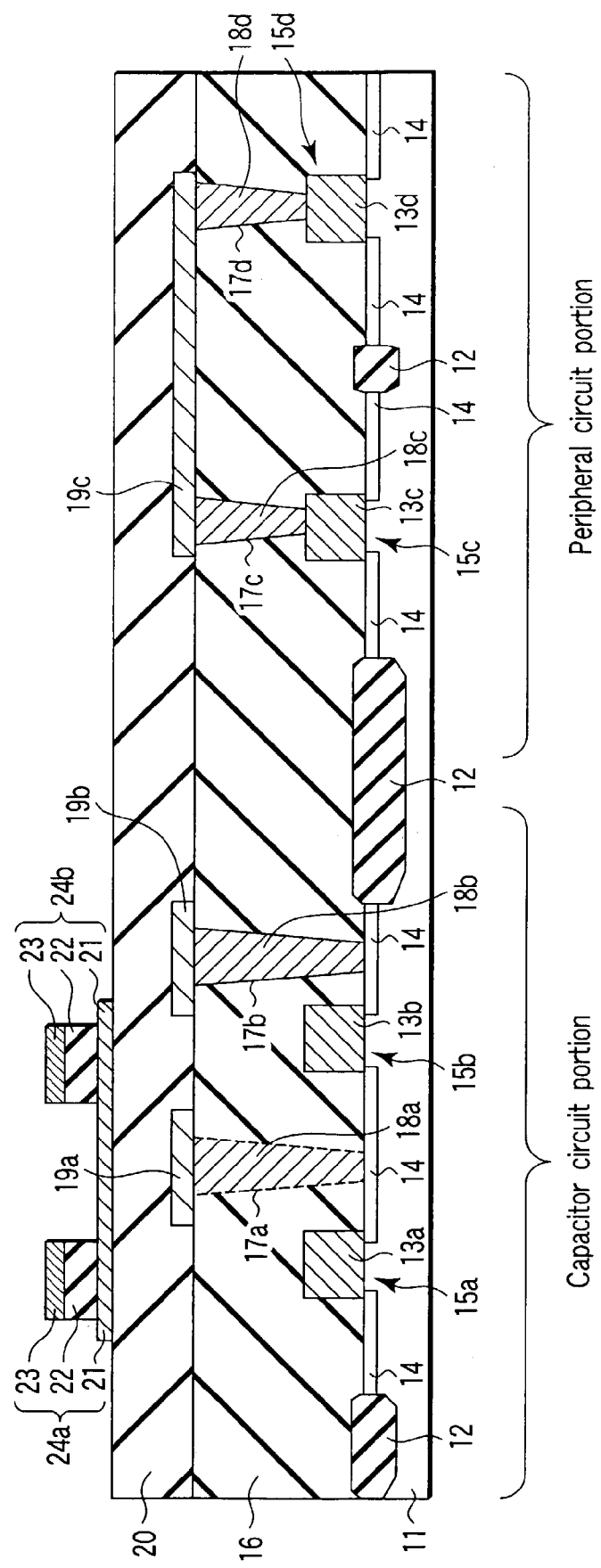

In the next step, an interlayer insulating film 20 is formed to cover the interlayer insulating film 16 and the conductive oxygen barrier films 19a, 19b, 19c, followed by planarizing the interlayer insulating film 20, as shown in FIG. 8. The material of the interlayer insulating film 20 includes, for example, BPSG and P-TEOS.

After formation of the interlayer insulating film 20, a lower electrode 21, a ferroelectric film 22 and an upper electrode 23 are deposited successively above each of the contacts 15a and 15b. The lower electrode 21 is formed of a material containing one of, for example, Pt, Ir, $IrO_2$, SRO, Ru and $RuO_2$. The ferroelectric film 22 is formed of a material containing one of, for example, PZT and SBT. Further, the upper electrode 23 is formed of a material containing one of, for example, Pt, Ir, $IrO_2$, SRO, Ru and $RuO_2$. Then, the lower electrode 21 is patterned, followed by simultaneously patterning the ferroelectric film 22 and the upper electrode 23. As a result, formed are ferroelectric capacitors 24a, 24b.

Figure 9:
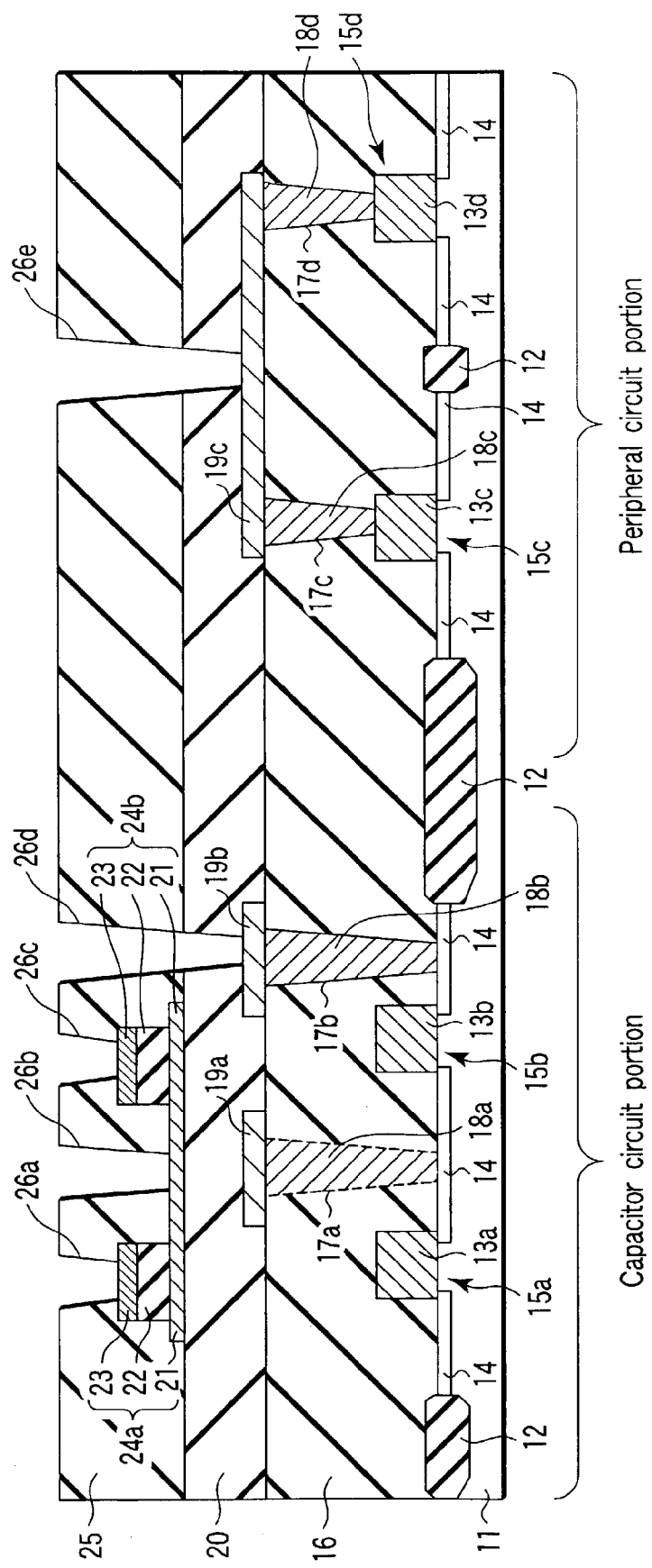

In the next step, an interlayer insulating film 25 is formed to cover the interlayer insulating film 20 and the ferroelectric capacitors 24a, 24b, as shown in FIG. 9. The material of the interlayer insulating film 25 includes, for example, P-TEOS, $O_3$-TEOS, SOG, $Al_2O_3$, SiN, and SiON. Then, the interlayer insulating films 20, 25 are selectively removed so as to form contact holes 26a, 26b, 26c, 26d and 26e, followed by performing a high temperature oxygen annealing at, for example, 650° C. for one hour under an oxygen gas atmosphere.

Figure 10:
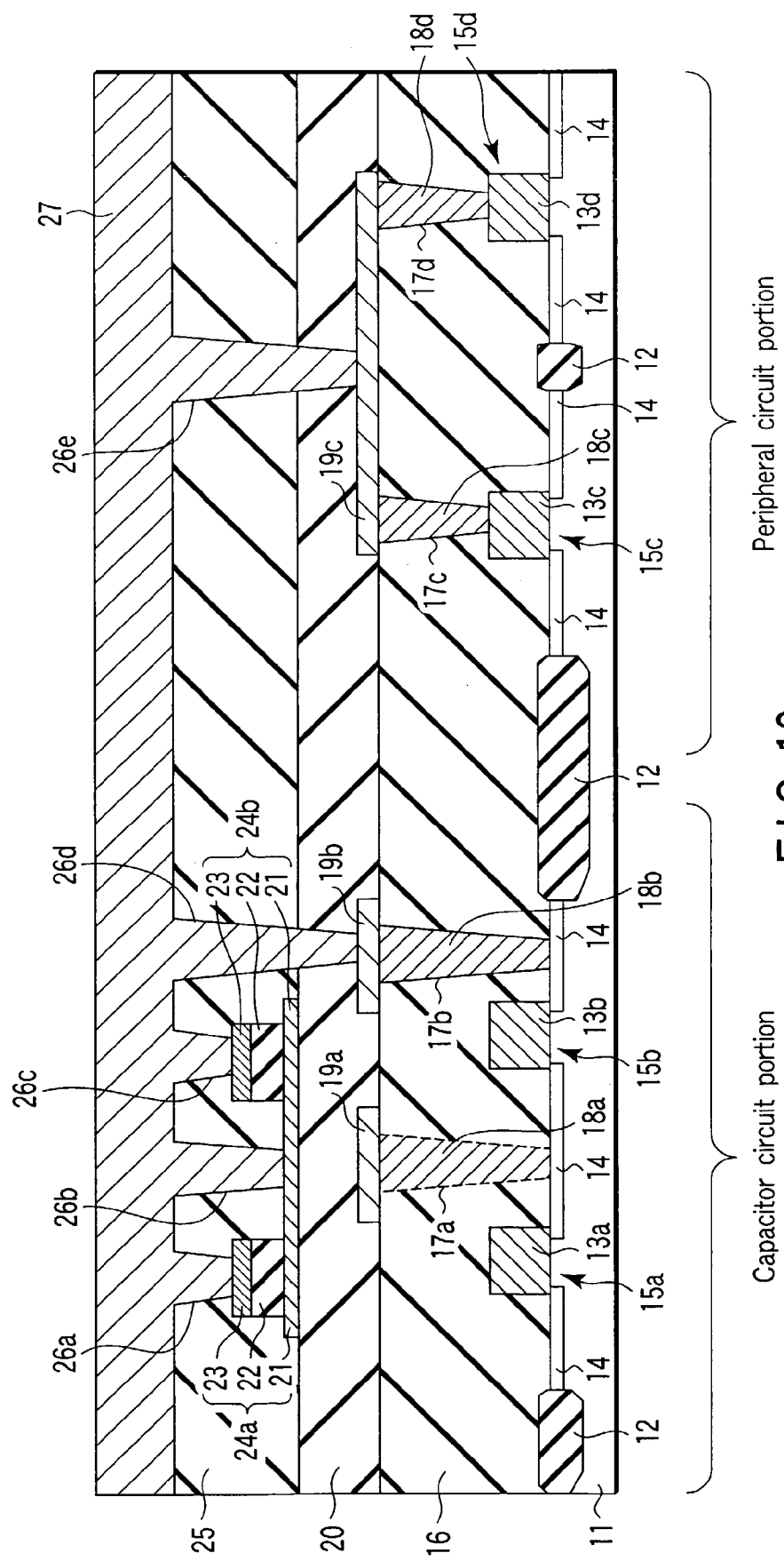
Figure 11:
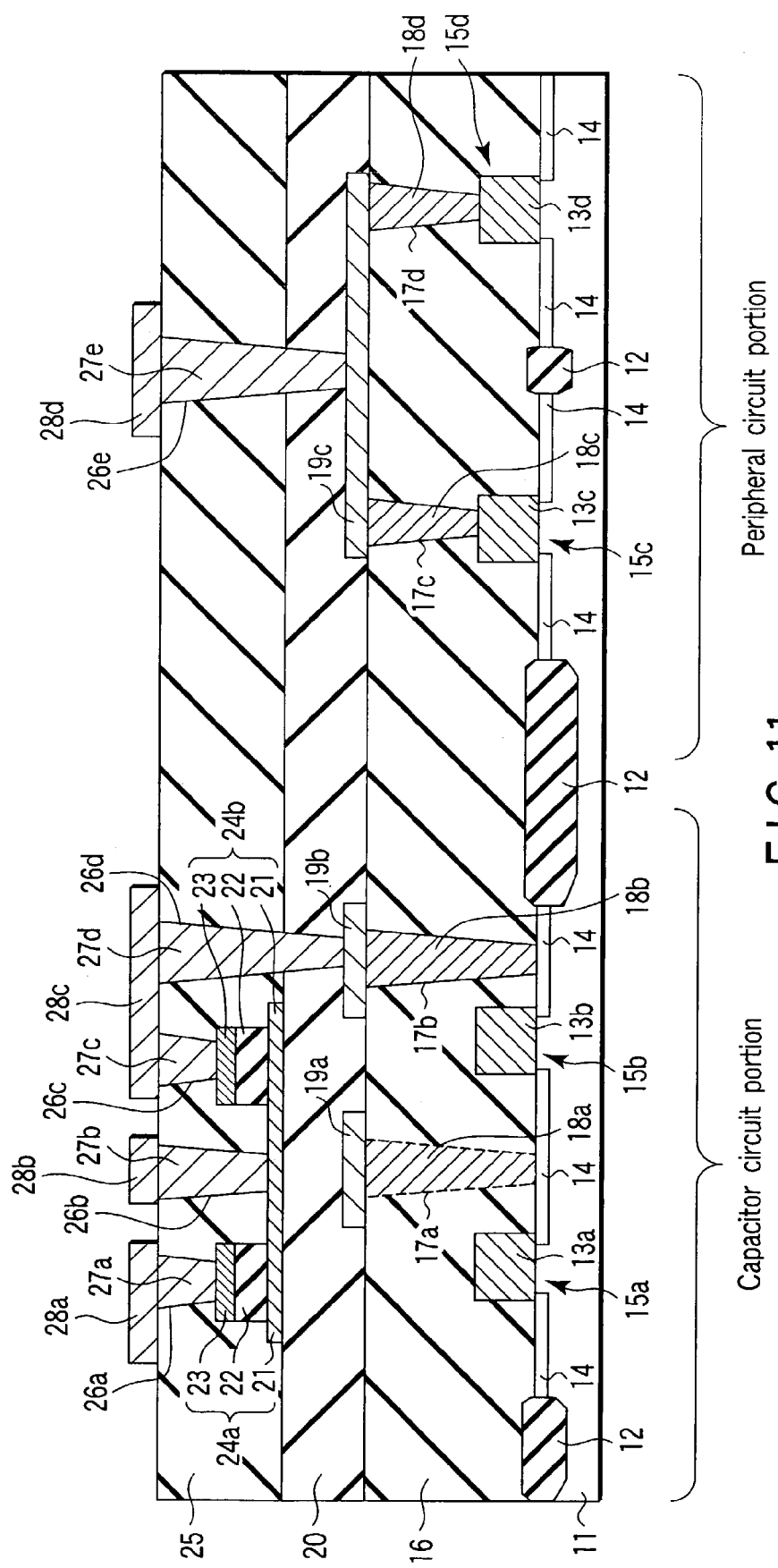

In the next step, the contact holes 26a, 26b, 26c, 26d, and 26e are filled with a metallic material layer 27, as shown in FIG. 10. Then, the metal material layer 27 is planarized until the upper surface of the interlayer insulating film 25 is exposed to the outside, thereby forming contacts 27a, 27b, 27c, 27d and 27e, as shown in FIG. 11. Each of these contacts 27a, 27b, 27c, 27d and 27e is formed of a material containing one of, for example, W, Al and TiN.

It should be noted that the contact 27a is connected to the upper electrode 23 of the ferroelectric capacitor 24a. The contact 27b is connected to the lower electrode 21 for each of the ferroelectric capacitors 24a, 24b. The contact 27c is connected to the upper electrode 23 of the ferroelectric capacitor 24b. The contact 27d is connected to the conductive oxygen barrier film 19b. Further, the contact 27e is connected to the wiring for the peripheral circuit (conductive oxygen barrier film 19c).

Further, a wiring material layer is formed to cover the contacts 27a, 27b, 27c, 27d, 27e and the interlayer insulating film 25, followed by patterning the wiring material layer, thereby forming wirings 28a, 28b, 28c and 28d. Each of wirings 28a, 28b, 28c and 28d is formed of a material containing one of, for example, W, Al, and TiN. It should be noted that the wiring 28a is connected to the contact 27a. The wiring 28b is connected to the contact 27b. The wiring 28c is connected to both the contacts 27c and 27d. Further, the wiring 27d is connected to the contact 27e. As described above, the capacitor circuit portion and the peripheral circuit portion are formed simultaneously.

According to the first embodiment of the present invention, the upper surfaces of the contacts 18a, 18b each formed of a material that is easily oxidized are protected by the conductive oxygen barrier films 19a and 19b, respectively. As a result, even if a high temperature annealing treatment is carried out after formation of the contact holes 26a, 26b, 26c, 26d and 26e, the conductive oxygen barrier films 19a and 19b permit preventing the contacts 18a and 18b from being oxidized. It follows that it is possible to overcome the damage done to the ferroelectric capacitors 24a, 24b in the process of forming the contact holes without causing the contacts 18a, 18b to be oxidized by the high temperature annealing treatment. Since it is possible to form the ferroelectric capacitors 24a, 24b, which are free from damages, it is possible to improve the yield.

It should also be noted that the conductive oxygen barrier films 19a, 19b are formed on the contacts 18a, 18b, respectively. Therefore, the conductive oxygen barrier films 19a, 19b can be used as an etching stopper in forming the contact holes for the contacts 27d and 27f, respectively. It follows that it is possible to prevent a misalignment between the contacts 18a and 27f and between the contact 18b and the contact 27d. Naturally, it is possible to overcome the difficulty that slits are generated by the misalignment in forming the contact holes so as to bring about a defective contact. It follows that the reduction of the yield can be suppressed.

It should also be noted that the conductive oxygen barrier film 19c formed in the peripheral circuit portion can be utilized as a wiring layer. Therefore, a wiring can be formed in the peripheral circuit portion by utilizing the step of forming the conductive oxygen barrier films 19a, 19b in the capacitor circuit portion. It follows that the peripheral circuit portion can be miniaturized so as to make smaller the chip size by effectively utilizing the step of forming the conductive oxygen barrier films 19a, 19b for the capacitor circuit portion.

SECOND EMBODIMENT

A second embodiment of the present invention is directed to a modification of the first embodiment described above and covers an example in which an insulating oxygen barrier film is also formed in addition to the conductive oxygen barrier film.

Figure 12:
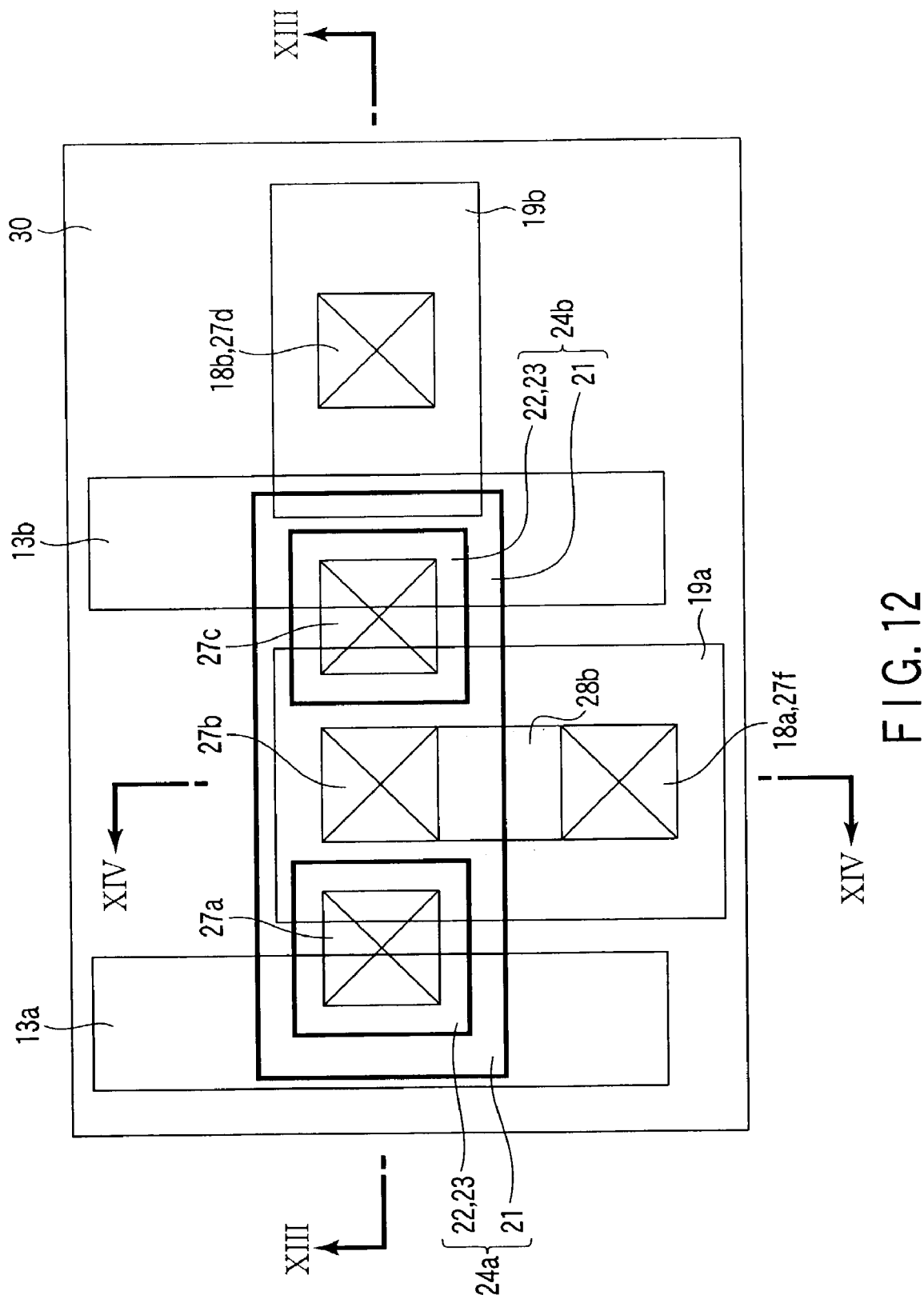
FIG. 12 is a plan view showing the construction of a semiconductor memory device according to a second embodiment of the present invention.
Figure 13:
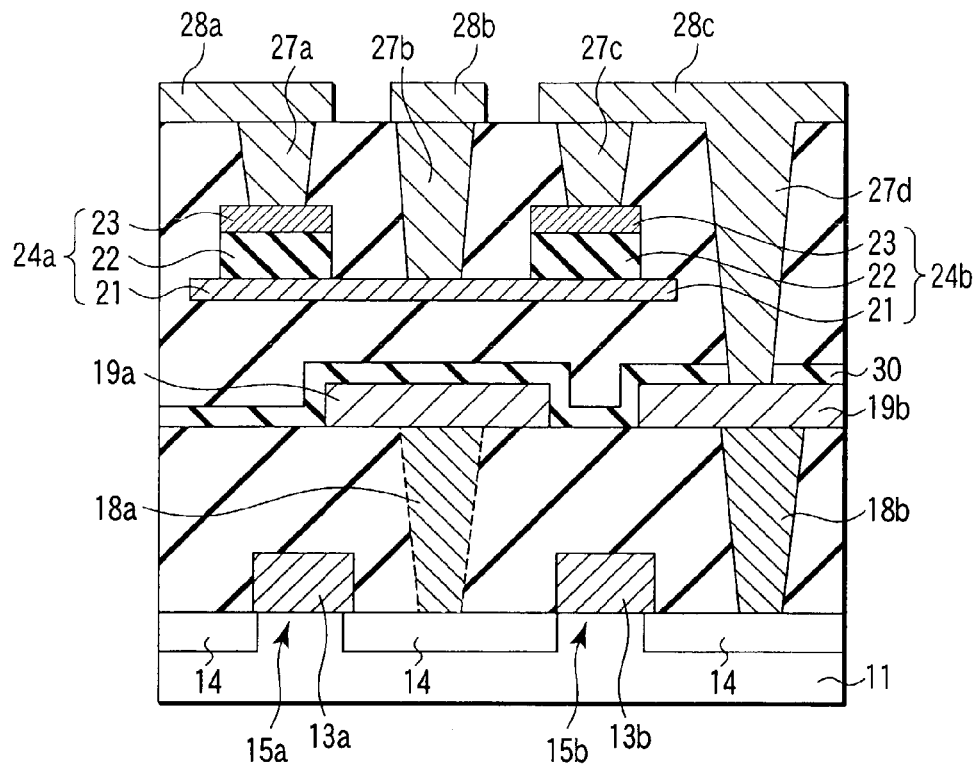
FIG. 13 is a cross sectional view of the semiconductor memory device along the line XIII—XIII shown in FIG. 12.
Figure 14:
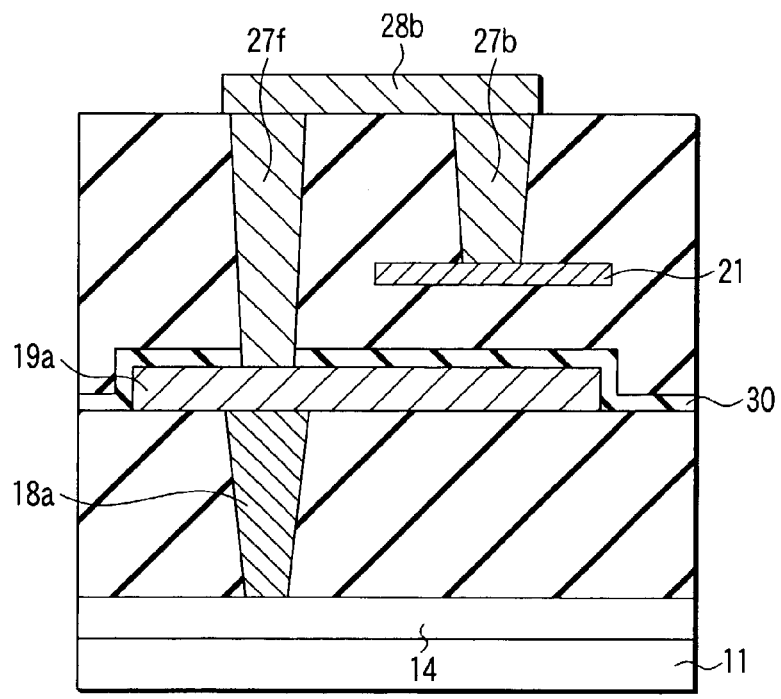
FIG. 14 is a cross sectional view of the semiconductor memory device along the line XIV—XIV shown in FIG. 12.

FIGS. 12 to 14 are a plan view and cross sectional views collectively showing a semiconductor memory device according to the second embodiment of the present invention. The construction of the semiconductor memory device according to the second embodiment of the present invention will now be described. Incidentally, that portion alone of the second embodiment which differs from the first embodiment is described in the following.

As shown in FIGS. 12 to 14, the second embodiment differs from the first embodiment in that, in the second embodiment, an insulating oxygen barrier film 30 is deposited to cover the conductive oxygen barrier films 19a, 19b. The insulating oxygen barrier film 30 is formed by depositing an insulating oxygen barrier material after formation of the conductive oxygen barrier films 19a, 19b. The insulating oxygen barrier film 30, which is formed of a material containing one of, for example, $Al_2O_3$, SiN, SiON, $TiO_2$, and PZT, may be of a single layer structure or a laminate structure.

According to the second embodiment of the present invention, it is possible to obtain the effects similar to those obtained in the first embodiment. Further, additional effects can be obtained as follows.

Specifically, it is necessary for the conductive oxygen barrier films 19a and 19b to be separated from each other so as to be connected to the contacts 18a and 18b, respectively, thereby preventing the short circuiting between the transistors 13a and 13b. Therefore, in carrying out a high temperature annealing treatment, the contacts 18a, 18b are likely to be oxidized from the edge portions of the conductive oxygen barrier films 19a, 19b, respectively. Such being the situation, the insulating oxygen barrier film 30 is formed in the second embodiment of the present invention in a manner to cover the conductive oxygen barrier films 19a, 19b. As a result, the clearance between the conductive oxygen barrier films 19a and 19b is filled with the insulating oxygen barrier layer 30 so as to protect sufficiently the contacts 18a, 18b, which are likely to be oxidized, from the high temperature annealing treatment.

Incidentally, it is possible to form the insulating oxygen barrier film 30 in an optional position as far as the contacts 18a, 18b are prevented from being oxidized from the edge portions of the conductive oxygen barrier films 19a, 19b. For example, it is possible to form the insulating oxygen barrier film 30 below the conductive oxygen barrier films 19a, 19b, as shown in FIG. 15. It is also possible to form insulating oxygen barrier films 30a, 30b in contact with the lower surfaces and the upper surfaces of the conductive oxygen barrier films 19a, 19b, respectively, as shown in FIG. 16. Incidentally, in order to obtain a more prominent effect of preventing the oxidation, it is more desirable to form the insulating oxygen barrier film 30 in contact with the upper surfaces of the conductive oxygen barrier films 19a, 19b than to form the insulating oxygen barrier film 30 in contact with the lower surfaces of the conductive oxygen barrier films 19a, 19b.

THIRD EMBODIMENT

A third embodiment of the present invention is directed to a modification of the second embodiment and covers an example in which the conductive oxygen barrier film is of a damascene structure.

Figure 17:
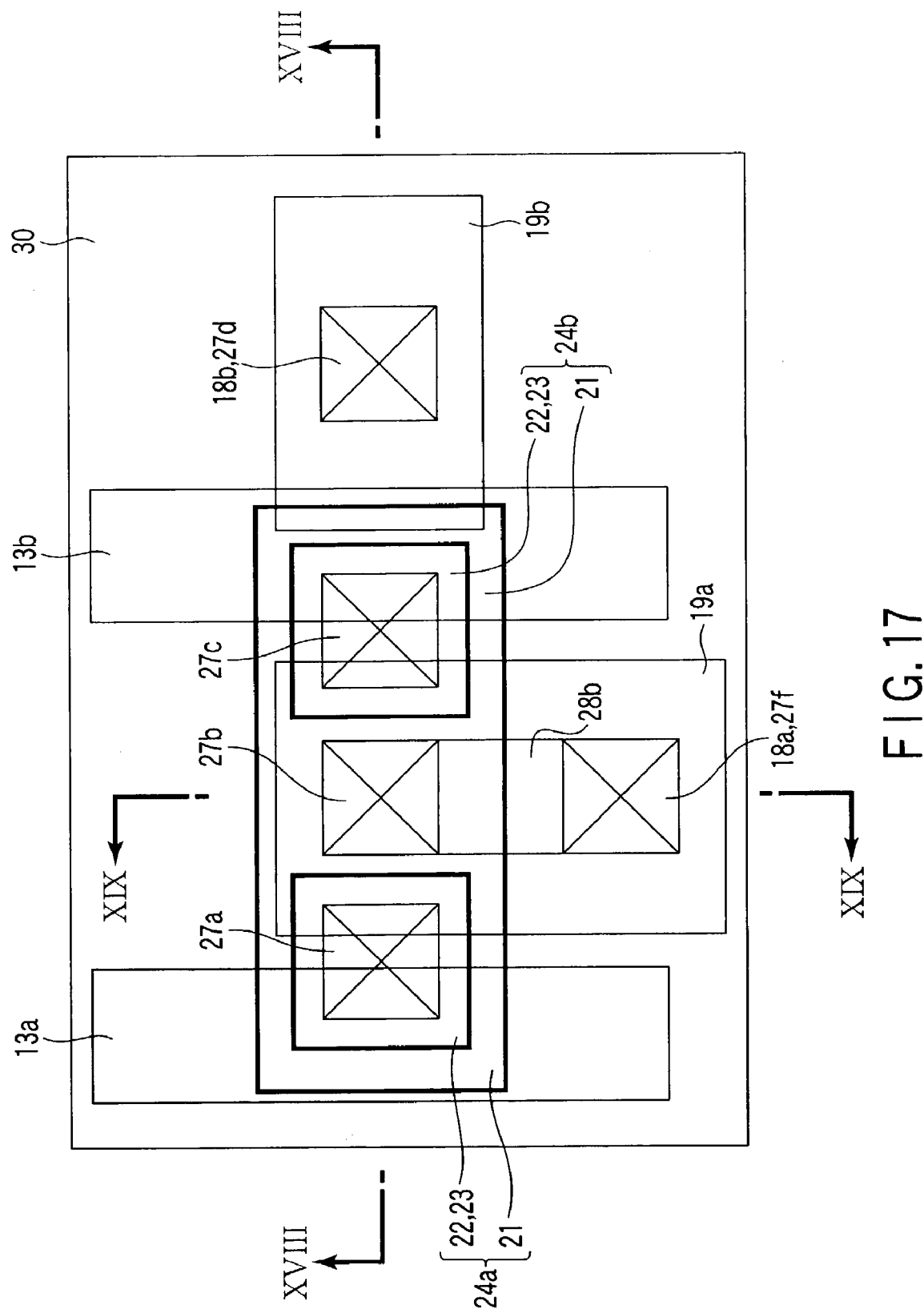
FIG. 17 is a plan view showing the construction of a semiconductor memory device according to a third embodiment of the present invention.
Figure 18:
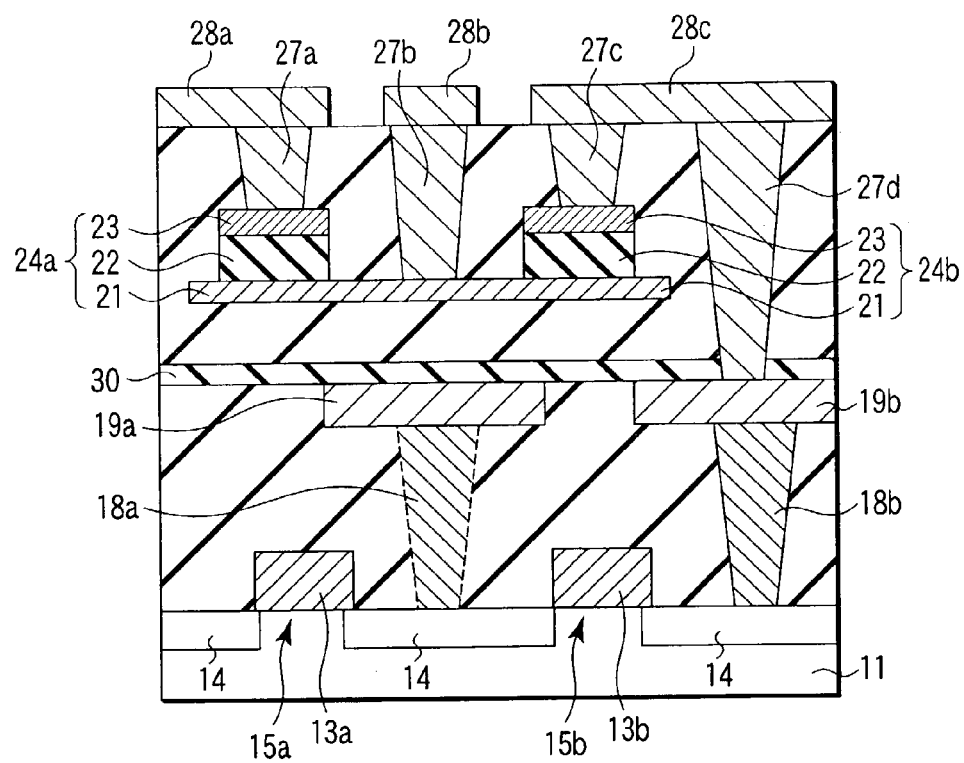
FIG. 18 is a cross sectional view of the semiconductor memory device along the line XVIII—XVIII shown in FIG. 17.
Figure 19:
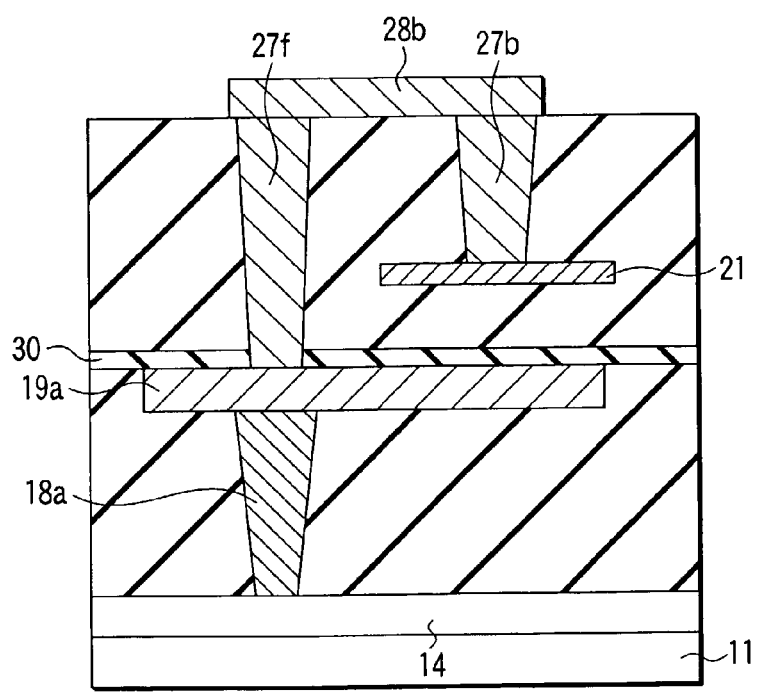
FIG. 19 is a cross sectional view of the semiconductor memory device along the line XIX—XIX shown in FIG. 17.

FIGS. 17 to 19 are a plan view and cross sectional views collectively directed to a semiconductor memory device according to a third embodiment of the present invention. The construction of the semiconductor memory device according to the third embodiment of the present invention will now be described. Incidentally, that portion alone of the third embodiment which differs from the second embodiment will be described in the following.

As shown in FIGS. 17 to 19, the third embodiment differs from the second embodiment in that, in the third embodiment, the insulating oxygen barrier film 30 has a flat surface free from an irregularity. It should be noted that, since the conductive oxygen barrier films 19a, 19b are buried in an insulating film, the upper surfaces of the conductive oxygen barrier films 19a, 19b are rendered flush with the upper surface of the surrounding insulating film, with the result that the conductive oxygen barrier films 19a, 19b are allowed to have a so-called "damascene structure". It follows that the insulating oxygen barrier film 30 is rendered to have a flat surface, as pointed out above.

Figure 20:
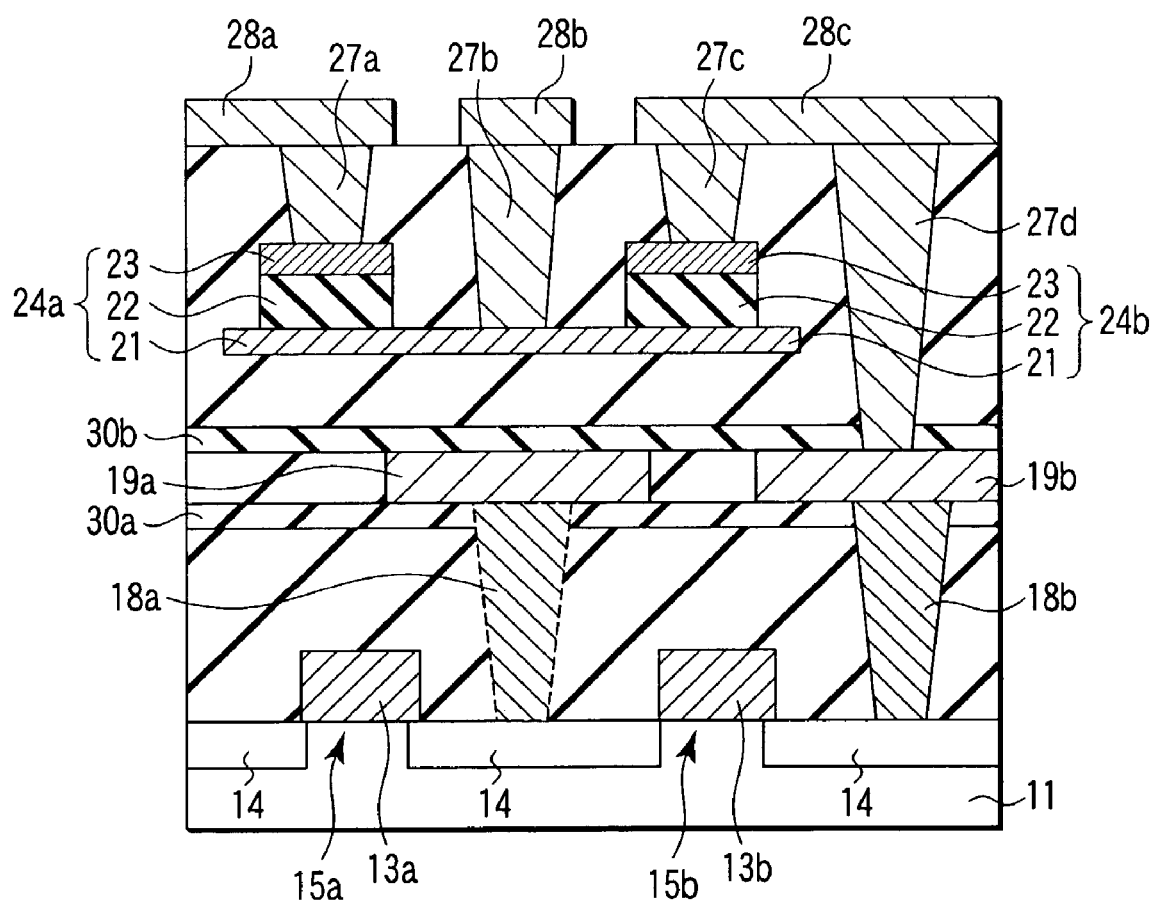
FIG. 20 is a cross sectional view showing the construction of another semiconductor memory device according to the third embodiment of the present invention.

Incidentally, it is possible to form insulating oxygen barrier films 30a, 30b in contact with the lower surfaces and the upper surfaces of the conductive oxygen barrier films 19a, 19b, respectively, as shown in FIG. 20.

Figure 21:
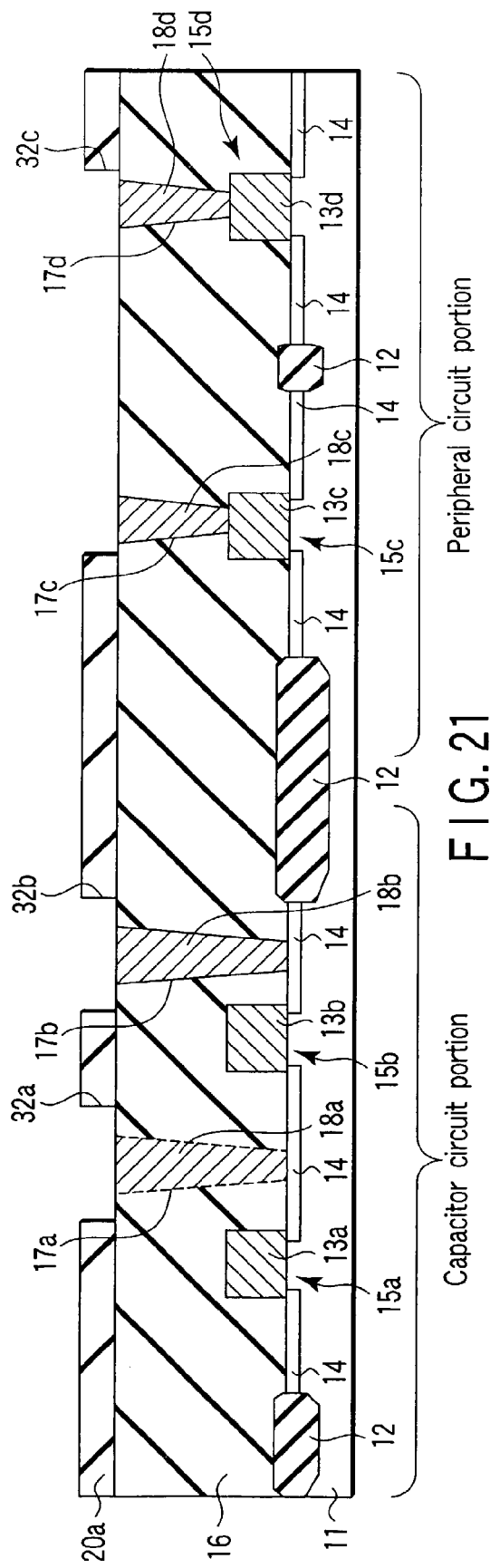
FIGS. 21, 22 and 23 are cross sectional views collectively showing a manufacturing process of a semiconductor memory device according to the third embodiment of the present invention.
Figure 22:
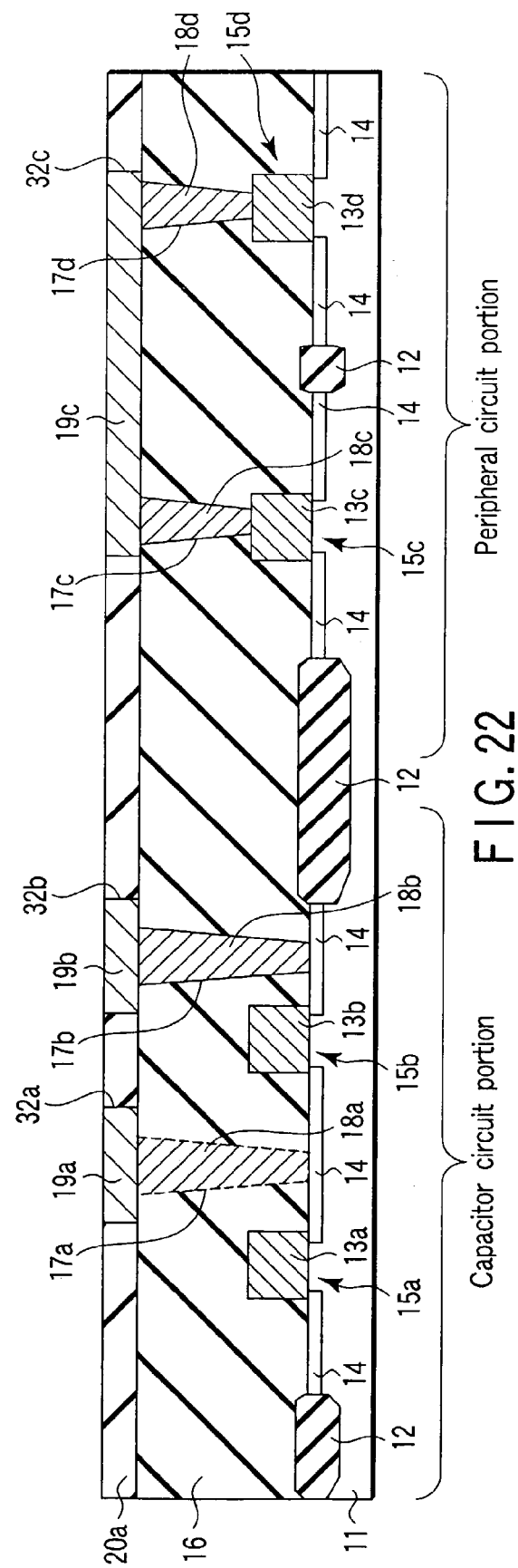
Figure 23:
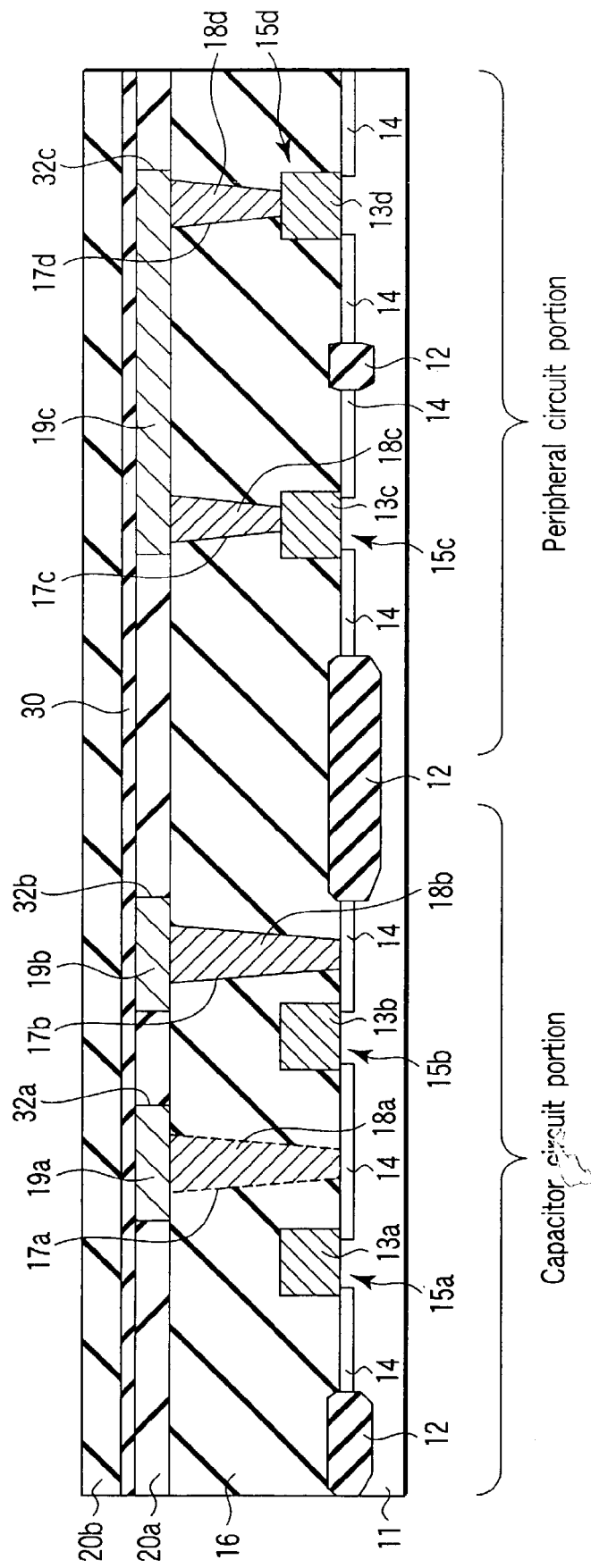

FIGS. 21 to 23 are cross sectional views collectively showing a manufacturing process of the semiconductor memory device according to the third embodiment of the present invention. A manufacturing method of the semiconductor memory device according to the third embodiment of the present invention will now be described with reference to FIGS. 21 to 23. Incidentally, the following description covers mainly the steps differing from those in the first embodiment described previously.

In the first step, the contacts 18a, 18b, 18c, 18d are formed in the interlayer insulating film 16 as shown in FIGS. 4 to 6 referred to previously in conjunction with the first embodiment of the present invention.

In the next step, an interlayer insulating film 20a is formed to cover the interlayer insulating film 16 and the contacts 18a, 18b, 18c, and 18d as shown in FIG. 21, followed by selectively removing the interlayer insulating film 20a so as to trenches 32a, 32b, 32c serving to expose the upper surfaces of the contacts 18a, 18b, 18c to the outside.

In the next step, a material layer for forming the conductive oxygen barrier films 19a, 19b, 19c is formed to fill the trenches 32a, 32b, 32c and to cover the interlayer insulating film 20a, as shown in FIG. 22. Then, the material layer noted above is planarized by, for example, a CMP (Chemical Mechanical Polishing) method until the upper surface of the interlayer insulating film 20a is exposed to the outside. As a result, the conductive oxygen barrier films 19a, 19b, 19c of the damascene structure are formed in the trenches 32a, 32b, 32c, respectively.

Further, an insulating oxygen barrier film 30 is formed to cover the interlayer insulating film 20a and the conductive oxygen barrier films 19a, 19b, 19c, as shown in FIG. 23, followed by forming an interlayer insulating film 20b on the insulating oxygen barrier film 30. The subsequent steps are equal to those for the first embodiment of the present invention described previously, and the manufacturing process leads to the step shown in FIG. 8.

According to the third embodiment of the present invention, it is possible to obtain the effects similar to those obtained in the second embodiment. In addition, by forming the insulating oxygen barrier film 30 on the conductive oxygen barrier films 19a, 19b, 19c of the damascene structure, it is possible to suppress the reduction in the oxygen barrier effect caused by the step coverage of the insulating oxygen barrier film 30.

FOURTH EMBODIMENT

A fourth embodiment of the present invention is directed to a modification of the second embodiment and covers an example in which a side wall insulating film is formed on the side surface of the ferroelectric capacitor so as to permit the ferroelectric capacitor and the conductive oxygen barrier film to be connected to each other via a single contact.

Figure 24:
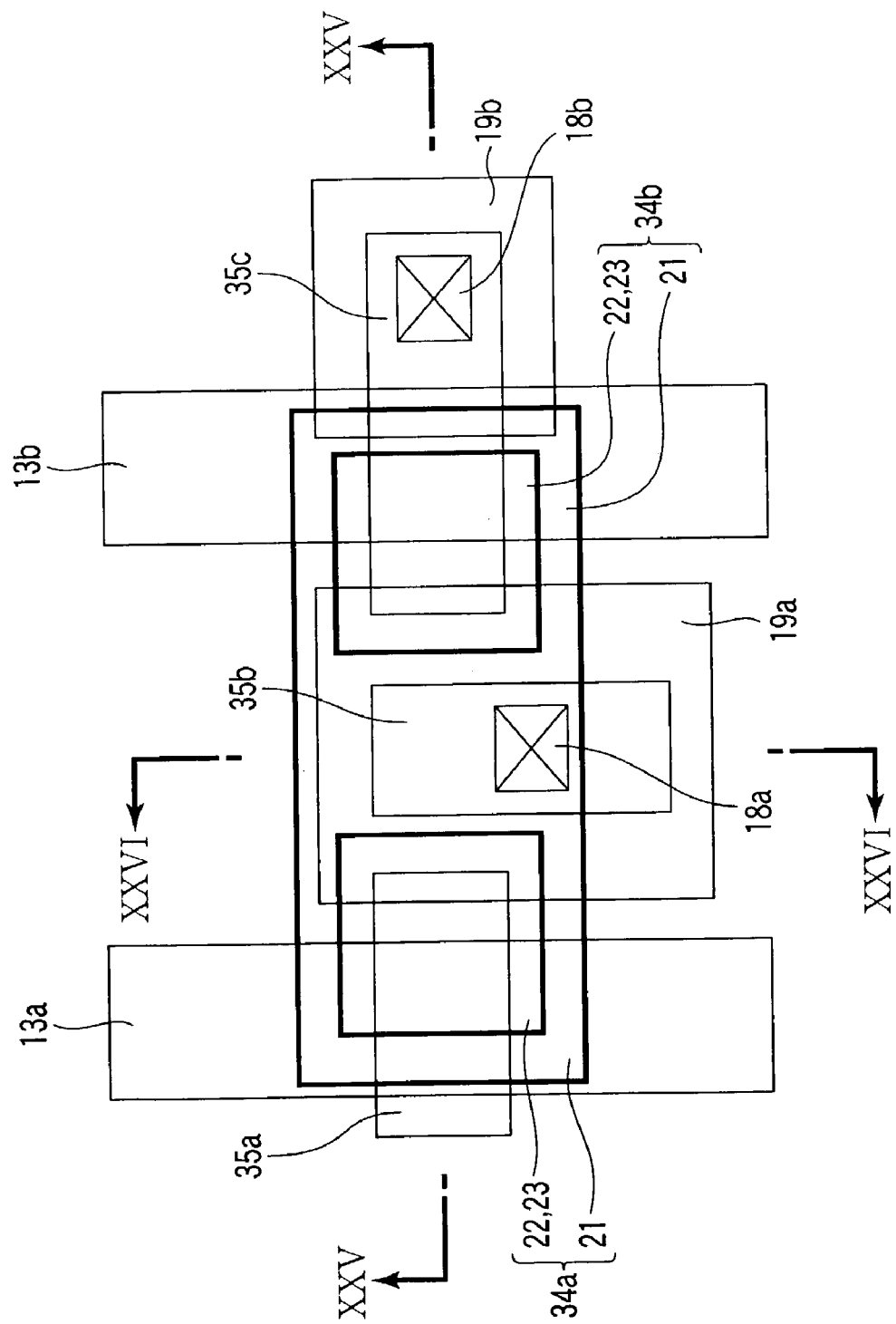
FIG. 24 is a plan view showing the construction of a semiconductor memory device according to a fourth embodiment of the present invention.
Figure 25:
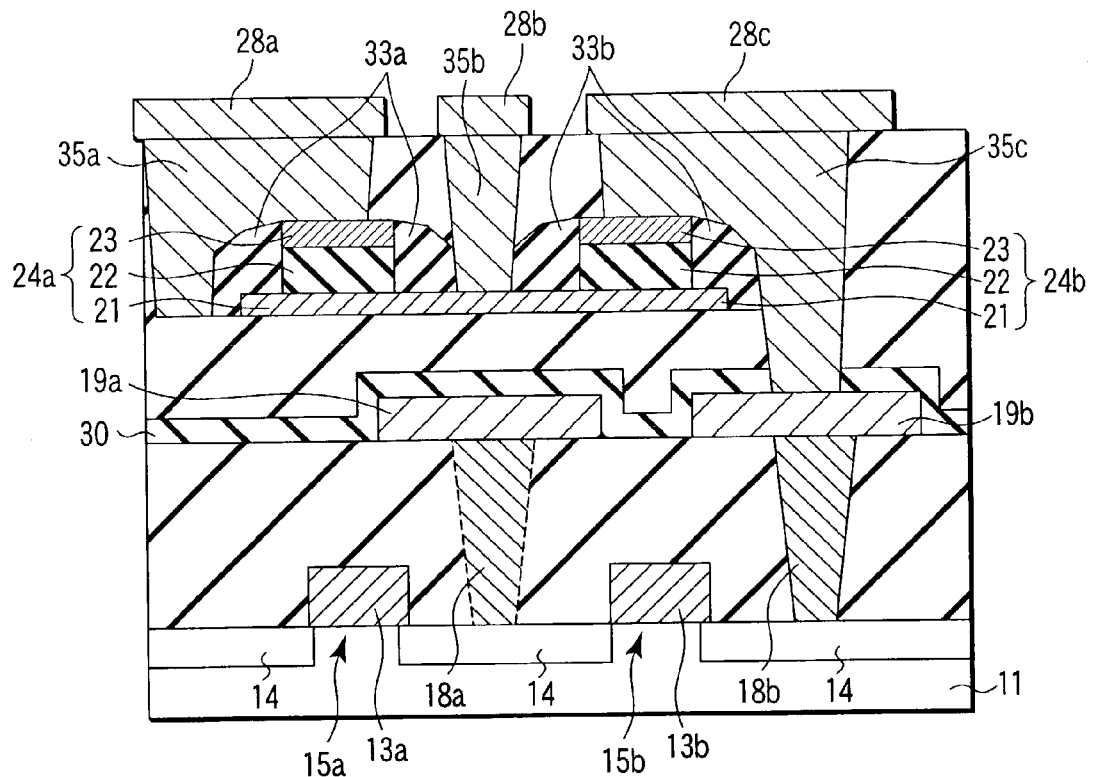
FIG. 25 is a cross sectional view of the semiconductor memory device along the line XXV—XXV shown in FIG. 24.
Figure 26:
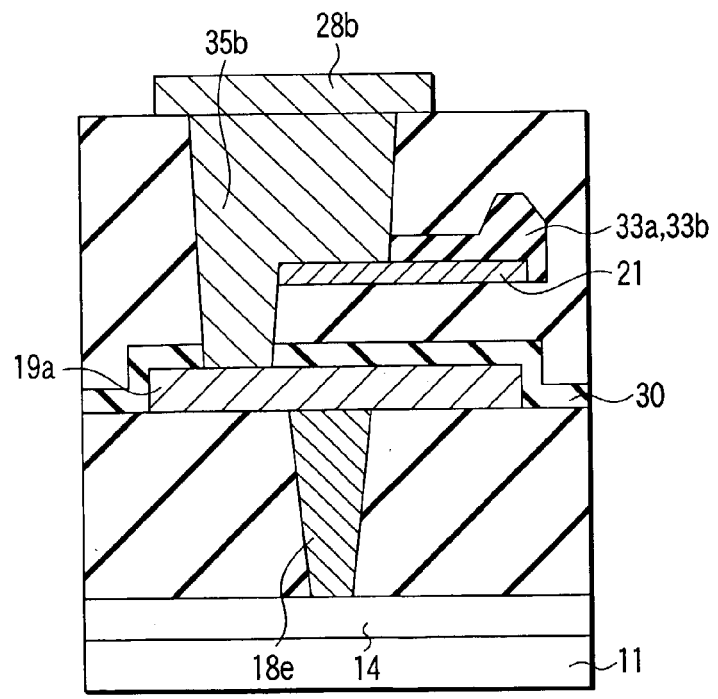
FIG. 26 is a cross sectional view of the semiconductor memory device along the line XXVI—XXVI shown in FIG. 24.

FIGS. 24 to 26 are a plan view and cross sectional views collectively directed to a semiconductor memory device according to a fourth embodiment of the present invention. The construction of the semiconductor memory device according to the fourth embodiment of the present invention will now be described. Incidentally, that portion alone of the fourth embodiment which differs from the second embodiment will be described in the following.

As shown in FIGS. 24 to 26, the fourth embodiment differs from the second embodiment in that, in the fourth embodiment, side wall insulating films 33a, 33b are formed on the side surfaces of the ferroelectric capacitors 24a, 24b, respectively. It suffices for each of these side wall insulating films 33a, 33b to be formed of an insulating material having a processing selectivity ratio relative to an oxide film. For example, it is possible for each of the side wall insulating films 33a, 33b to be formed of a material containing one of, for example, $Al_2O_3$, SiN, SiON, PZT and $TiO_2$. One of the side wall insulating films 33a and one of the side wall insulating films 33b positioned adjacent to each other with the contact 35b interposed therebetween serve to define the width of the opening of the contact hole for the contact 35b and serve to insulate the contact 35b from the upper electrode 23. On the other hand, the other side wall insulating film 33b serves to insulate the lower electrode 21 from the contact 35c.

The fourth embodiment also differs from the second embodiment in that the contacts 27b and 27f shown in FIGS. 13 and 14 in conjunction with the second embodiment is formed as a single contact 35b in the fourth embodiment of the present invention, and in that the contacts 27c and 27d shown in FIGS. 13 and 14 are formed as a single contact 35c in the fourth embodiment of the present invention. What should be noted is that the contacts 35a, 35b and 35c are self-aligned with the side wall insulating films 33a, 33b in the fourth embodiment of the present invention.

Figure 28:
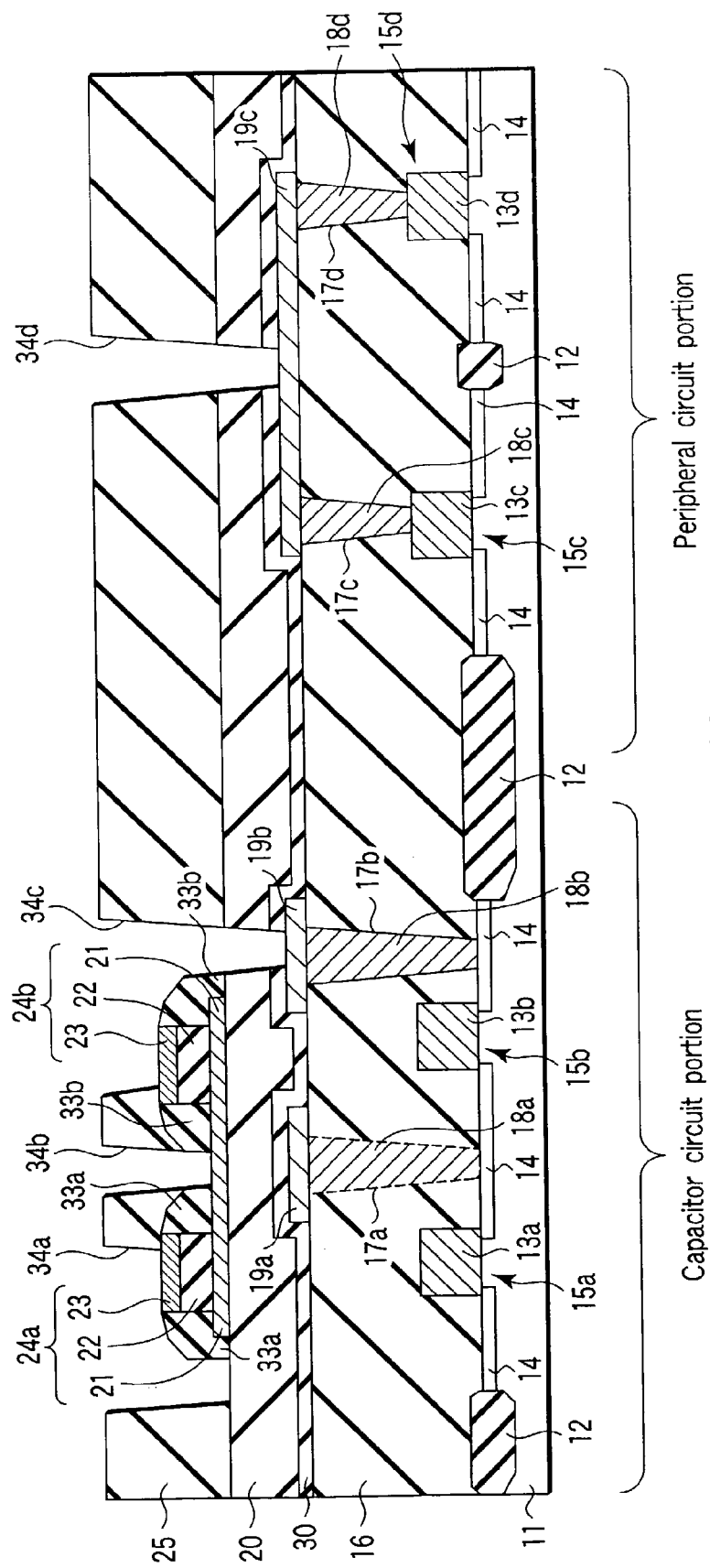
Figure 29:
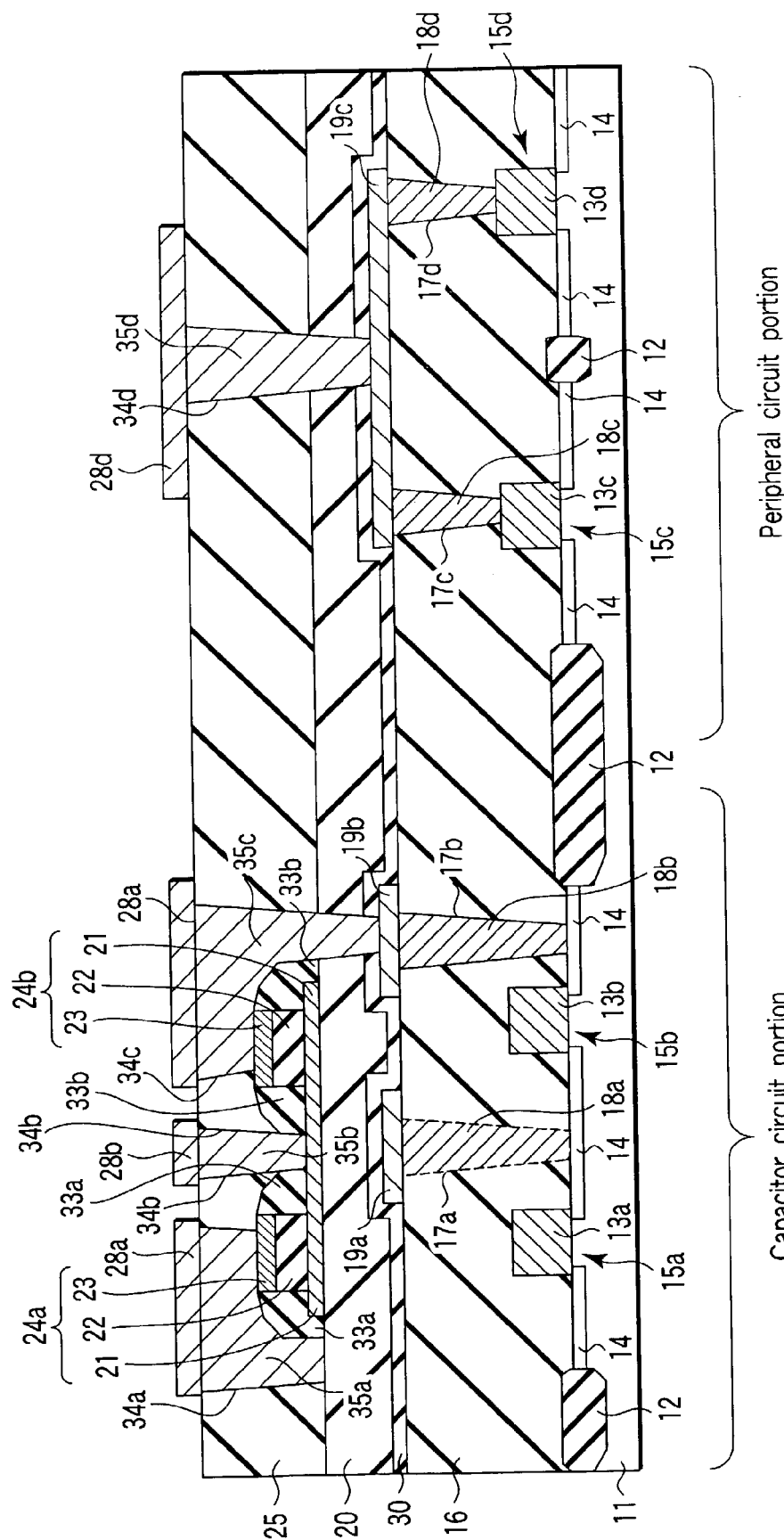

FIGS. 27 to 29 are cross sectional views collectively showing a manufacturing process of the semiconductor memory device according to the fourth embodiment of the present invention. The manufacturing method of the semiconductor memory device according to the fourth embodiment will now be described with reference to FIGS. 27 to 29. Incidentally, those steps of the fourth embodiment which differ from the first embodiment described previously are mainly described in the following.

In the first step, ferroelectric capacitors 24a, 24b are formed on the interlayer insulating film 20 as shown in FIGS. 4 to 8 described previously in conjunction with the first embodiment.

In the next step, the side wall insulating films 33a, 33b are formed on the side surfaces of the ferroelectric capacitors 24a, 24b, respectively, as shown in FIG. 27. It is advisable for the side wall insulating films 33a, 33b to be formed of a material having a processing selectivity ratio relative to a interlayer insulating film 25 referred to herein later.

In the next step, the interlayer insulating film 25 is formed in a manner to cover the ferroelectric capacitors 24a, 24b, the side wall insulating films 33a, 33b, and the interlayer insulating film 20, as shown in FIG. 28. The material for forming the interlayer insulating film 25 includes, for example, P-TEOS, $O_3$-TEOS, SOG, $Al_2O_3$, SiN and SiON. Then, the interlayer insulating film 25 is selectively removed so as to form contact holes 34a, 34b, 34c, and 34d, followed by carrying out a high temperature annealing treatment at, for example, 650° C. for one hour under an oxygen gas atmosphere.

In the next step, the contact holes 34a, 34b, 34c and 34d are filled with a metallic material, followed by planarizing the metallic material layer, as shown in FIG. 29. As a result, formed are contacts 35a, 35b, 35c and 35d.

It should be noted that the contact 35a is connected to the upper electrode 23 of the ferroelectric capacitor 24a. The contact 35b is connected to the lower electrode 21 for the ferroelectric capacitors 24a, 24b. The contact 35c is connected to the upper electrode 23 of the ferroelectric capacitor 24b and to the conductive oxygen barrier film 19b. Further, the contact 35d is connected to the conductive oxygen barrier film 19c.

In the next step, a wiring material layer is formed to cover the contacts 35a, 35b, 35c, 35d and the interlayer insulating film 25, followed by patterning the wiring material layer so as to form wirings 28a, 28b, 28c and 28d. It should be noted that the wiring 28a is connected to the contact 35a. The wiring 28b is connected to the contact 35b. The wiring 28c is connected to the contact 35c. Further, the wiring 28d is connected to the contact 35d.

According to the fourth embodiment of the present invention, it is possible to obtain the effects similar to those obtained in the second embodiment described previously. Further, additional effects can be obtained as follows.

Specifically, in the second embodiment of the present invention, it is possible for the contacts 27d, 27f to fail to be aligned with the conductive oxygen barrier films 19a, 19b, respectively, in the lithography for forming the contacts 27d, 27f. In the fourth embodiment, however, it is possible to form the contacts 35a, 35b, 35c, 35d in a self-aligned fashion by forming the side wall insulating films 33a, 33b on the side surfaces of the ferroelectric capacitors 24a, 24b. As a result, it is possible to neglect the misalignment by the lithography in respect of the contact layer so as to make it possible to miniaturize the ferroelectric capacitor circuit portion.

It should also be noted that, in the construction according to the second embodiment shown in FIG. 13, it is difficult to form simultaneously the contact holes for the contact 27c connected to the ferroelectric capacitor 24b and for the contact 27d connected to the contact 18b connected to the transistor 15b. In the fourth embodiment of the present invention, however, the contact holes for the contacts 27c and 27d can be formed simultaneously because the side wall insulating films 33a, 33b are formed on the side surfaces of the ferroelectric capacitors 24a, 24b, respectively, with the result that it is possible to save the manufacturing cost.

Further, it is possible to form the contacts 35a, 35b, 35c in a self-aligned fashion with the side wall insulating films 33a, 33b because the side wall insulating films 33a, 33b are formed on the side surfaces of the ferroelectric capacitors 24a, 24b, respectively, with the result that it is possible to diminish the cell size.

FIFTH EMBODIMENT

A fifth embodiment is directed to an example of a ferroelectric capacitor circuit of a COP (Capacitor On Plug) structure.

Figure 30:
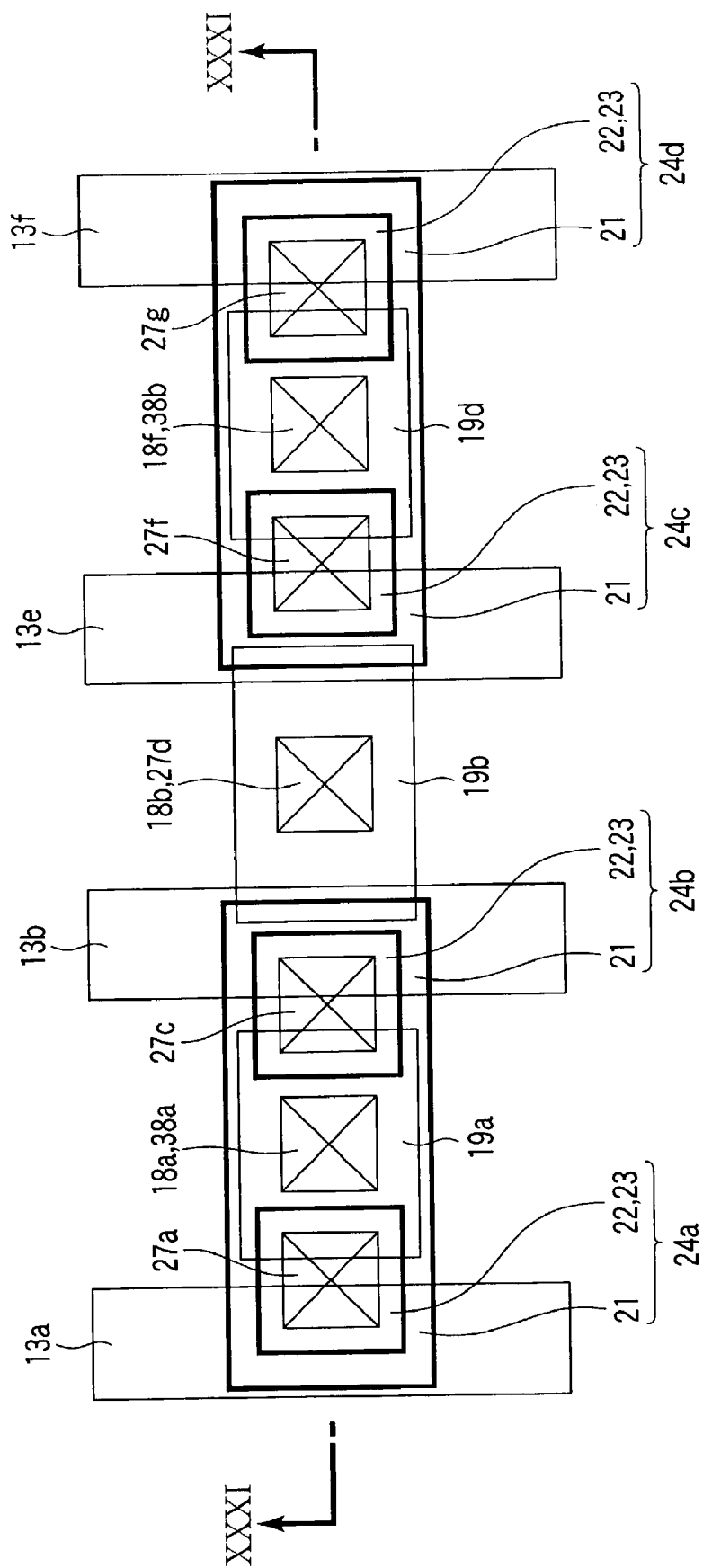
FIG. 30 is a plan view showing the construction of a semiconductor memory device according to a fifth embodiment of the present invention.
Figure 31:
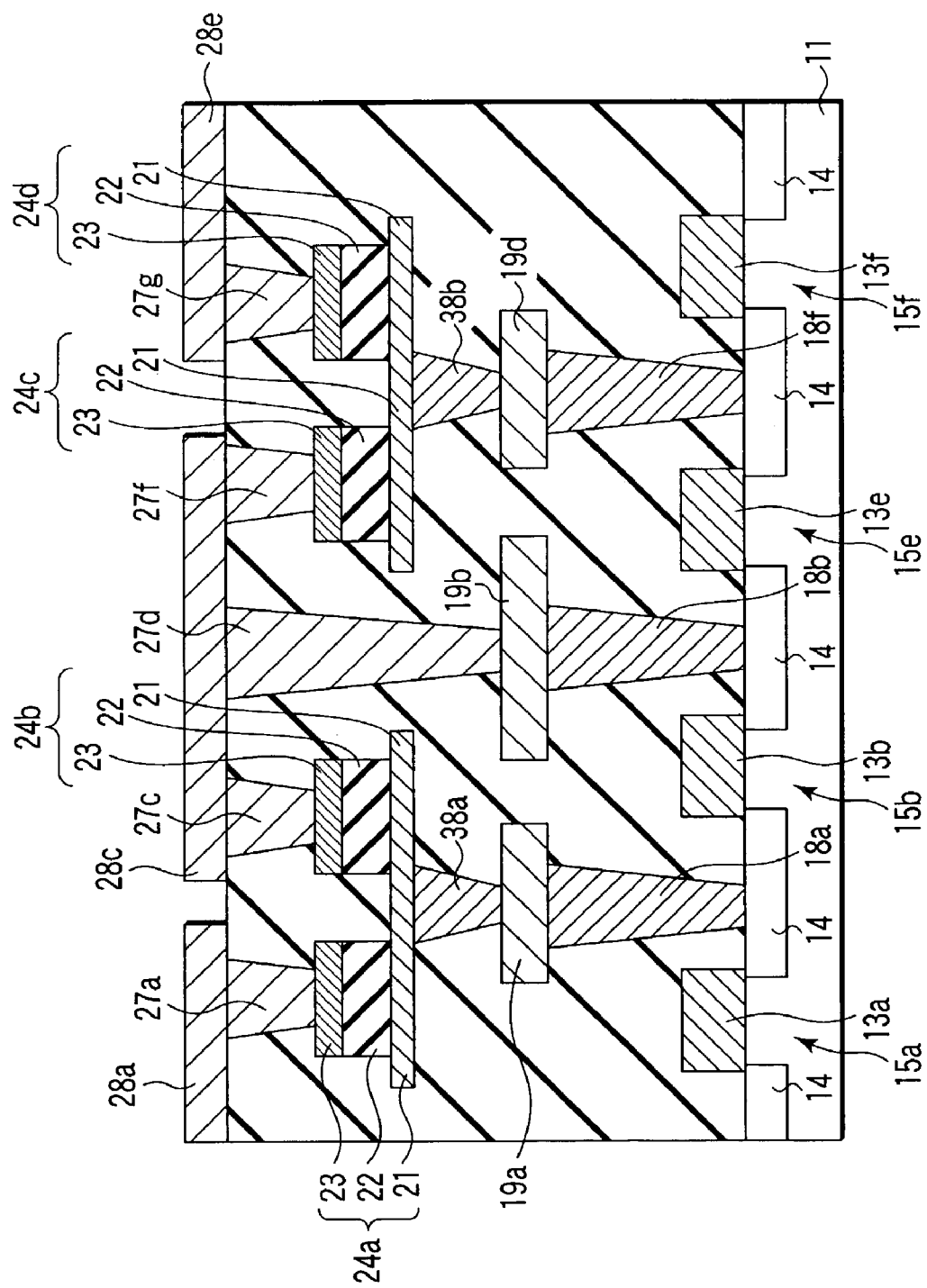
FIG. 31 is a cross sectional view of the semiconductor memory device along the line XXXI—XXXI shown in FIG. 30.

FIGS. 30 and 31 are a plan view and a cross sectional view, respectively, collectively showing a semiconductor memory device according to the fifth embodiment of the present invention. The manufacturing process of the semiconductor memory device according to the fifth embodiment of the present invention will now be described with reference to FIGS. 30 and 31. Incidentally, that construction alone of the fifth embodiment which differs from the first embodiment described previously is described in the following.

As shown in FIGS. 30 and 31, the fifth embodiment differs from the first embodiment in the manner in which the lower electrode 21 of the ferroelectric capacitors 24a, 24b is connected to the conductive oxygen barrier film 19a. In the first embodiment of the present invention described previously, the lower electrode 21 of the ferroelectric capacitors 24a, 24b is connected to the conductive oxygen barrier film 19a with the contact 27b, the metal wiring 28 and the contact 27f interposed therebetween. In the fifth embodiment, however, the lower electrode 21 of the ferroelectric capacitors 24a, 24b is connected to the conductive oxygen barrier film 19a with the contact 38a positioned right below the lower electrode 21 interposed therebetween so as to form a ferroelectric capacitor circuit portion of a COP structure. In this case, the contact 28a is formed of a material containing one of, for example, Pt, Ir, $IrO_2$, Ru, $RuO_2$ and SRO.

Likewise, the lower electrode of the ferroelectric capacitors 24c, 24d is connected to the conductive oxygen barrier film 19a with the contact 38b interposed therebetween so as to form a COP structure.

Also, the upper electrode 23 of the ferroelectric capacitor 24b is connected to the upper electrode 23 of the ferroelectric capacitor 24c with the contacts 27c, 27f and the metal wiring 28c interposed therebetween. The metal wiring 28c is connected to the conductive oxygen barrier film 19b with the contact 27d interposed therebetween, and the conductive oxygen barrier film 19b is connected to the source/drain diffusion layers 14 shared by the transistors 15b, 15e with the contact 18b interposed therebetween.

Figure 32:
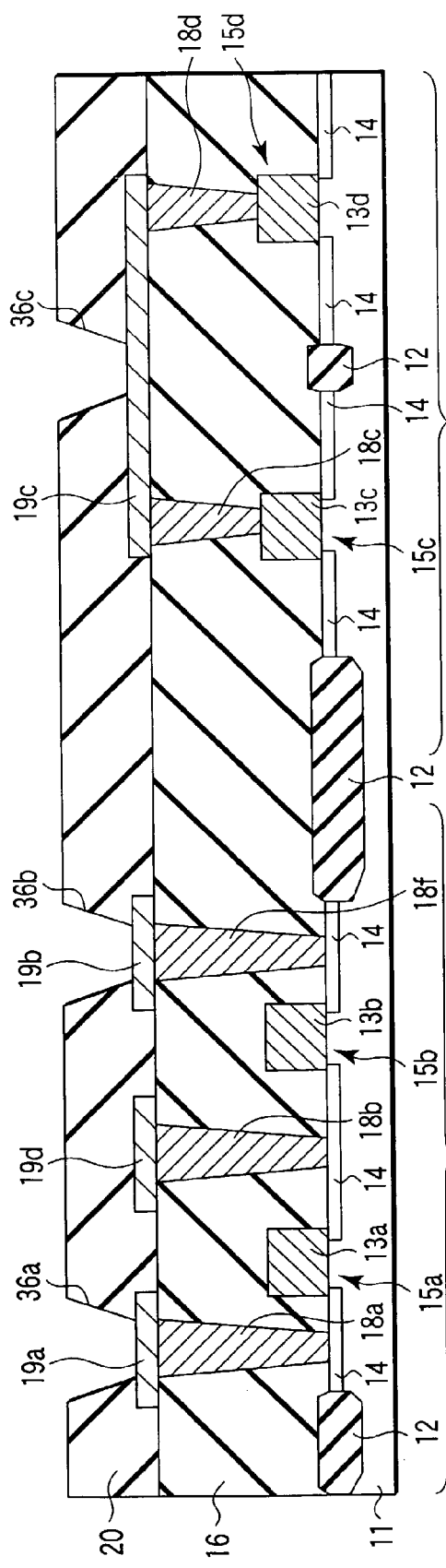
FIGS. 32, 33 and 34 are cross sectional views collectively showing a manufacturing process of the semiconductor memory device according to the fifth embodiment of the present invention.
Figure 33:
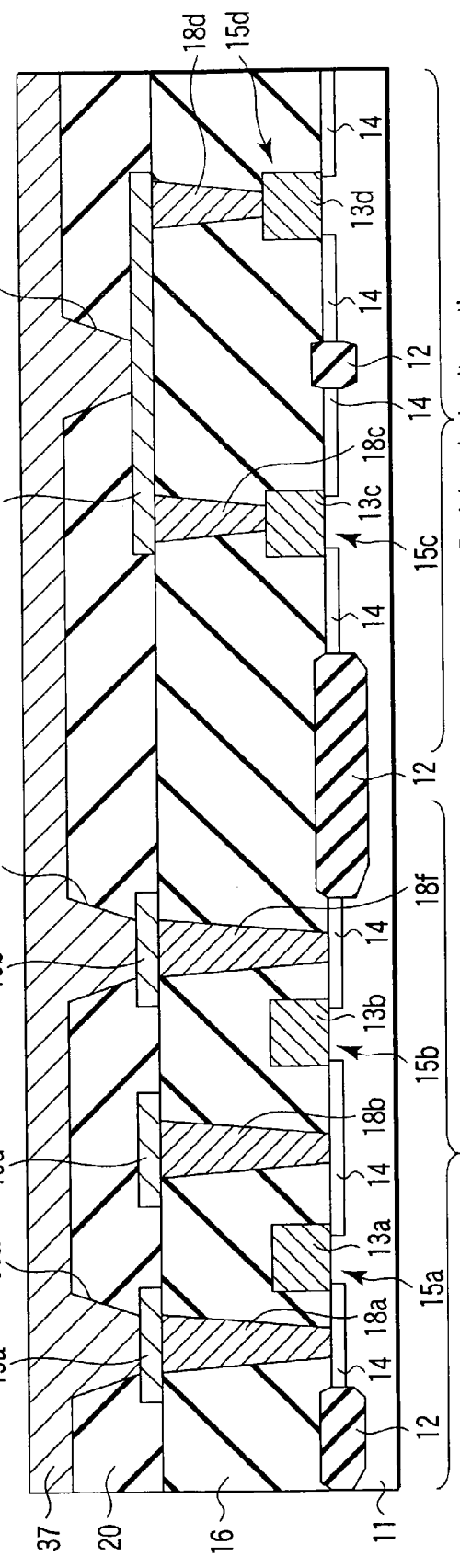
Figure 34:
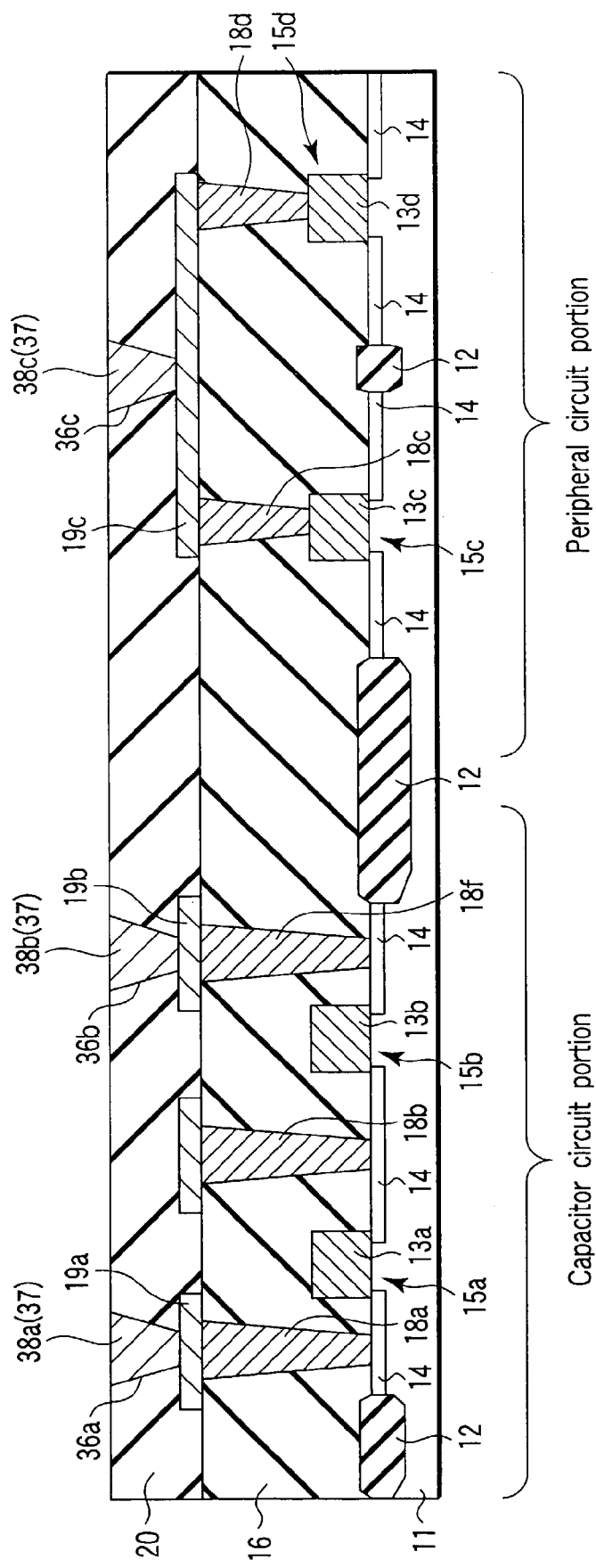

FIGS. 32 to 34 are cross sectional views collectively showing a manufacturing process of a semiconductor memory device according to the fifth embodiment of the present invention. The manufacturing process of the semiconductor memory device according to the fifth embodiment of the present invention will now be described with reference to FIGS. 32 to 34. Incidentally, that process of the fifth embodiment which differs from the first embodiment will be described mainly in the following.

In the first step, the conductive oxygen barrier films 19a, 19b, 19c, 19d are formed on the interlayer insulating film 16 as shown in FIGS. 4 to 7 referred to previously in conjunction with the first embodiment of the present invention.

In the next step, an interlayer insulating film 20 is formed on the conductive oxygen barrier films 19a, 19b, 19c, 19d and the interlayer insulating film 16, as shown in FIG., 32. Then, the interlayer insulating film 20 is selectively removed so as to form contact holes 36a, 36b, and 36c.

Further, a metal film 37 is formed to fill the contact holes 36a, 36b, 36c and to cover the interlayer insulating film 20, as shown in FIG. 33. The metal film thus formed is planarized until the upper surface of the interlayer insulating film 20 is exposed to the outside so as to form contacts 38a, 38b and 38c to fill the contact holes 36a, 36b and 36c, respectively, as shown in FIG. 34. The subsequent steps are equal to those in the first embodiment, thereby forming a ferroelectric capacitor.

According to the fifth embodiment of the present invention, it is possible to obtain the effects similar to those described previously in conjunction with the first embodiment. Also, additional effects can be obtained as described in the following.

Specifically, in the conventional COP type FeRAM, a lower plug that tends to be oxidized easily is arranged right under the lower electrode of the ferroelectric capacitor. Therefore, it is necessary for the material of the lower electrode not to lose the electrical conductivity even under an oxidizing atmosphere of a high temperature and to perform the function of an oxygen barrier so as to prevent the lower plug from being oxidized. As a result, the construction of the lower electrode is rendered complex so as to make it difficult to optimize the construction of the ferroelectric capacitor and to process the material of the lower electrode material. In the fifth embodiment of the present invention, however, the contacts 38a, 38b positioned below the lower electrode 21 are formed of a material that does not lose the electrical conductivity under an oxidizing atmosphere of a high temperature so as to avoid the above-noted problems inherent in the prior art.

It should also be noted that, since a COP structure is employed in the fifth embodiment of the present invention, it is possible to shorten the connecting member between the ferroelectric capacitors 24a, 24b, 24c, 24d and the transistors 15a, 15b, 15c, 15d so as to miniaturize the capacitor circuit portion.

SIXTH EMBODIMENT

A sixth embodiment of the present invention is directed to a modification of the fifth embodiment described above and covers an example in which the contact for connecting the upper electrode of the ferroelectric capacitor to the conductive oxygen barrier film is of two-stage structure so as to diminish the aspect ratio of the contact.

Figure 35:
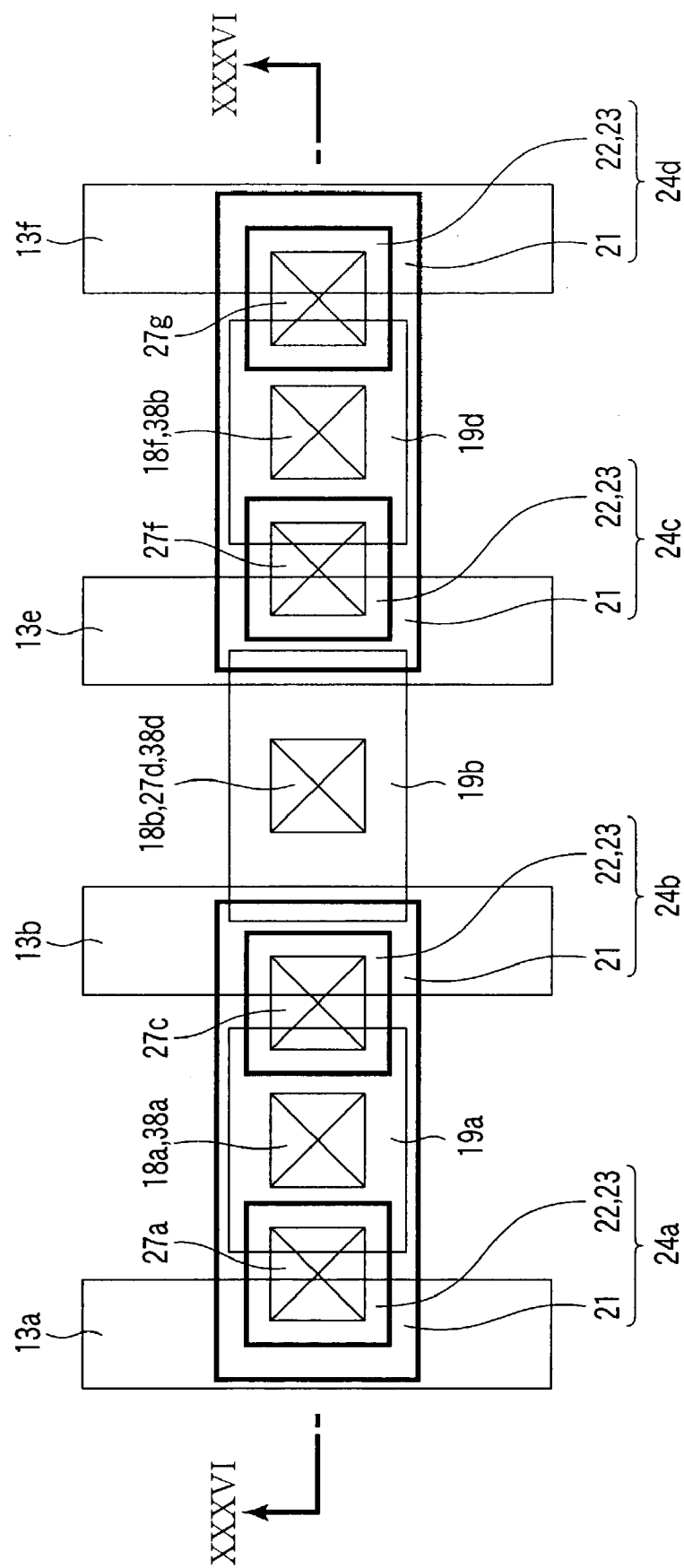
FIG. 35 is a plan view showing the construction of a semiconductor memory device according to a sixth embodiment of the present invention.
Figure 36:
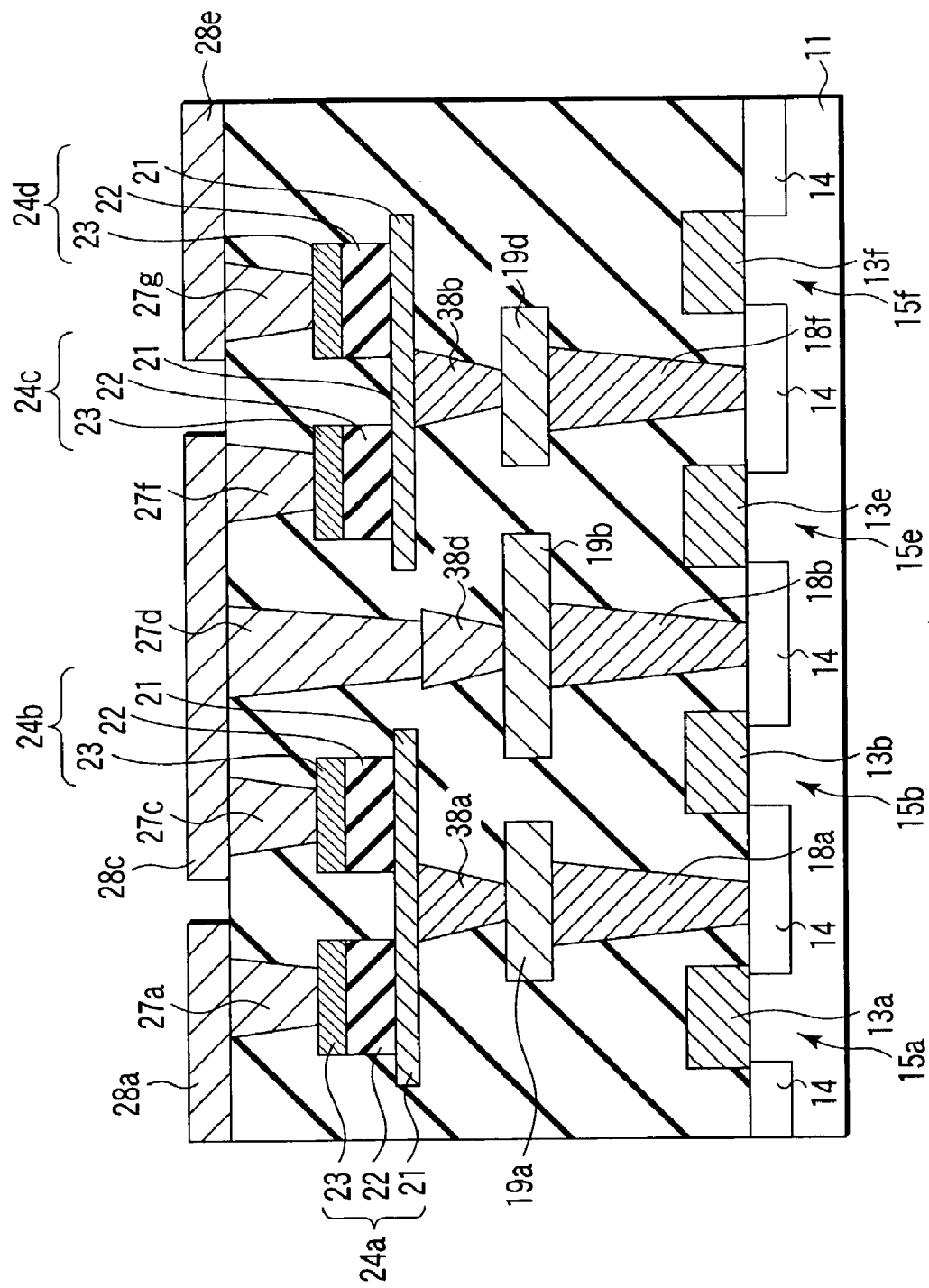
FIG. 36 is a cross sectional view of the semiconductor memory device along the line XXXVI—XXXVI shown in FIG. 35.

FIGS. 35 and 36 are a plan view and a cross sectional view, respectively, of a semiconductor memory device according to the sixth embodiment of the present invention. The construction of the semiconductor memory device according to the sixth embodiment of the present invention will now be described. Incidentally, that portion alone of the sixth embodiment which differs from the fifth embodiment will be described in the following.

As shown in FIGS. 35 and 36, the sixth embodiment differs from the fifth embodiment in that the contact 27d is not directly connected to the conductive oxygen barrier film 19b, but is connected to the conductive oxygen barrier film 19b with the contact 27d interposed therebetween. Since the contact 38d is formed simultaneously with formation of the contacts 38a and 38b, the contact 38d is formed of the material equal to that used for forming the contacts 38a, 38b.

Naturally, the contact 38d is formed of a material that does not lose the electrical conductivity even under an oxidizing atmosphere like the contacts 38a, 38b. For example, the contact 38d is formed of a material containing one of Pt, Ir, $IrO_2$, Ru, $RuO_2$ and SRO.

Figure 37:
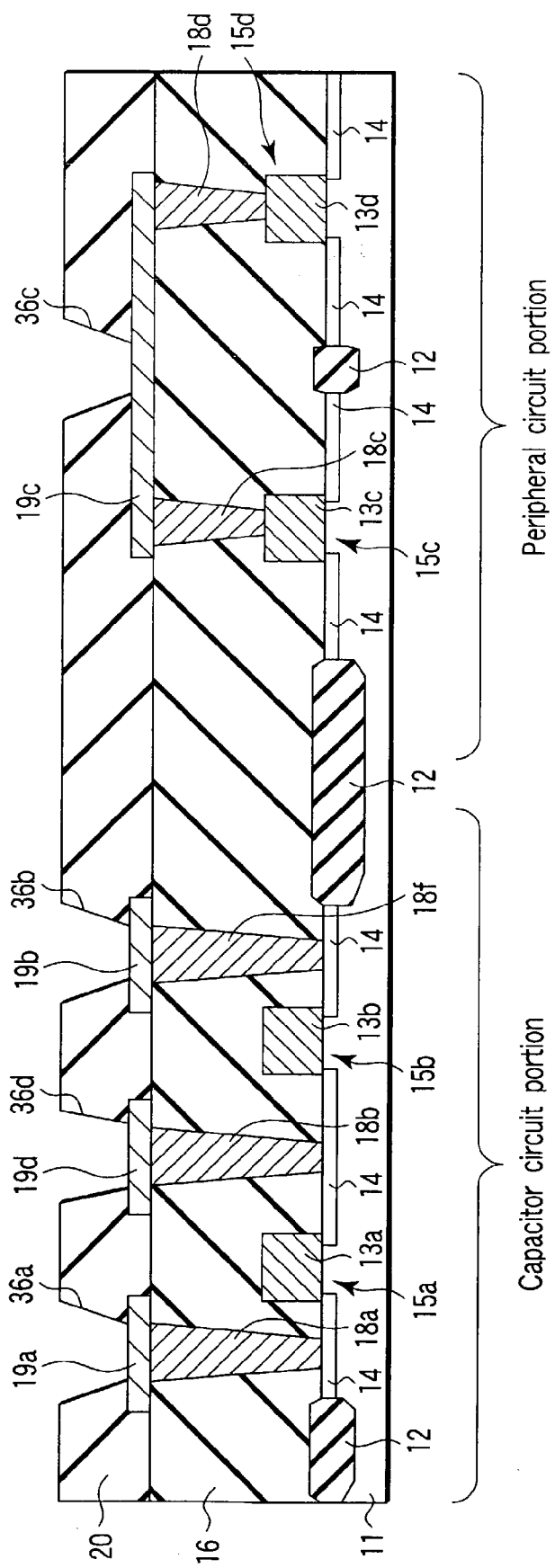
FIGS. 37, 38 and 39 are cross sectional views collectively showing a manufacturing process of the semiconductor memory device according to the sixth embodiment of the present invention.
Figure 38:
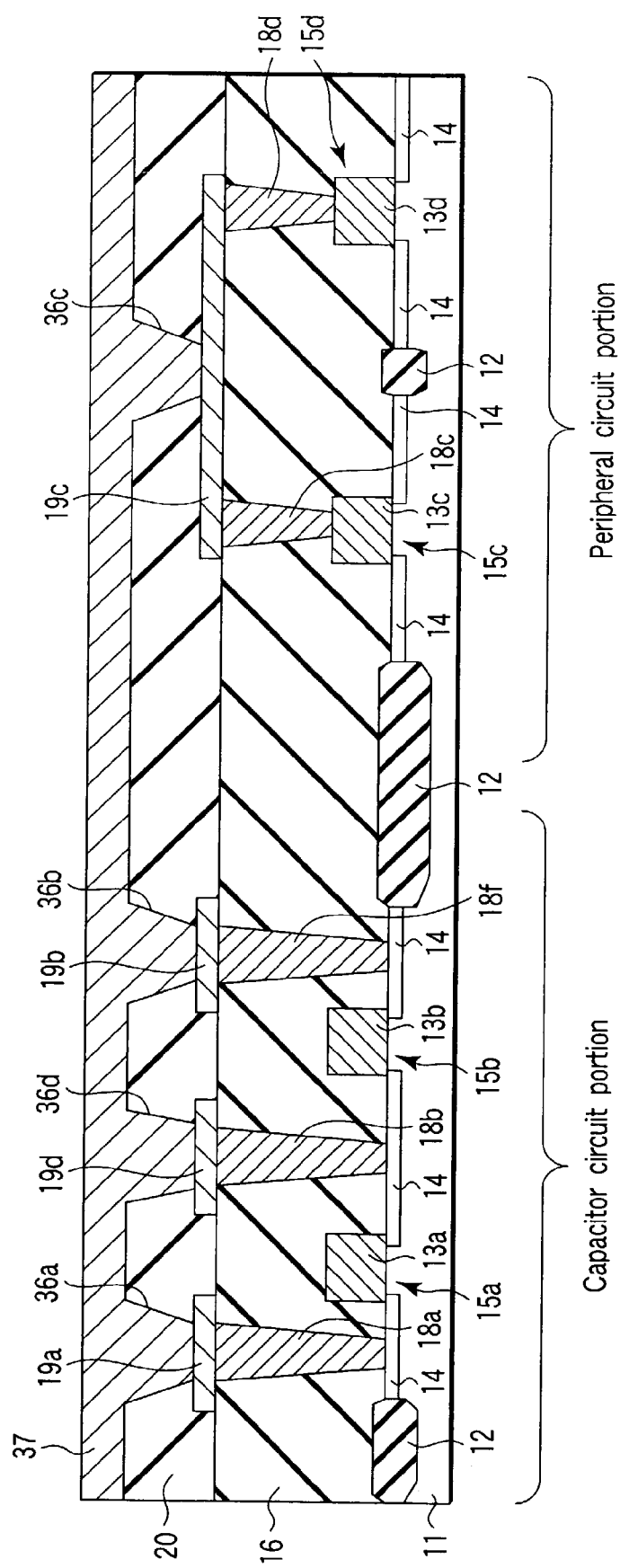
Figure 39:
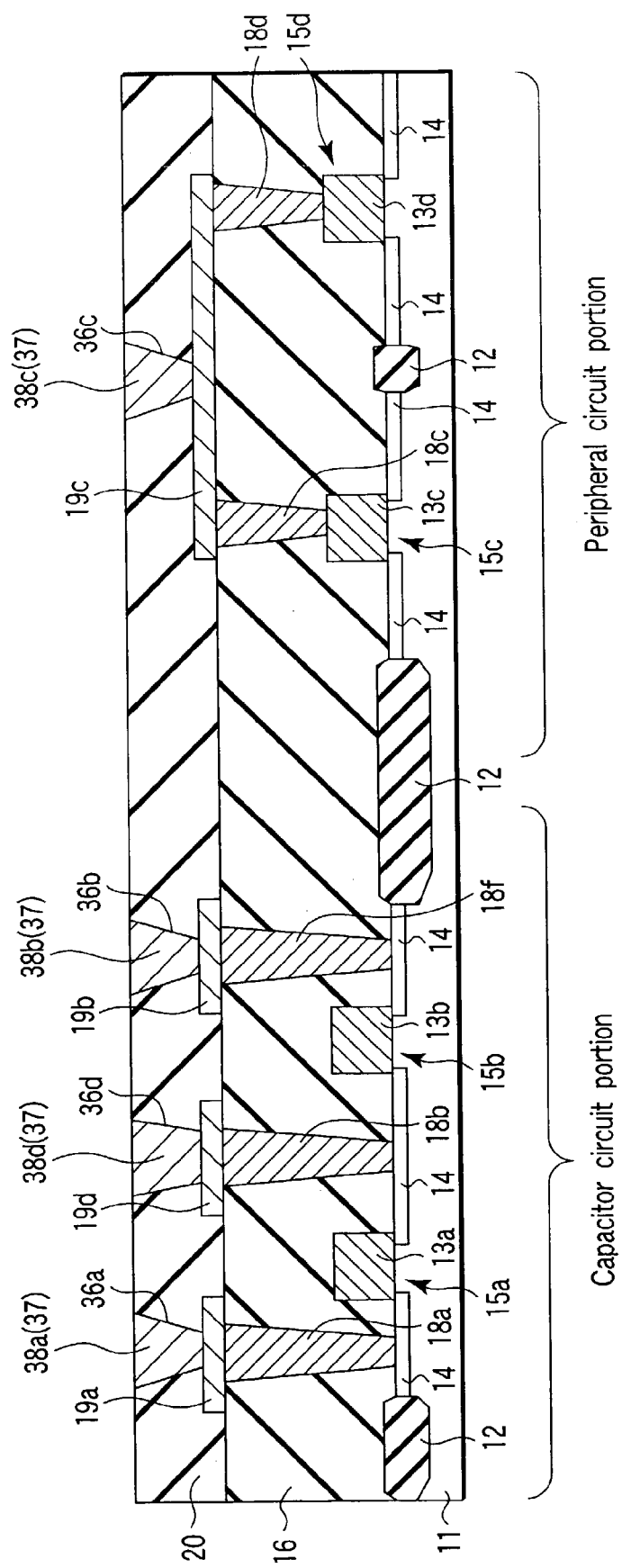

FIGS. 37 to 39 are cross sectional views collectively showing a manufacturing process of the semiconductor memory device according to the sixth embodiment of the present invention. The method of manufacturing the semiconductor memory device according to the sixth embodiment of the present invention will now be described with reference to FIGS. 37 to 39. Incidentally, those steps of the sixth embodiment which differ from the steps for the first embodiment will mainly be described in the following.

In the first step, conductive oxygen barrier films 19a, 19b, 19c, 19d are formed on the interlayer insulating film 16 as shown in FIGS. 4 to 7 referred to previously in conjunction with the first embodiment of the present invention.

In the next step, an interlayer insulating film 20 is formed to cover the conductive oxygen barrier films 19a, 19b, 19c, 19d and the interlayer insulating film 16, as shown in FIG. 37. Then, the interlayer insulating film 20 is selectively removed so as to form contact holes 36a, 36b, 36c, 36d. Further, a metal film 37 is formed to fill the contact holes 36a, 36b, 36c, 36d and to cover the interlayer insulating film 20, as shown in FIG. 38. Still further, the metal film 37 is planarized until the upper surface of the interlayer insulating film 20 is exposed to the outside, thereby filling the contact holes 36a, 36b, 36c, 37d with contacts 38a, 38b, 38c, 38d, respectively, as shown in FIG. 39. The subsequent steps are equal to those in the first embodiment of the present invention, thereby forming a ferroelectric capacitor.

According to the sixth embodiment of the present invention, it is possible to obtain the effects similar to those described previously in conjunction with the fifth embodiment. Also, additional effects can be obtained as described in the following.

Specifically, in the construction employed in the fifth embodiment, the contact 27d serving to electrically connect the ferroelectric capacitor 24b to the transistor 15b has a large aspect ratio. As a result, the contact material tends to fail to be buried satisfactorily in the contact hole, leading to decrease of the yield. In the sixth embodiment of the present invention, however, the contact 27d is electrically connected to the contact 38d formed on the conductive oxygen barrier film 19b. As a result, it is possible to diminish the aspect ratio of the contact 27d. It follows that it is possible to suppress the defective situation in burying the contact material so as to avoid the decrease of the yield.

SEVENTH EMBODIMENT

A seventh embodiment is directed to a modification of the fifth embodiment and covers an example in which the lower electrode of the ferroelectric capacitor is connected to the conductive oxygen barrier film via a local wiring in place of a contact.

Figure 40:
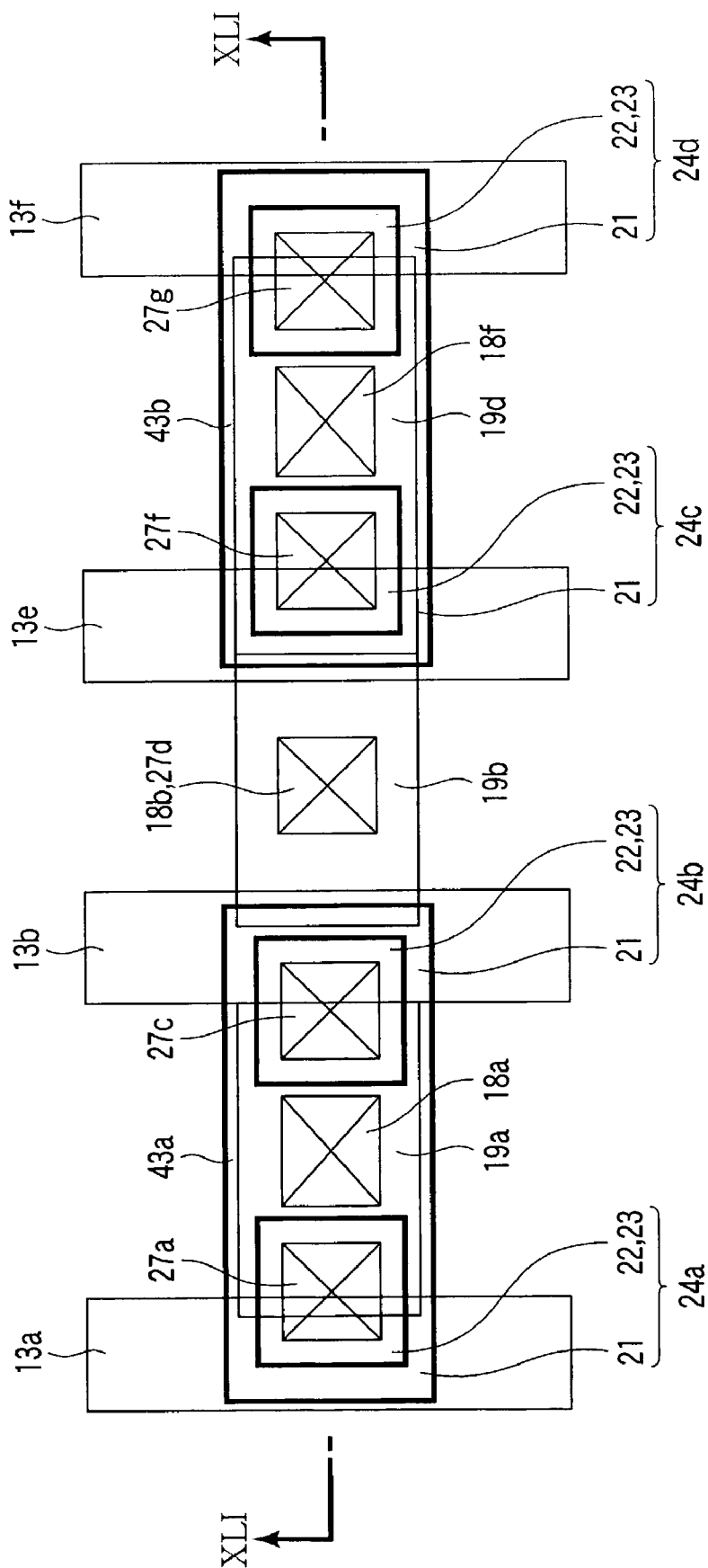
FIG. 40 is a plan view showing the construction of a semiconductor memory device according to a seventh embodiment of the present invention.
Figure 41:
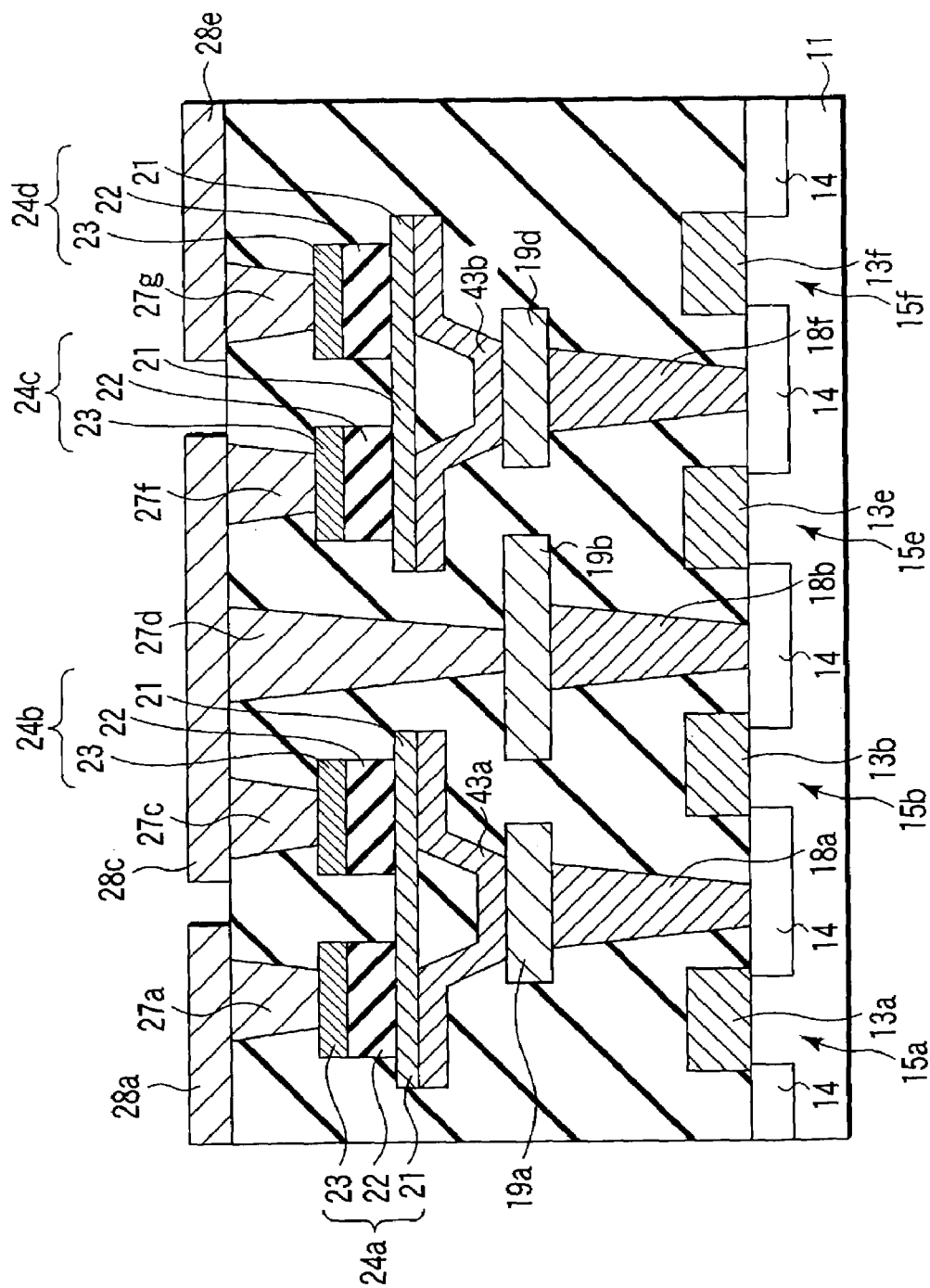
FIG. 41 is a cross sectional view of the semiconductor memory device along the line XLI—XLI shown in FIG. 40.

FIGS. 40 and 41 are a plan view and a cross sectional view, respectively, showing a semiconductor memory device according to the seventh embodiment of the present invention. The construction of the semiconductor memory device according to the seventh embodiment of the present invention will now be described. Incidentally, that portion alone of the seventh embodiment which differs from the fifth embodiment will be described in the following.

As shown in FIGS. 40 and 41, the seventh embodiment differs from the fifth embodiment in that, in the seventh embodiment, local wirings 43a, 43b are used in place of the contacts 38a, 38b. The local wirings 43a, 43b are formed of a material that does not lose the electrical conductivity even under an oxidizing atmosphere like the contacts 38a, 38b. To be more specific, each of the local wirings 43a, 43b is formed of a material containing one of Pt, Ir, $IrO_2$, Ru, $RuO_2$ and SRO.

It should also be noted that the local wirings 43a, 43b are patterned simultaneously with the patterning step of the lower electrode 21, with the result that each of the local wirings 43a, 43b is equal to the lower electrode 21 in the planar shape. Also, one side surface of the local wiring 43a coincides with one side surface of the lower electrode 21 of the capacitor 24a, and the other side surface of the local wiring 43a coincides with one side surface of the lower electrode 21 of the capacitor 24b. Likewise, one side surface of the local wiring 43b coincides with one side surface of the lower electrode 21 of the capacitor 24c, and the other side surface of the local wiring 43b coincides with one side surface of the lower electrode 21 of the capacitor 24d. Further, the central portion of the local wiring 43a is recessed, compared with the both end portions, and is brought into contact with the conductive oxygen barrier film 19a. Likewise, the central portion of the local wiring 43b is recessed, compared with the both end portions, and is brought into contact with the conductive oxygen barrier film 19b.

Figure 44:
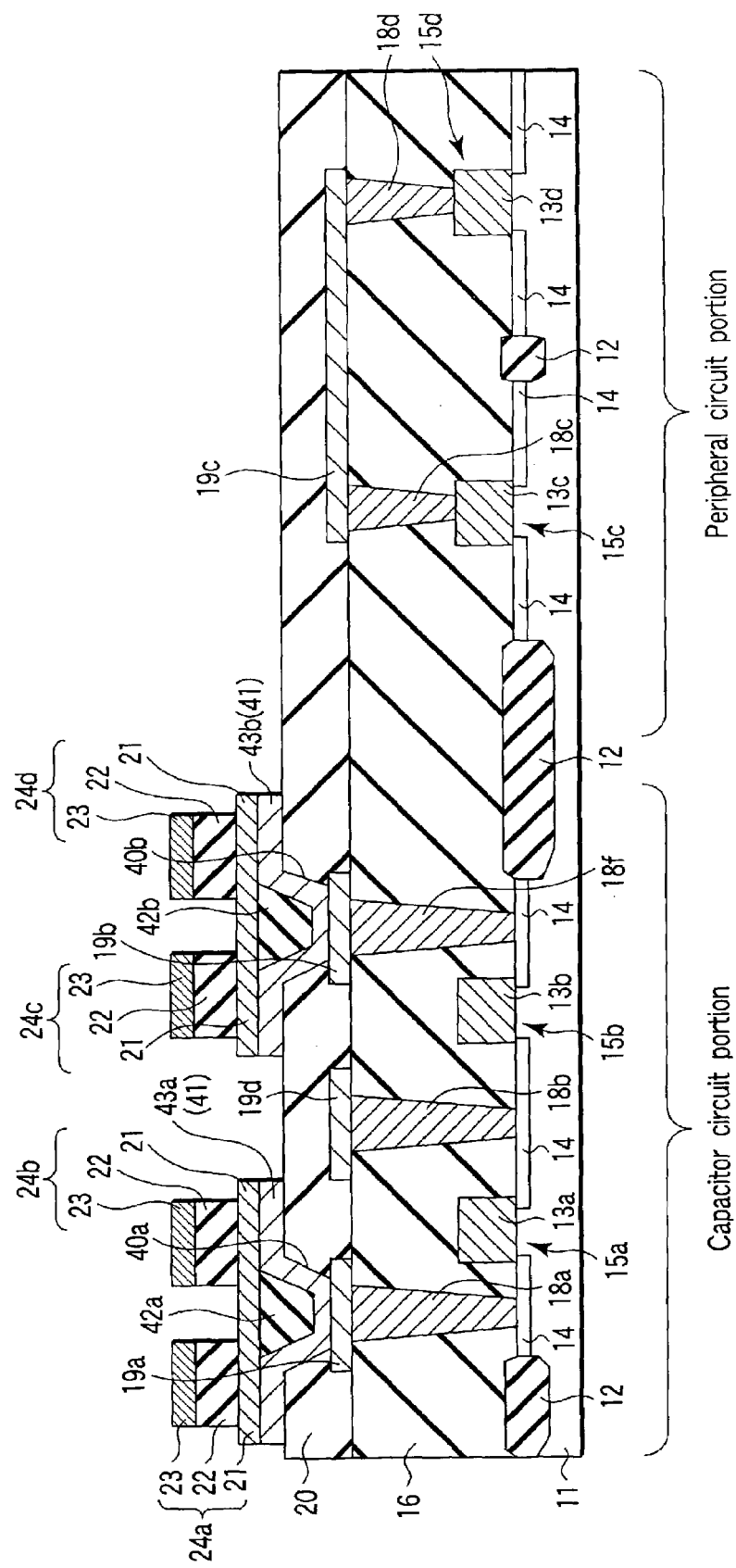

FIGS. 42 to 44 are cross sectional views collectively showing a manufacturing process of the semiconductor memory device according to the seventh embodiment of the present invention. The manufacturing process of the semiconductor memory device according to the seventh embodiment will now be described with reference to FIGS. 42 to 44. Incidentally, that portion of the seventh embodiment which differs from the first embodiment will be described mainly in the following.

In the first step, the conductive oxygen barrier films 19a, 19b, 19c, 19d are formed on the interlayer insulating film 16 as shown in FIGS. 4 to 7 referred to previously in conjunction with the first embodiment of the present invention.

In the next step, an interlayer insulating film 20 is formed to cover the conductive oxygen barrier films 19a, 19b, 19c, 19d and the interlayer insulating film 16, as shown in FIG. 42. Then, the interlayer insulating film 20 is selectively removed so as to form trenches 40a, 40b, followed by forming a metal film 41 by, for example, a sputtering method or a coating method within the trenches 40a, 40b and on the interlayer insulating film 20, as shown in FIG. 43. Further, insulating films 42a and 42b are formed within the trenches 40a and 40b, respectively. Each of these insulating films 42a, 42b is formed by using, for example, P-TEOS, $O_3$-TEOS or SOG.

Then, a lower electrode 21, a ferroelectric film 22 and an upper electrode 23 are formed successively on the surface of each of the metal film 41 and the insulating films 42a and 42b, as shown in FIG. 44. Further, the metal film 41 is patterned together with the patterning of the lower electrode 21 by means of a RIE (Reactive Ion Etching) method so as to form local wirings 43a and 43b.

According to the seventh embodiment of the present invention, it is possible to obtain the effects similar to those obtained by the fifth embodiment of the present invention described previously. In addition, the steps of burying a conductive material and planarizing the buried material layer, which are required for forming the contacts 38a, 38b, are not required for forming the local wirings 43a, 43b. In other words, the local wirings 43a, 43b can be formed easily by the sputtering method and the RIE method. It follows that the seventh embodiment permits suppressing the process cost, compared with the fifth embodiment of the present invention.

EIGHTH EMBODIMENT

An eighth embodiment of the present invention is directed to a modification of the fifth embodiment described previously and covers an example in which an insulating oxygen barrier film is formed together with the conductive oxygen barrier film.

Figure 46:
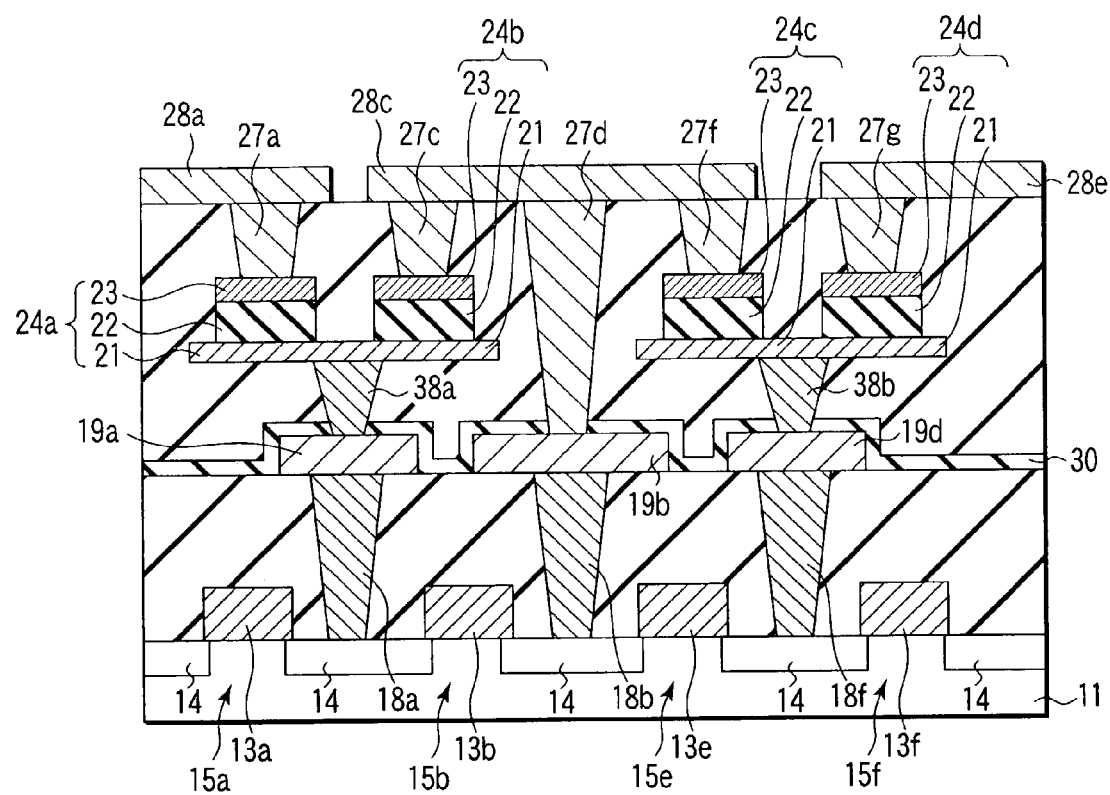
FIG. 46 is a cross sectional view of the semiconductor memory device along the line XLVI—XLVI shown in FIG. 45.

FIGS. 45 and 46 are a plan view and a cross sectional view, respectively, showing the construction of a semiconductor memory device according to the eighth embodiment of the present invention. The construction of the semiconductor memory device according to the eighth embodiment will now be described. Incidentally, that portion alone of the eighth embodiment which differs from the fifth embodiment will be described in the following.

As shown in FIGS. 45 and 46, the eighth embodiment differs from the fifth embodiment in that, in the eighth embodiment, an insulating oxygen barrier film 30 is deposited on the conductive oxygen barrier films 19a, 19b, and 19c. The insulating oxygen barrier film 30, which is formed of a material containing one of, for example, $Al_2O_3$, SiN, SiON, $TiO_2$ and PZT, may be either a single layer structure or a laminate structure.

According to the eighth embodiment of the present invention, it is possible to obtain the effects similar to those obtained by the fifth embodiment. In addition, since the insulating oxygen barrier film 30 is formed to cover the conductive oxygen barrier films 19a, 19b, 19c in the eighth embodiment, it is possible to protect sufficiently the contacts 18a, 18b, and 18f, which tend to be oxidized easily, from the high temperature annealing treatment.

NINTH EMBODIMENT

A ninth embodiment is directed to a modification of the eighth embodiment, and covers an example in which the conductive oxygen barrier film is of a damascene structure.

Figure 48:
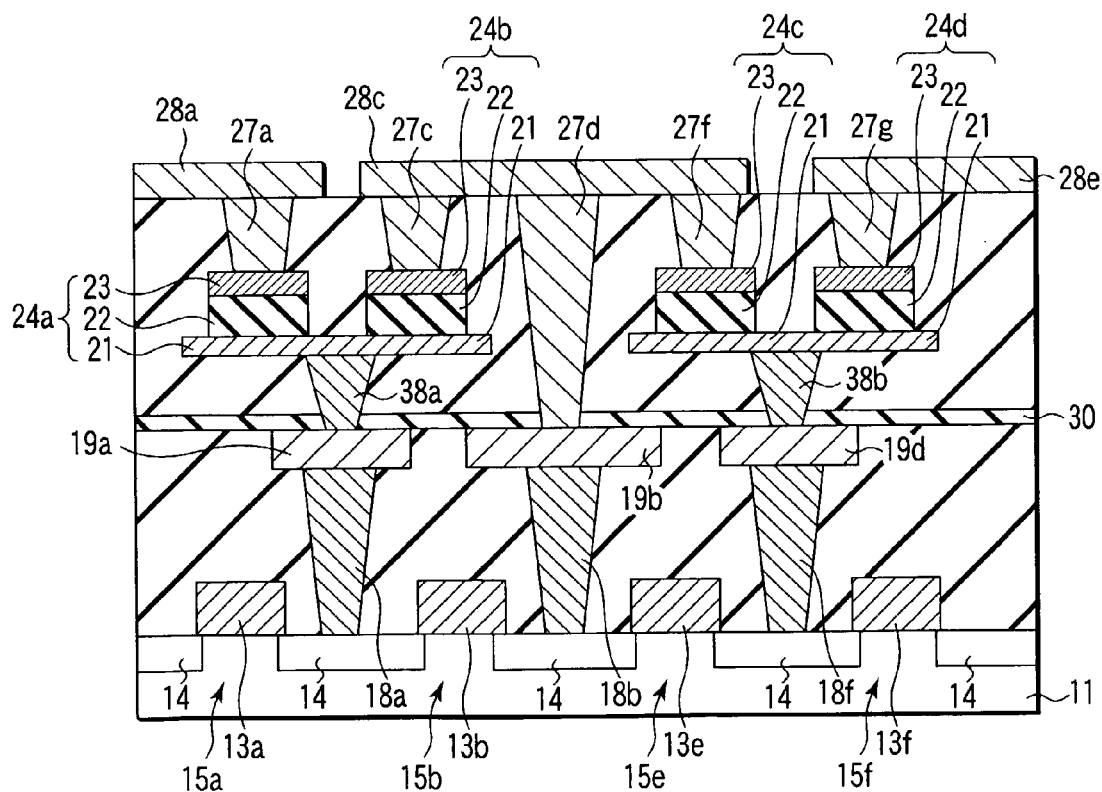
FIG. 48 is a cross sectional view of the semiconductor memory device along the line XLVIII—XLVIII shown in FIG. 47.
Figure 47:
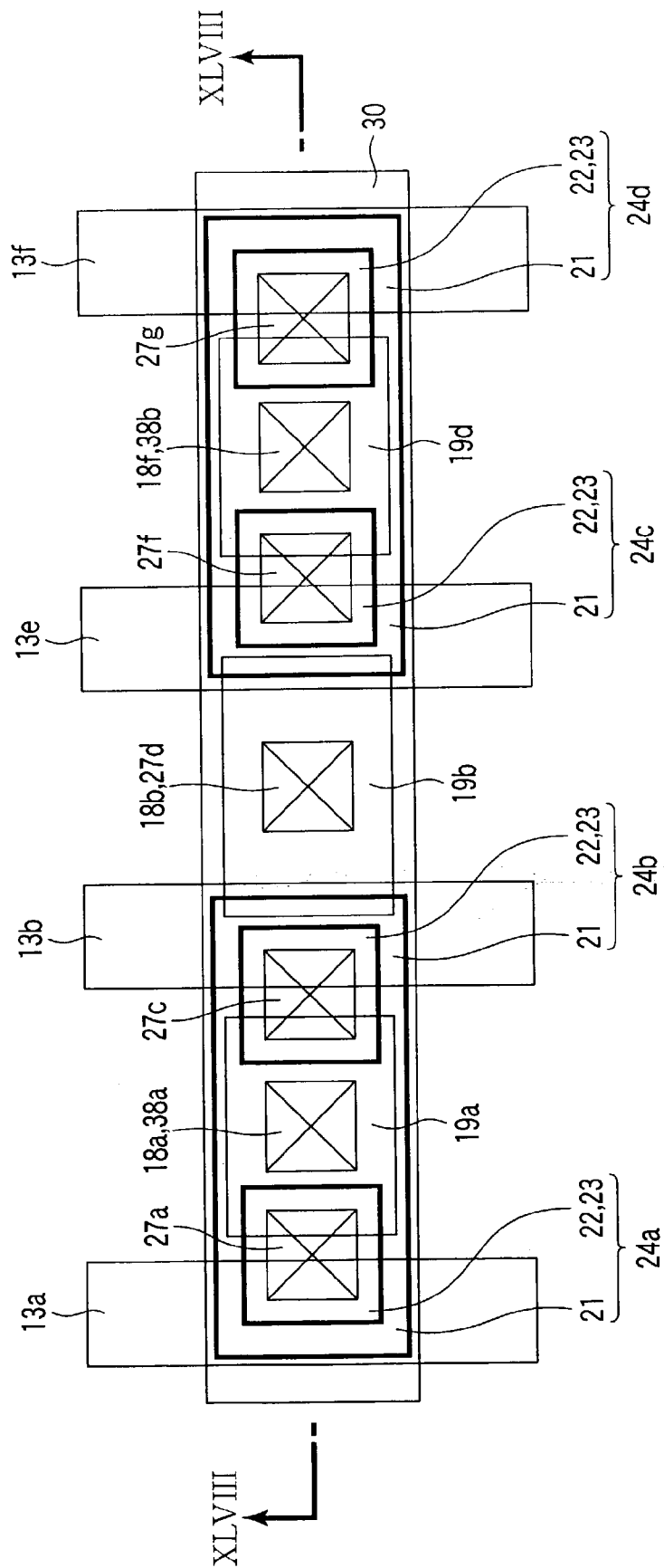
FIG. 47 is a plan view showing the construction of a semiconductor memory device according to an ninth embodiment of the present invention.

FIGS. 47 and 48 are a plan view and a cross sectional view, respectively, showing the construction of a semiconductor memory device according to the ninth embodiment of the present invention. The construction of the semiconductor memory device according to the ninth embodiment will now be described. Incidentally, that portion alone of the ninth embodiment which differs from the eighth embodiment will be described in the following.

As shown in FIGS. 47 and 48, the ninth embodiment differs from the eighth embodiment in that, in the ninth embodiment, the insulating oxygen barrier film 30 has a flat surface free from an irregularity. It should be noted in this connection that, since the conductive oxygen barrier films 19a, 19b, 19d are buried in an insulating film, the upper surfaces of the conductive oxygen barrier films 19a, 19b, 19d are rendered flush with the upper surface of the surrounding insulating film, with the result that the conductive oxygen barrier films 19a, 19b, 19d are allowed to have a so-called "damascene structure". It follows that the insulating oxygen barrier film 30 is rendered to have a flat surface, as pointed out above.

According to the ninth embodiment of the present invention, it is possible to obtain the effects similar to those obtained in the eighth embodiment. In addition, by forming the insulating oxygen barrier film 30 on the conductive oxygen barrier films 19a, 19b, 19d of the damascene structure, it is possible to suppress the reduction in the oxygen barrier effect caused by the step coverage of the insulating oxygen barrier film 30.

Incidentally, it is possible to form the insulating oxygen barrier films 30 in contact with both the upper surfaces and the lower surfaces of the conductive oxygen barrier films 19a, 19b and 19d.

TENTH EMBODIMENT

A tenth embodiment of the present invention is directed to a modification of the eighth embodiment described previously and covers an example in which a side wall insulating film is formed on the side surface of a ferroelectric capacitor so as to permit the ferroelectric capacitor to be electrically connected to the conductive oxygen barrier film via a single contact.

Figure 49:
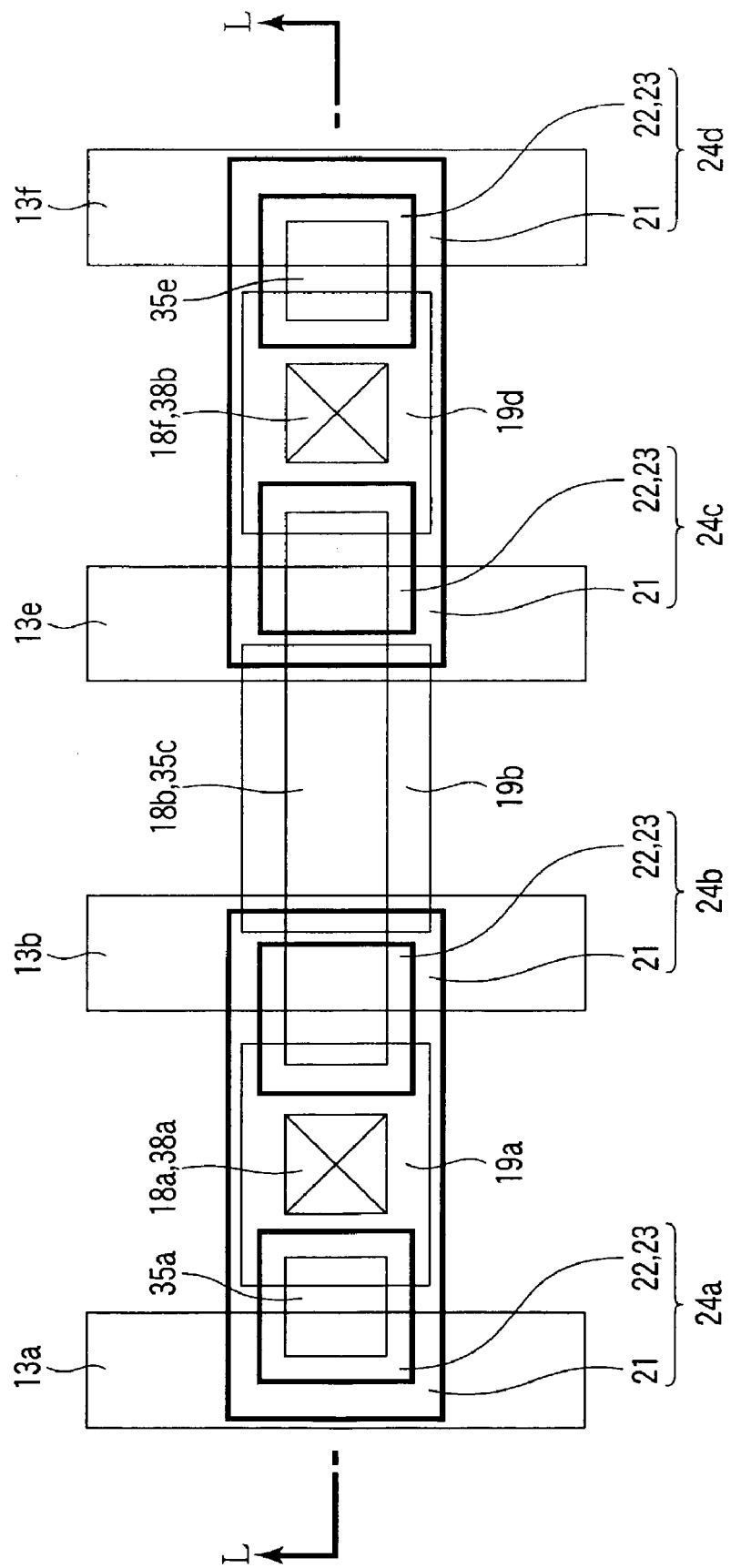
FIG. 49 is a plan view showing the construction of a semiconductor memory device according to an tenth embodiment of the present invention.
Figure 50:
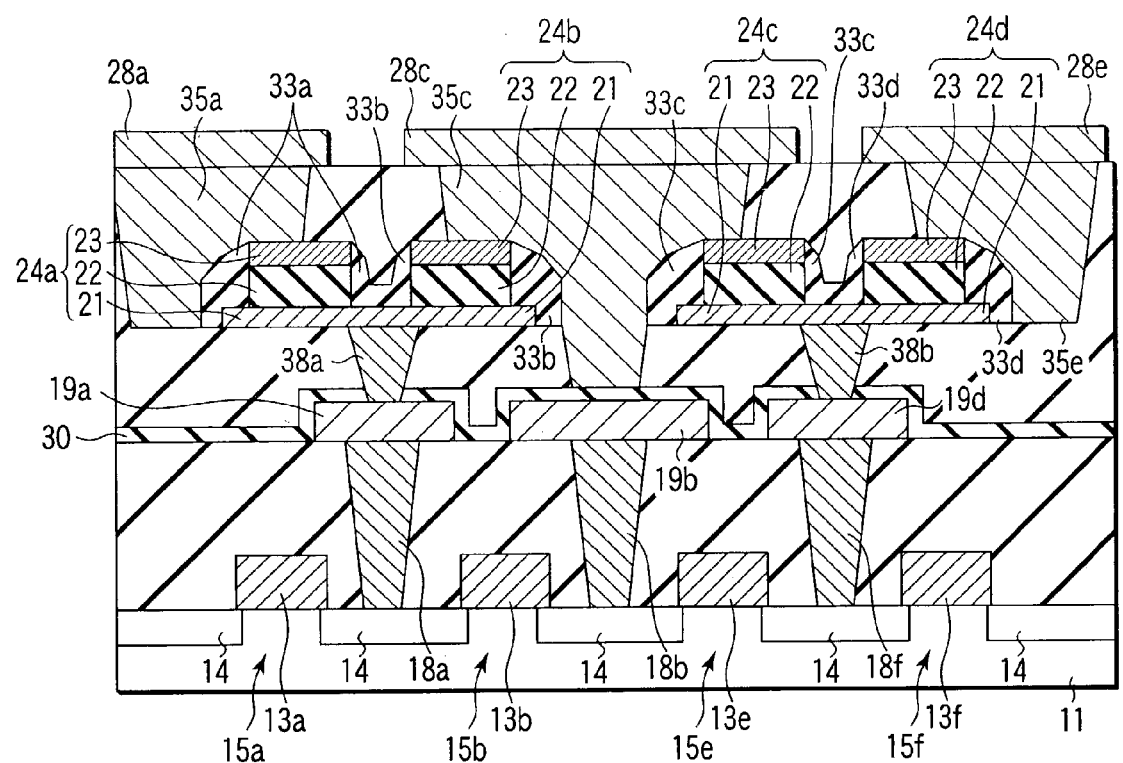
FIG. 50 is a cross sectional view of the semiconductor memory device along the line L—L shown in FIG. 49.

FIGS. 49 and 50 are a plan view and a cross sectional view, respectively, showing the construction of a semiconductor memory device according to the tenth embodiment of the present invention. The construction of the semiconductor memory device according to the tenth embodiment will now be described. Incidentally, that portion alone of the tenth embodiment which differs from the eighth embodiment will be described in the following.

As shown in FIGS. 49 and 50, the tenth embodiment differs from the eighth embodiment in that, in the tenth embodiment, side wall insulating films 33a, 33b, 33c, 33d are formed on the side walls of the ferroelectric capacitors 24a, 24b, 24c, 24d. It suffices for each of the side wall insulating films 33a, 33b, 33c, 33d to be formed of an insulating material having a selectivity ratio of the processing relative to an oxide film. For example, each of the side wall insulating films 33a, 33b, 33c, 33d is formed of a material containing one of $Al_2O_3$, SiN, SiON, PZT and $TiO_2$. It should be noted that one of the side wall insulating film 33b and one of the side wall insulating film 33c facing the side wall insulating film 33b collectively define the width of the opening of the contact 35c and serve to insulate the contact 35c from the lower electrode 21.

The tenth embodiment also differs from the eighth embodiment in that, in the tenth embodiment, the single contact 35c is substituted for the contacts 27c, 27d and 27f shown in FIG. 46 in conjunction with eighth embodiment of the present invention. What should be noted is that the contacts 35a, 35c and 35e are formed in self-alignment with side wall insulating films 33a, 33b.

According to the tenth embodiment of the present invention, it is possible to obtain the effects similar to those obtained in the eighth embodiment described previously.

In addition, since the side wall insulating films 33a, 33b, 33c, 33d are formed on the side surfaces of ferroelectric capacitors 24a, 24b, 24c, 24d, it is possible to form the contacts 35a, 35c, 35e in self-alignment. As a result, the deviation in alignment of the contact layer by lithography can be neglected so as to miniaturize the ferroelectric capacitor circuit portion.

Also, since the side wall insulating films 33a, 33b, 33c, 33d are formed on the side surfaces of ferroelectric capacitors 24a, 24b, 24c, 24d, it is possible to permit the upper electrode 23 to be connected to the conductive oxygen barrier film 19a via a single contact 35c so as to achieve a cost saving.

Further, since the side wall insulating films 33a, 33b, 33c, 33d are formed on the side surfaces of ferroelectric capacitors 24a, 24b, 24c, 24d, it is possible to form the contacts 35a, 35c, 35e in self-alignment with the side wall insulating films 33a, 33b, 33c, 33d so as to diminish the cell size.

ELEVENTH EMBODIMENT

An eleventh embodiment of the present invention is directed a modification of the fifth embodiment described previously and covers an example in which the lower electrode shared by the two ferroelectric capacitors in the fifth embodiment is divided such that the divided sections of the lower electrodes are included in the individual ferroelectric capacitors.

Figure 52:
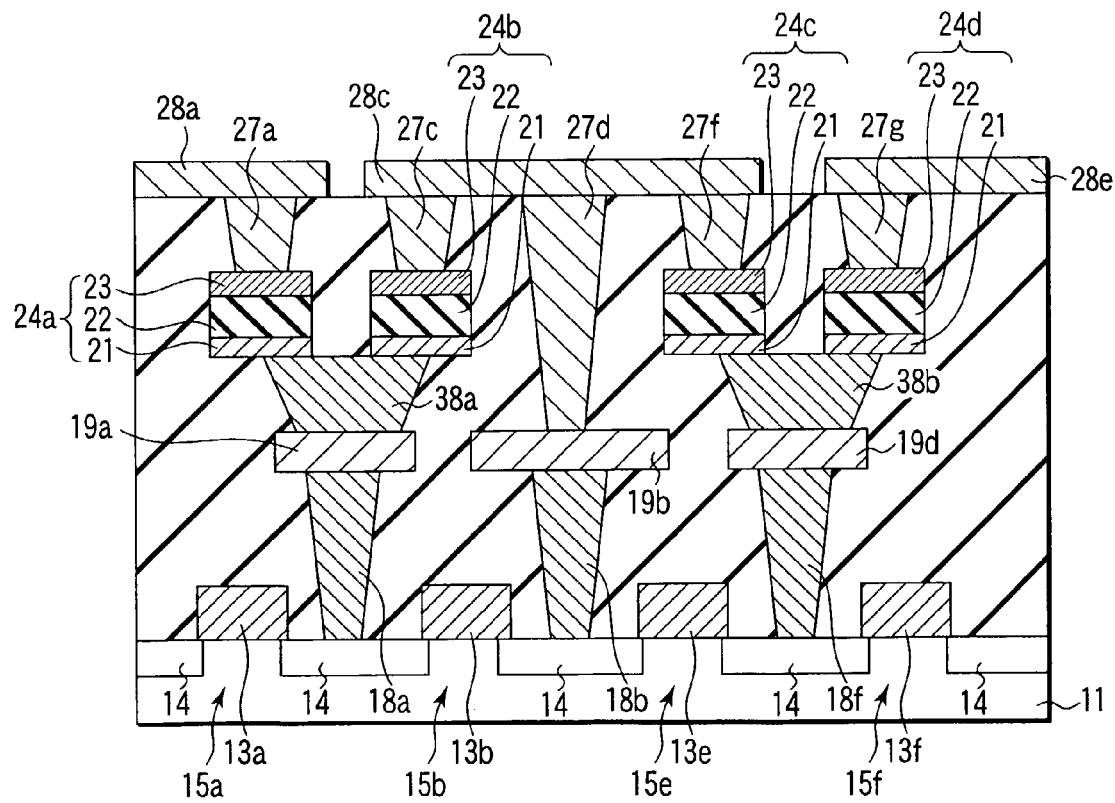
FIG. 52 is a cross sectional view of the semiconductor memory device along the line LII—LII shown in FIG. 51.
Figure 51:
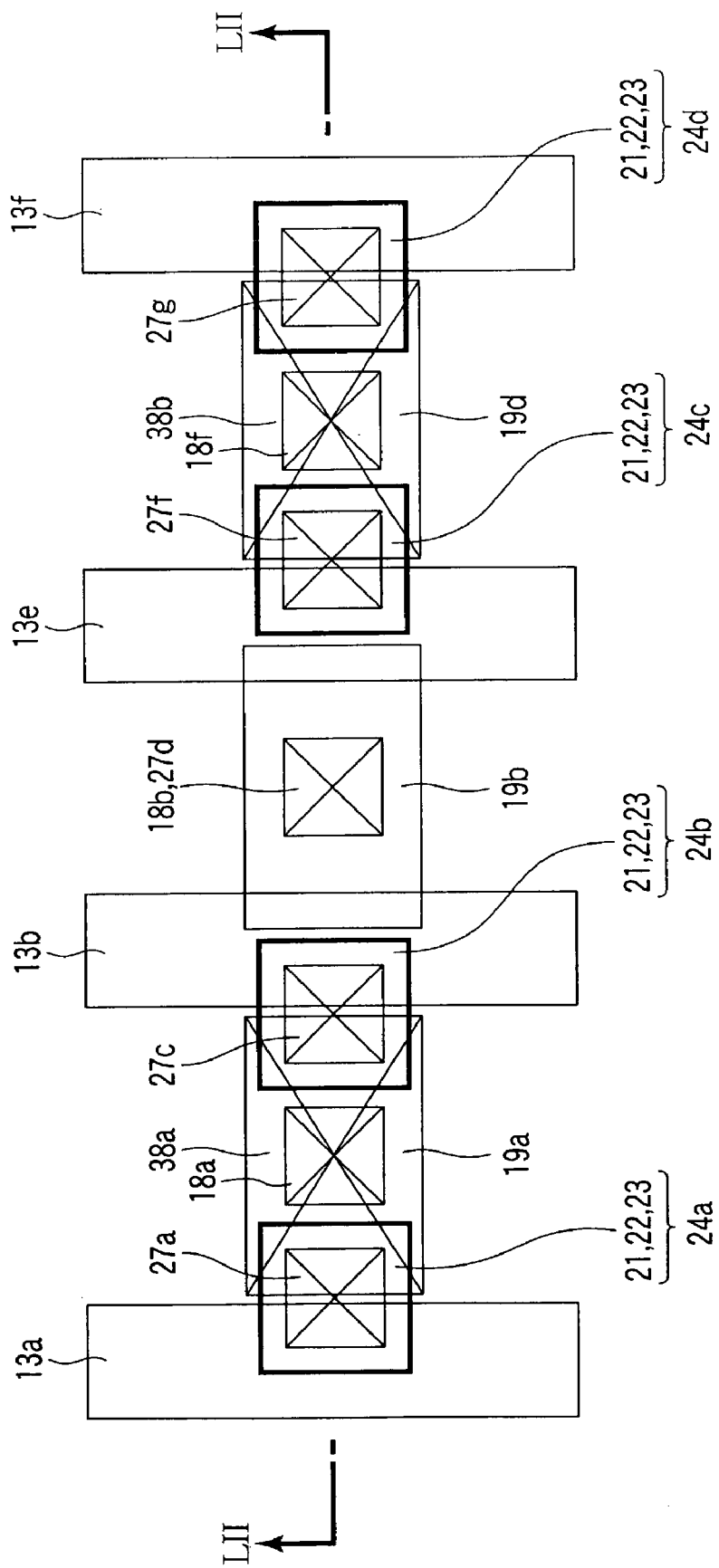
FIG. 51 is a plan view showing the construction of a semiconductor memory device according to an eleventh embodiment of the present invention.

FIGS. 51 and 52 are a plan view and a cross sectional view, respectively, showing the construction of a semiconductor memory device according to the eleventh embodiment of the present invention. The construction of the semiconductor memory device according to the eleventh embodiment will now be described. Incidentally, that portion alone of the eleventh embodiment which differs from the fifth embodiment will be described in the following.

As shown in FIGS. 51 and 52, the eleventh embodiment differs from the fifth embodiment in that, in the eleventh embodiment, the lower electrode 21 is divided such that the divided sections of the lower electrode 21 are included in the ferroelectric capacitors 24a, 24b, 24c and 24d, respectively. It should be noted that the lower electrode 21 is patterned simultaneously with the patterning of the upper electrode 23 and the ferroelectric film 22. It follows that the lower electrode 21, the ferroelectric film 22 and the upper electrode 23 are equal to each other in the planar shape.

The eleventh embodiment also differs from the fifth embodiment in that, in the eleventh embodiment, the two independent ferroelectric capacitors 24a and 24b are electrically connected to each other via the contact 38a, and the two independent ferroelectric capacitors 24c and 24d are electrically connected to each other via the contact 38c. Each of the contacts 38a and 38c is formed of a material that does not lose its electrical conductivity even under an oxidizing atmosphere. For example, each of the contacts 38a and 38c is formed of a material containing one of Pt, Ir, $IrO_2$, Ru, $RuO_2$ and SRO.

Figure 53:
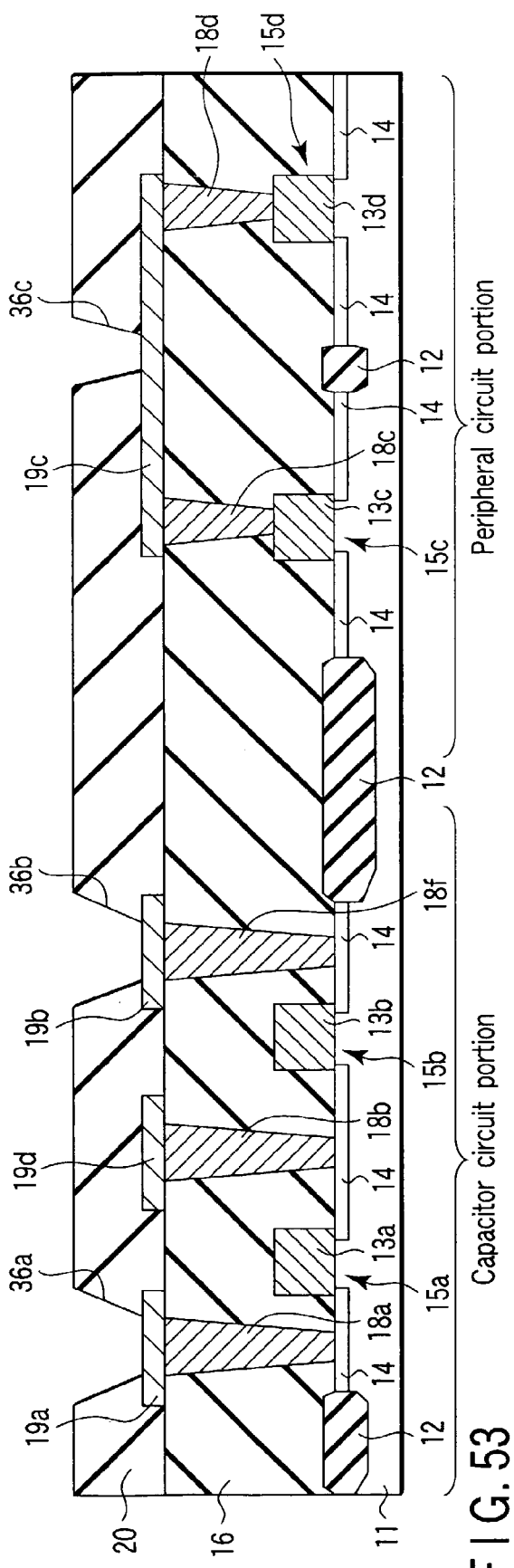
Figure 54:
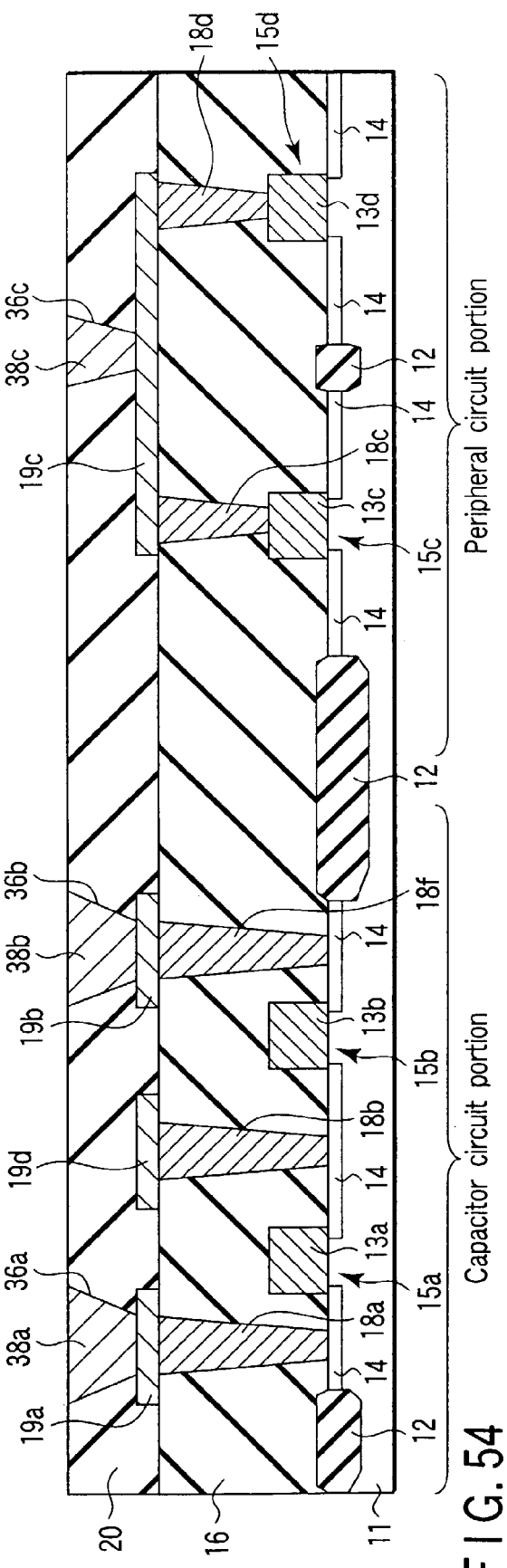

FIGS. 53 to 55 are cross sectional views collectively showing a manufacturing process of the semiconductor memory device according to the eleventh embodiment of the present invention. The manufacturing process of the semiconductor memory device according to the eleventh embodiment of the present invention will now be described. Incidentally, those steps of the eleventh embodiment which differ from the steps in the first embodiment will be mainly described in the following.

In the first step, the conductive oxygen barrier films 19a, 19b, 19c, 19d are formed on the interlayer insulating film 16 as shown in FIGS. 4 to 7 referred to previously in conjunction with the first embodiment.

In the next step, an interlayer insulating film 20 is formed to cover the conductive oxygen barrier films 19a, 19b, 19c, 19d and the interlayer insulating film 16, followed by selectively removing the interlayer insulating film 20 so as to form trenches 36a, 36b, 36c, as shown in FIG. 53. Then, a metal film is buried in each of these trenches 36a, 36b, 36c so as to form contacts 38a, 38b, 38c, as shown in FIG. 54.

In the next step, a lower electrode 41, a ferroelectric film 42 and an upper electrode 43 are formed successively on each of the contacts 38a, 38b, 38c and the interlayer insulating film 20, as shown in FIG. 55, followed by collectively patterning the lower electrode 41, the ferroelectric film 42 and the upper electrode 43 by means of a RIE treatment so as to form ferroelectric capacitors 24a, 24b, 24c and 24d.

According to the eleventh embodiment of the present invention, it is possible to obtain the effects similar to those obtained by the fifth embodiment described previously. Further, an additional effect can also be obtained as follows.

Specifically, in the conventional structure, formed are two ferroelectric capacitors including the lower electrodes 21 electrically connected to each other. As a result, it is necessary to process the upper electrode 23 and the lower electrode 21 separately. It follows that it is necessary to carry out the lithography step twice, i.e., to carry out the lithography step in the processing step of each of the upper electrode and the lower electrode. In the eleventh embodiment of the present invention, however, the two capacitors are electrically connected to each other via a contact, with the result that it is possible to process collectively the upper electrode 23, the ferroelectric film 22 and the lower electrode 21. It follows that it is possible to omit one of the lithography steps required for forming the capacitor. Naturally, the manufacturing process is simplified so as to achieve a cost saving.

It should also be noted that, in the eleventh embodiment of the present invention, the lower electrode 21 of each of the ferroelectric capacitors 24a, 24b, 24c, 24d is equal in the planar shape to the upper electrode 23 and the ferroelectric film 22. As a result, it is possible to decrease the area occupied by the ferroelectric capacitors 24a, 24b, 24c, 24d, compared with the case where the lower electrode 21 is shared by two ferroelectric capacitors. It follows that it is possible to miniaturize the cell portion.

TWELFTH EMBODIMENT

A twelfth embodiment of the present invention is directed to a modification of the eleventh embodiment described above and covers an example in which the contact serving to electrically connect the upper electrode of the ferroelectric capacitor to the conductive oxygen barrier film is of two-stage structure so as to diminish the aspect ratio of the contact.

Figure 57:
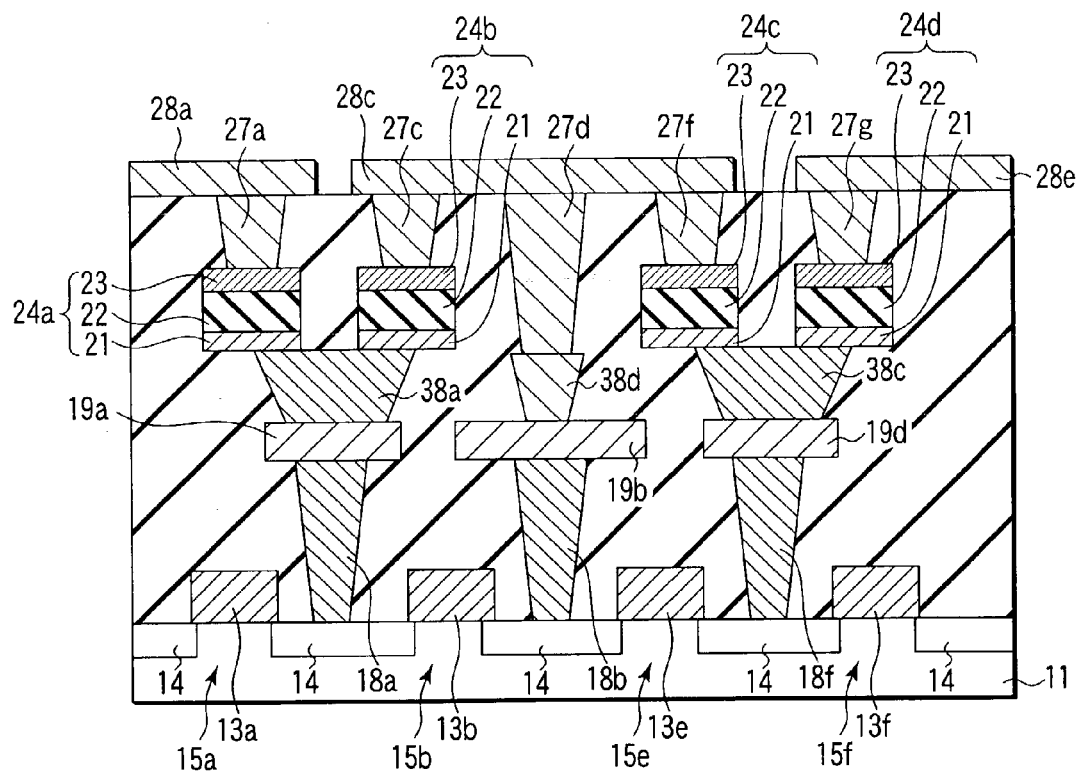
FIG. 57 is a cross sectional view of the semiconductor memory device along the line LVII—LVII shown in FIG. 56.

FIGS. 56 and 57 are a plan view and a cross sectional view, respectively, showing the construction of a semiconductor memory device according to the twelfth embodiment of the present invention. The construction of the semiconductor memory device according to the twelfth embodiment will now be described. Incidentally, that construction alone of the twelfth embodiment which differs from the eleventh embodiment will be described in the following.

As shown in FIGS. 56 and 57, the twelfth embodiment differs from the eleventh embodiment in that, in the twelfth embodiment, the contact 27d is not connected directly to the conductive oxygen barrier film 19b but is connected to the conductive oxygen barrier film 19b with the contact 38d interposed therebetween. Since the contact 38d is formed simultaneously with formation of the contacts 38a, 38c, the contact 38d is formed of the material equal to that used for forming the contacts 38a, 38c. Naturally, the contact 38d is formed of a material that does not lose its electrical conductivity even under an oxidizing atmosphere like the contacts 38a, 38c. For example, the contact 38d is formed of a material containing one of Pt, Ir, IrO$_2$, Ru, RuO$_2$ and SRO.

According to the twelfth embodiment of the present invention, it is possible to obtain the effects similar to those obtained in the eleventh embodiment. In addition, since it is possible to make smaller the aspect ratio of the contact 27d in the twelfth embodiment, compared with the eleventh embodiment, it is possible to suppress the defective situation in the buried state of the contact material.

THIRTEENTH EMBODIMENT

A thirteenth embodiment of the present invention is directed to a modification of the eleventh embodiment, and covers an example in which the lower electrode of the ferroelectric capacitor is connected to the conductive oxygen barrier film via a local wiring in place of the contact.

Figure 59:
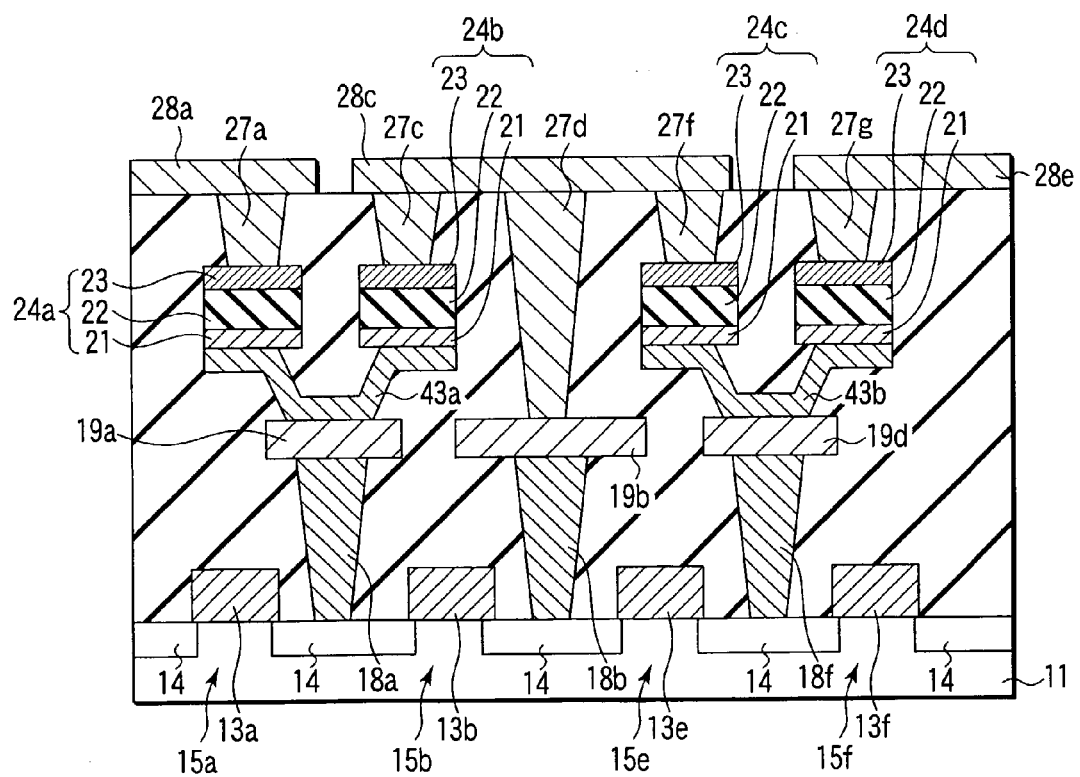
FIG. 59 is a cross sectional view of the semiconductor memory device along the line LIX—LIX shown in FIG. 58.

FIGS. 58 and 59 are a plan view and a cross sectional view, respectively, showing the construction of a semiconductor memory device according to a thirteenth embodiment of the present invention. The construction of the semiconductor memory device according to the thirteenth embodiment will now be described. Incidentally, that portion alone of the thirteenth embodiment which differs from the eleventh embodiment will be described in the following.

As shown in FIGS. 58 and 59, the thirteenth embodiment differs from the eleventh embodiment in that, in the thirteenth embodiment, the local wirings 43a, 43b are formed in place of the contacts 38a, 38c. Each of the local wirings 43a, 43b is formed of a material that does not lose its electrical conductivity even under an oxidizing atmosphere. For example, each of the local wirings 43a, 43b is formed of a material containing one of Pr, Ir, IrO$_2$, Ru, RuO$_2$ and SRO.

One side surface of the local wiring 43a coincides with one side surface of the lower electrode 21 of the capacitor 24a, and the other side surface of the local wiring 43a coincides with one side surface of the lower electrode 21 of the capacitor 24b. Likewise, one side surface of the local wiring 43b coincides with one side surface of the lower electrode 21 of the capacitor 24c, and the other side surface of the local wiring 43b coincides with one side surface of the lower electrode 21 of the capacitor 24d. Further, the central portion of the local wiring 43a is recessed, compared with the both end portions, and is brought into contact with the conductive oxygen barrier film 19a. Likewise, the central portion of the local wiring 43b is recessed, compared with the both end portions, and is brought into contact with the conductive oxygen barrier film 19d.

According to the thirteenth embodiment of the present invention, it is possible to obtain the effects similar to those obtained in the eleventh embodiment of the present invention. In addition, the burying process of a material and the planarizing process, which are required for forming the contacts 38a, 38b, are not required for forming the local wirings 43a, 43b. In other words, the local wirings 43a, 43b can be formed easily by a sputtering process and a RIE process. It follows that it is possible to suppress the process cost, compared with the eleventh embodiment of the present invention described previously.

FOURTEENTH EMBODIMENT

A fourteenth embodiment of the present invention is directed to a modification of the eleventh embodiment described previously and covers an example in which an insulating oxygen barrier film is formed together with the conductive oxygen barrier film.

Figure 60:
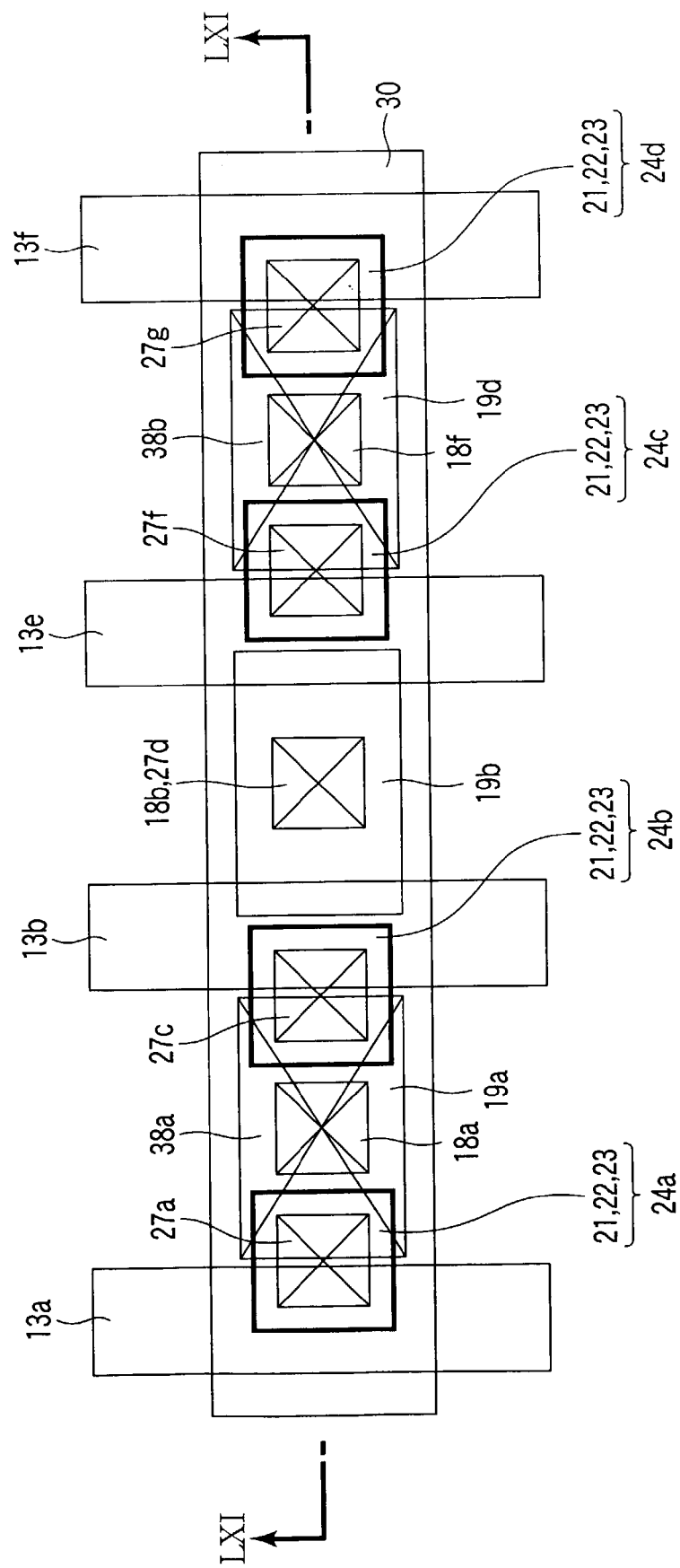
FIG. 60 is a plan view showing the construction of a semiconductor memory device according to a fourteenth embodiment of the present invention.
Figure 61:
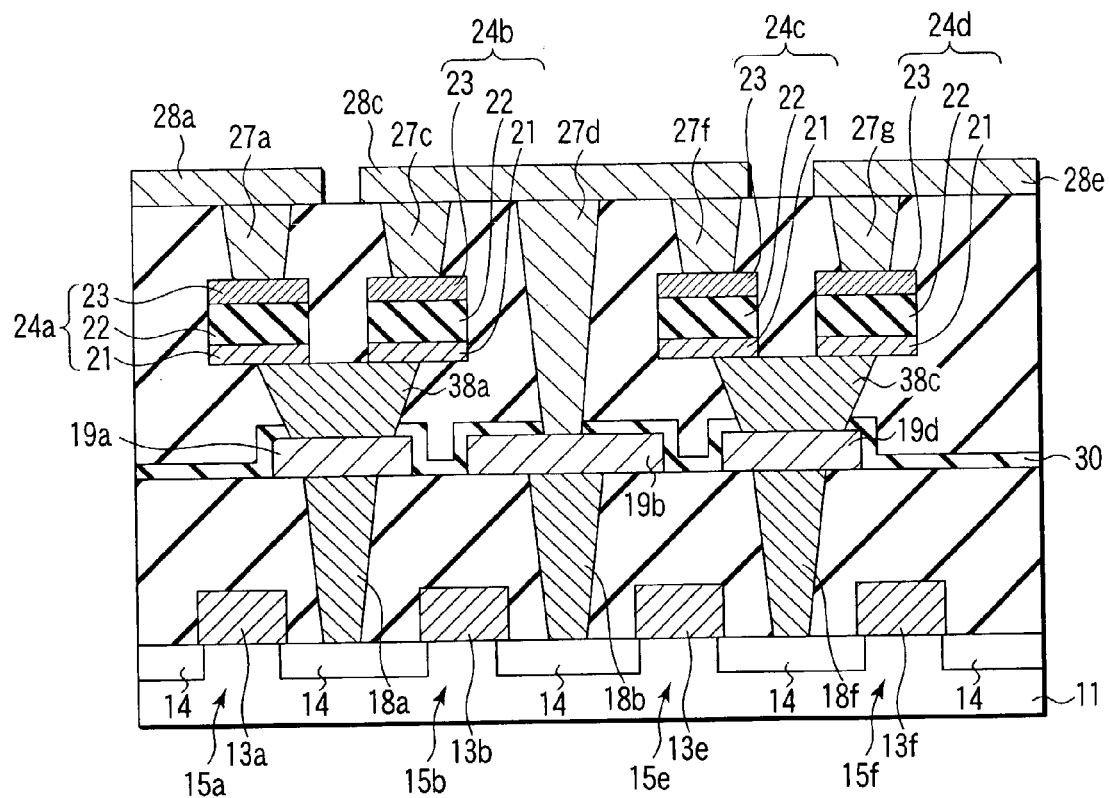
FIG. 61 is a cross sectional view of the semiconductor memory device along the line LXI—LXI shown in FIG. 60.

FIGS. 60 and 61 are a plan view and a cross sectional view, respectively, showing the construction of a semiconductor memory device according to the fourteenth embodiment of the present invention. The construction of the semiconductor memory device according to the fourteenth embodiment of the present invention will now be described.

Incidentally, that portion alone of the fourteenth embodiment which differs from the eleventh embodiment will be described in the following.

As shown in FIGS. 60 and 61, the fourteenth embodiment differs from the eleventh embodiment in that, in the fourteenth embodiment, an insulating oxygen barrier film 30 is deposited to cover the conductive oxygen barrier films 19*a*, 19*b*, 19*d*. The insulating oxygen barrier film 30, which is formed of, for example, a material containing one of $Al_2O_3$, SiN, SiON, $TiO_2$ and PZT, may be either a single layer structure or a laminate structure.

According to the fourteenth embodiment of the present invention, it is possible to obtain the effects similar to those obtained in the eleventh embodiment of the present invention. In addition, it is possible to protect sufficiently the contacts 18*a*, 18*b*, 18*f*, which tend to be oxidized easily, from the high temperature annealing treatment because the insulating oxygen barrier film 30 is formed to cover the conductive oxygen barrier films 19*a*, 19*b*, 19*d*.

FIFTEENTH EMBODIMENT

A fifteenth embodiment of the present invention is directed to a modification of the eleventh embodiment and covers an example in which the conductive oxygen barrier film is of a damascene structure.

Figure 63:
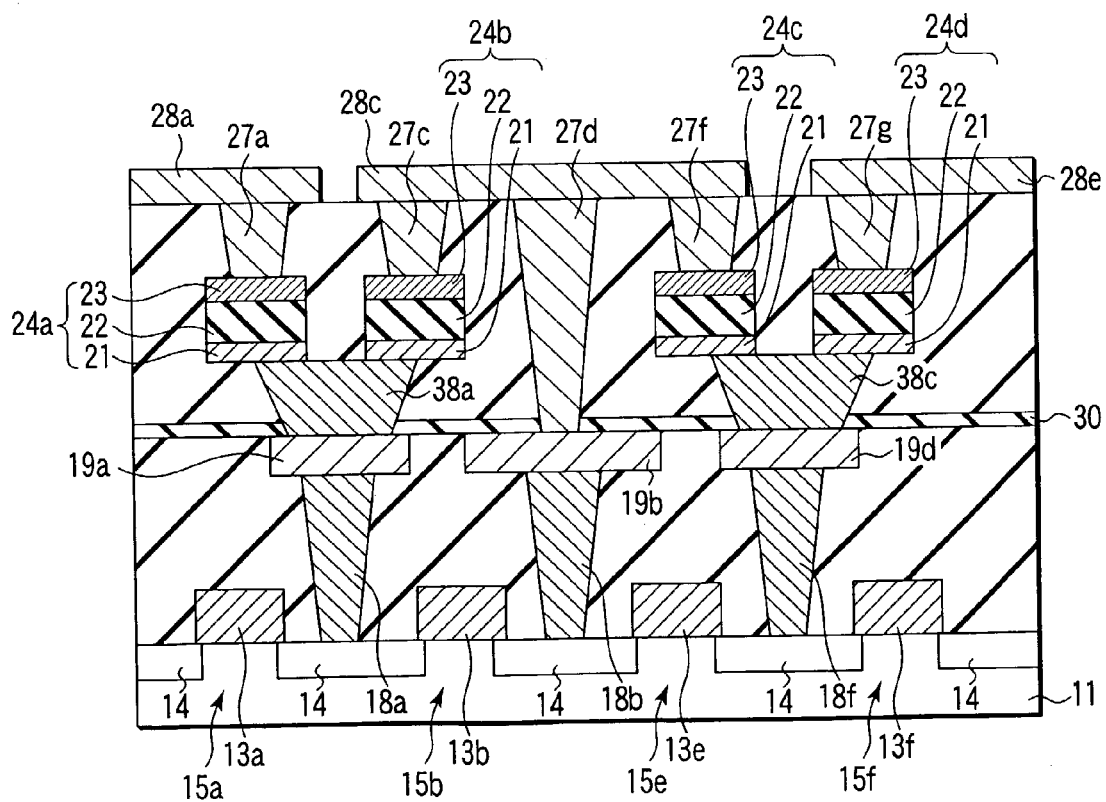
FIG. 63 is a cross sectional view of the semiconductor memory device along the line LXII—LXII shown in FIG. 62.
Figure 62:
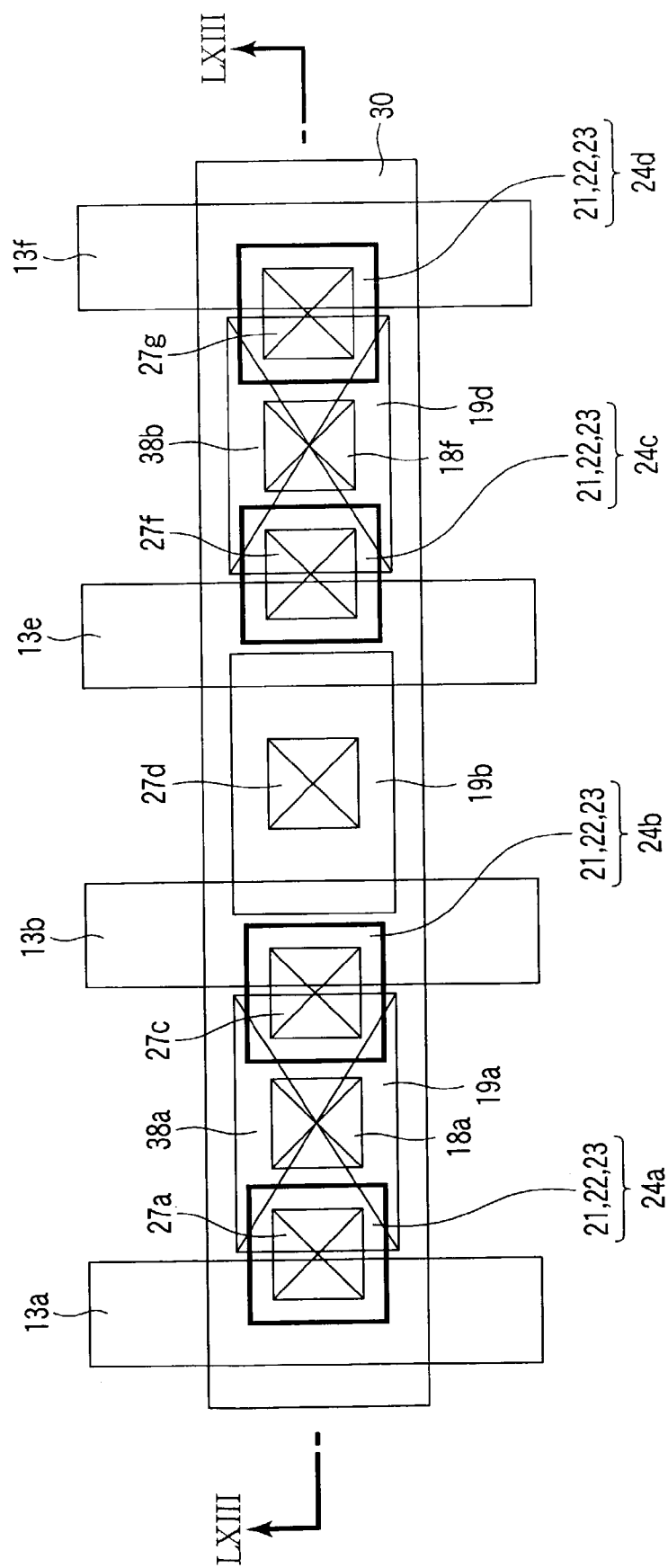
FIG. 62 is a plan view showing the construction of a semiconductor memory device according to a fifteenth embodiment of the present invention.

FIGS. 62 and 63 are a plan view and a cross sectional view, respectively, showing the construction of the semiconductor memory device according to the fifteenth embodiment of the present invention. The construction of the semiconductor memory device according to the fifteenth embodiment will now be described. Incidentally, that portion alone of the fifteenth embodiment which differs from the eleventh embodiment will be described in the following.

As shown in FIGS. 62 and 63, the fifteenth embodiment differs from the eleventh embodiment in that, in the fifteenth embodiment, the insulating oxygen barrier film 30 has a flat surface free from irregularities. It should be noted in this connection that, since the conductive oxygen barrier films 19*a*, 19*b*, 19*d* are buried in an insulating film, the upper surfaces of the conductive oxygen barrier films 19*a*, 19*b*, 19*d* are rendered flush with the upper surface of the surrounding insulating film, with the result that the conductive oxygen barrier films 19*a*, 19*b*, 19*d* are allowed to have a so-called "damascene structure". It follows that the insulating oxygen barrier film 30 is rendered to have a flat surface, as pointed out above.

According to the fifteenth embodiment of the present invention, it is possible to obtain the effects similar to those obtained in the eleventh embodiment. In addition, by forming the insulating oxygen barrier film 30 on the conductive oxygen barrier films 19*a*, 19*b*, 19*d* of the damascene structure, it is possible to suppress the reduction in the oxygen barrier effect caused by the step coverage of the insulating oxygen barrier film 30.

Incidentally, it is possible to form the insulating oxygen barrier film 30 above or below the conductive oxygen barrier films 19*a*, 19*b*, 19*d*.

SIXTEENTH EMBODIMENT

A sixteenth embodiment of the present invention is directed to a modification of the eleventh embodiment and covers an example in which a side wall insulating film is formed on the side surface of the ferroelectric capacitor so as to permit the ferroelectric capacitor and the conductive oxygen barrier film to be connected to each other via a single contact.

Figure 64:
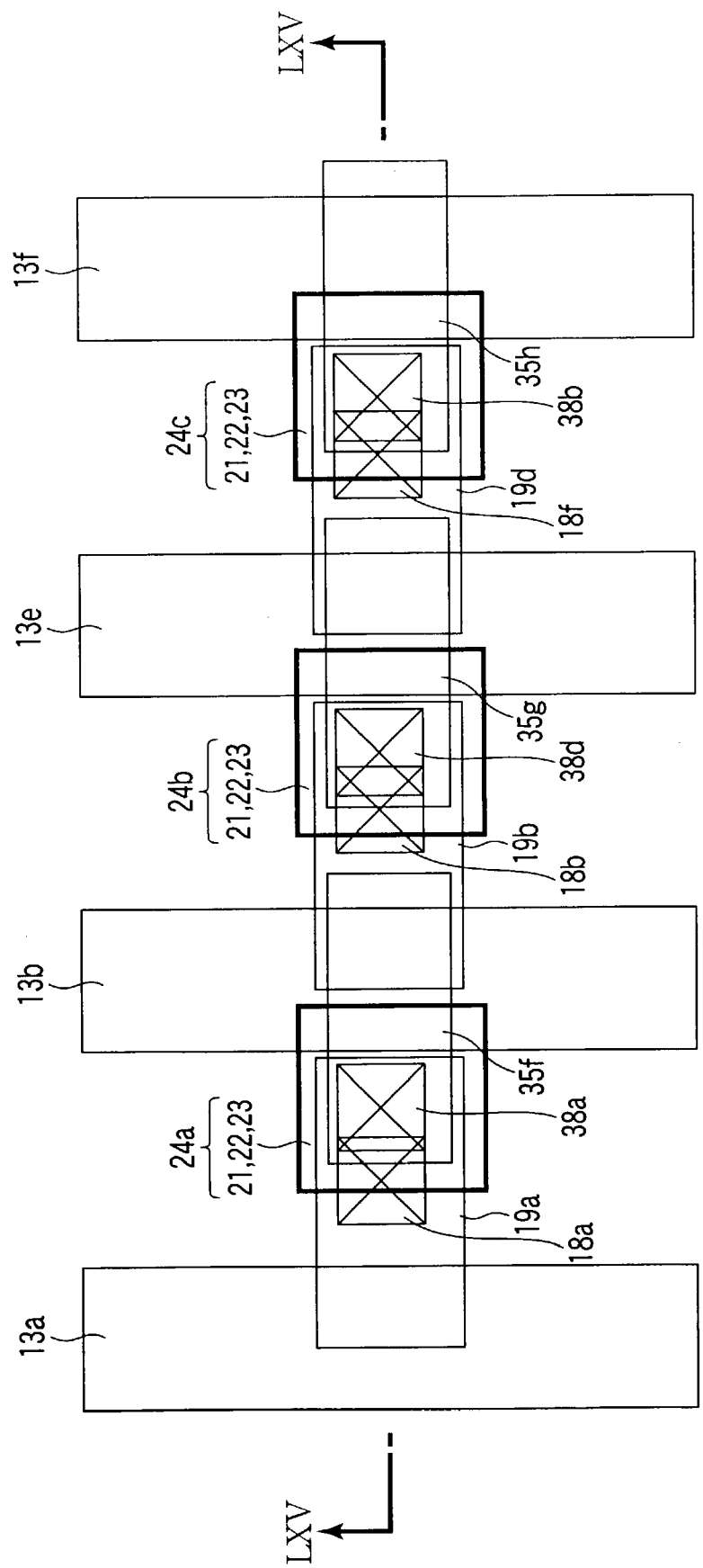
FIG. 64 is a plan view showing the construction of a semiconductor memory device according to a sixteenth embodiment of the present invention.
Figure 65:
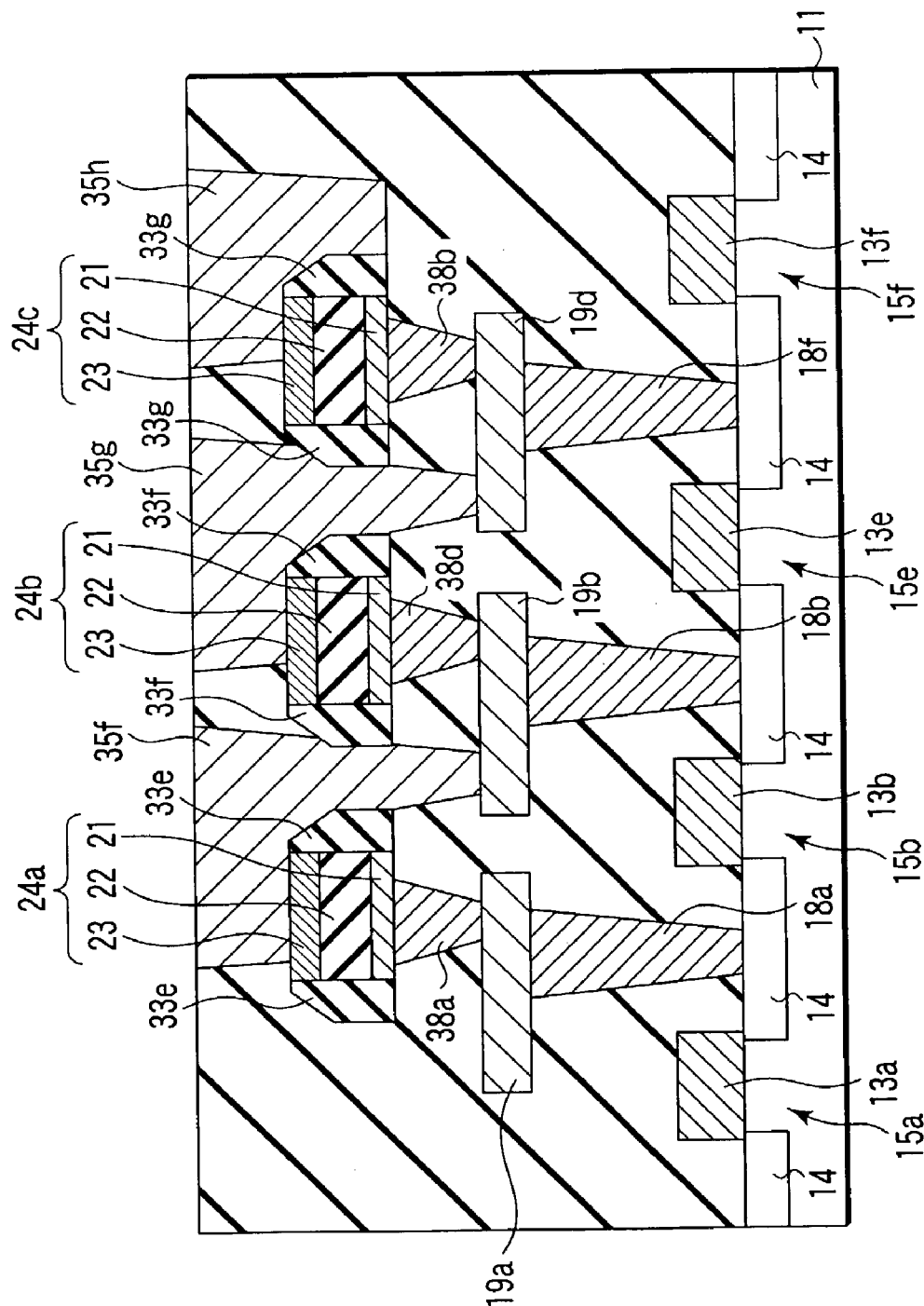
FIG. 65 is a cross sectional view of the semiconductor memory device along the line LXV—LXV shown in FIG. 64.

FIGS. 64 and 65 are a plan view and a cross sectional view collectively directed to a semiconductor memory device according to a sixteenth embodiment of the present invention. The construction of the semiconductor memory device according to the sixteenth embodiment of the present invention will now be described. Incidentally, that portion alone of the sixteenth embodiment which differs from the eleventh embodiment will be described in the following.

As shown in FIGS. 64 and 65, the sixteenth embodiment differs from the eleventh embodiment in that, in the sixteenth embodiment, side wall insulating films 33*e*, 33*f*, 33*g* are formed on the side surfaces of the ferroelectric capacitors 24*a*, 24*b*, 24*c*, respectively. It suffices for each of these side wall insulating films 33*e*, 33*f*, 33*g* to be formed of an insulating material having a processing selectivity ratio relative to an oxide film. For example, each of the side wall insulating films 33*e*, 33*f*, 33*g* is formed of a material containing one of $Al_2O_3$, SiN, SiON, PZT and $TiO_2$. It should be noted that one of the side wall insulating film 33*e* and one of the side wall insulating film 33*f* collectively define the width of the opening for forming the contact 35*f*, and the other side wall insulating film 33*f* and one of the side wall insulating films 33*g* noted above collectively define the width of the opening for forming the contact 35*g*.

The sixteenth embodiment also differs from the eleventh embodiment in that, in the sixteenth embodiment, the contact 35*f* permits the upper electrode 23 of the ferroelectric capacitor 24*a* to be electrically connected to the conductive oxygen barrier film 19*b*, and the contact 35*g* permits the upper electrode 23 of the ferroelectric capacitor 24*b* to be electrically connected to the conductive oxygen barrier film 19*d*. In other words, the upper electrode 23 of an optional ferroelectric capacitor is electrically connected to the lower electrode 21 of the adjacent ferroelectric capacitor. In this case, the contact 35*f* is formed in self-alignment with the side wall insulating films 33*e*, 33*f*, and the contact 35*g* is formed in self-alignment with the side wall insulating films 33*f*, 33*g*.

The sixteenth embodiment of the present invention permits producing the effects similar to those obtained in the eleventh embodiment.

In addition, since the side wall insulating films 33*e*, 33*f*, 33*g* are formed on the side surfaces of the ferroelectric capacitors 24*a*, 24*b*, 24*c*, respectively, it is possible to form the contacts 35*f*, 35*g*, 35*h* in self-alignment. As a result, the deviation in alignment of the contact layer by lithography can be neglected so as to miniaturize the ferroelectric capacitor circuit portion.

Also, since the side wall insulating films 33*e*, 33*f*, 33*g* are formed on the side surfaces of ferroelectric capacitors 24*a*, 24*b*, 24*c*, it is possible to permit the upper electrode 23 to be connected to the conductive oxygen barrier film 19*b* via a single contact 35*f*. It is also possible to permit the upper electrode 23 to be connected to the conductive oxygen barrier film 19*d* via a single contact 35*g*. It follows that it is possible to achieve a cost saving.

Further, since the side wall insulating films 33*e*, 33*f*, 33*g* are formed on the side surfaces of ferroelectric capacitors 24*a*, 24*b*, 24*c*, it is possible to form the contacts 35*f*, 35*g*, 35*h* in self-alignment with the side wall insulating films 33*e*, 33*f*, 33*g* so as to diminish the cell size.

SEVENTEENTH EMBODIMENT

A seventeenth embodiment of the present invention is directed to a modification of the eighth embodiment described previously, and covers an example in which the lower electrode of the ferroelectric capacitor and the conductive oxygen barrier film positioned below the lower electrode noted above are patterned simultaneously.

FIGS. 66 and 67 are a plan view and a cross sectional view collectively directed to a semiconductor memory device according to a seventeenth embodiment of the present invention. The construction of the semiconductor memory device according to the seventeenth embodiment of the present invention will now be described. Incidentally, that portion alone of the seventeenth embodiment which differs from the eighth embodiment will be described in the following.

As shown in FIGS. 66 and 67, the seventeenth embodiment differs from the eighth embodiment in that, in the seventeenth embodiment, the lower electrode of the ferroelectric capacitor and the conductive oxygen barrier film positioned below the lower electrode noted above are substantially equal to each other in the planar shape because the lower electrode and the conductive oxygen barrier film noted above are patterned simultaneously. In other words, the lower electrode for the ferroelectric capacitors 24*a*, 24*b* is substantially equal to the conductive oxygen barrier film 19*a* in the planar shape, and the lower electrode 21 for the ferroelectric capacitors 24*c*, 24*d* is substantially equal to the conductive oxygen barrier film 19*b* in the planar shape.

It should also be noted that the conductive oxygen barrier films 19*a*, 19*b* are required to be large enough to cover at least the upper surfaces of the contacts 18*a*, 18*f*, respectively, to permit the two ferroelectric capacitors to be arranged above these conductive oxygen barrier films 19*a*, 19*b*, respectively. On the other hand, it suffices for the conductive oxygen barrier film 19*d* to be sized large enough to cover at least the upper surface of the contact 18*b*. However, it is desirable for the conductive oxygen barrier film 19*d* to be larger than the upper surface of the contact 18*b*.

Also, a wiring layer 21', which is a part of the lower electrode 21 for the ferroelectric capacitors 24*a*, 24*b*, 24*c*, 24*d*, is formed above the contact 18*b*. The wiring layer 21' is substantially equal to the conductive oxygen barrier film 19*d* in the planar shape. Also, the wiring layer 21' is electrically connected to the conductive oxygen barrier film 19*d* with the contact 38*d* interposed therebetween.

The insulating oxygen barrier film 30 is formed to cover not only the conductive oxygen barrier films 19*a*, 19*b*, 19*d* but also the ferroelectric capacitors 24*a*, 24*b*, 24*c* and 24*d*.

FIGS. 68 to 75 are cross sectional views collectively showing a manufacturing process of a semiconductor memory device according to the seventeenth embodiment of the present invention. The manufacturing method of the semiconductor memory device according to the seventeenth embodiment of the present invention will now be described. Incidentally, that portion of the seventeenth embodiment which differs from the first embodiment will be described mainly in the following.

In the first step, contacts 18*a*, 18*b*, 18*c*, 18*d*, 18*f* are formed in the interlayer insulating film 16 as shown in FIGS. 4 to 6 referred to previously in conjunction with the first embodiment of the present invention.

Figure 68:
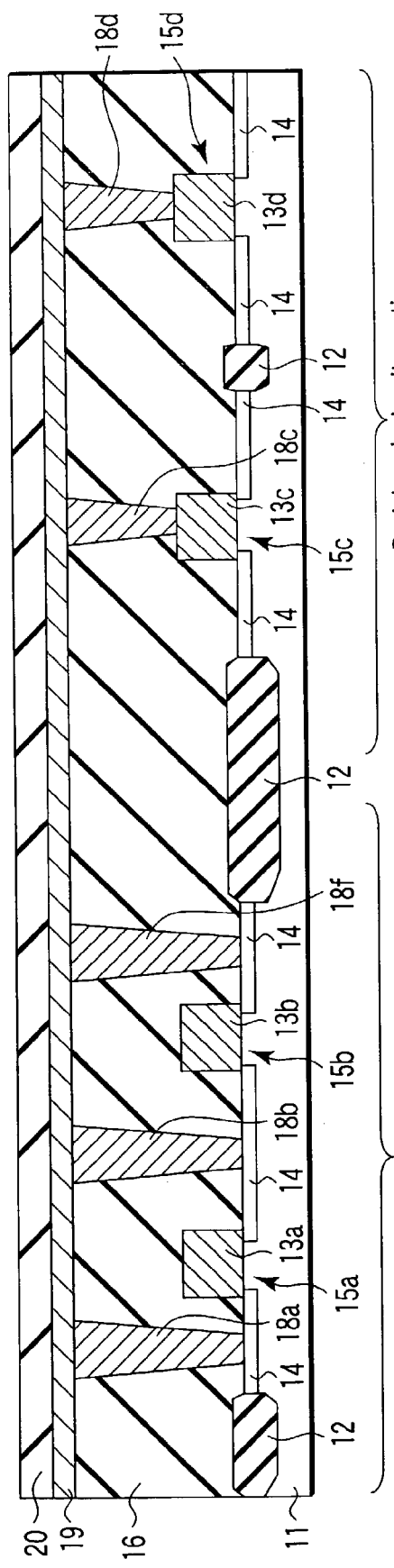
Figure 69:
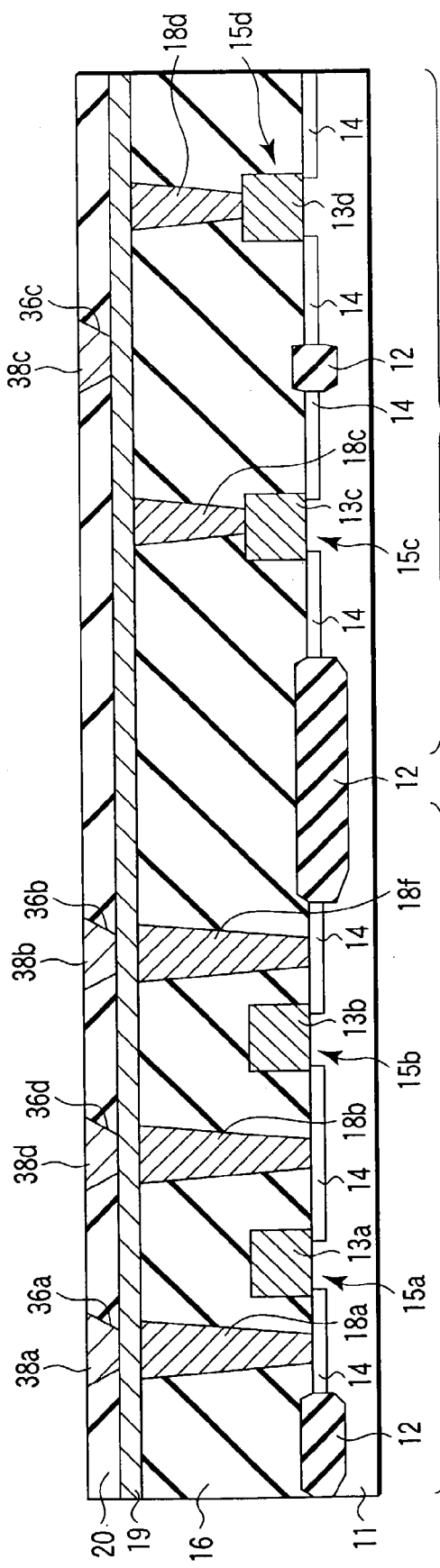

In the next step, a material layer 19 of a conductive oxygen barrier film is formed on the interlayer insulating film 16 and the contacts 18*a*, 18*b*, 18*c*, 18*d*, 18*f*, followed by forming an interlayer insulating film 20 on the material layer 19, as shown in FIG. 68. Then, the interlayer insulating film 20 is selectively removed so as to form contact holes 36*a*, 36*b*, 36*c*, 36*d*, followed by filling each of the contact holes 36*a*, 36*b*, 36*c*, 36*d* with a metallic material so as to form contacts 38*a*, 38*b*, 38*c*, 38*d*, as shown in FIG. 69.

Figure 70:
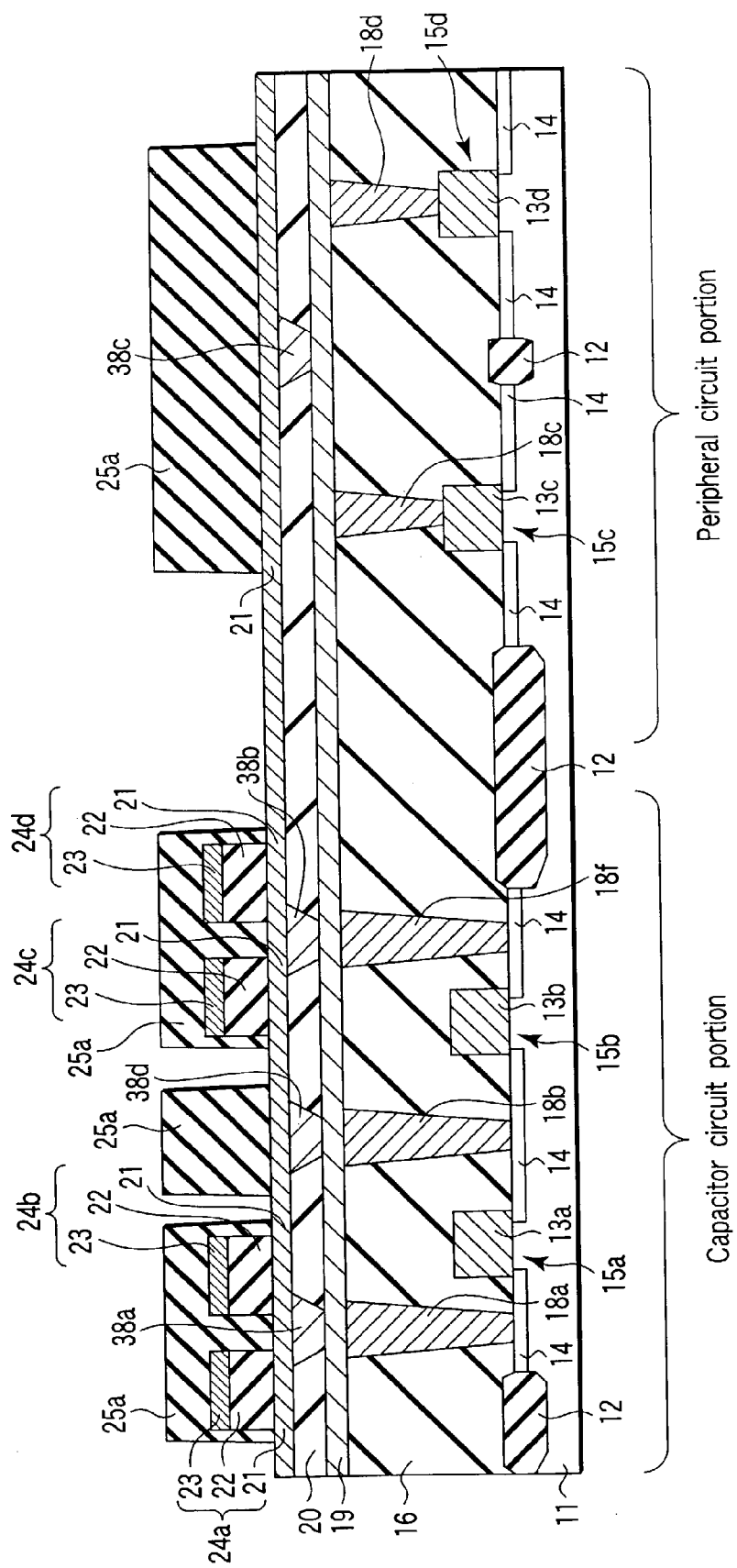

In the next step, a lower electrode 21, a ferroelectric film 22, and an upper electrode 23 are successively deposited on the contacts 38*a*, 38*b*, 38*c*, 38*d* and on the interlayer insulating film 20, as shown in FIG. 70, followed by patterning the ferroelectric film 22 and the upper electrode 23. Then, an interlayer insulating film 25*a* is formed on the upper electrode 23 and the lower electrode 21, followed by patterning the interlayer insulating film 25*a*.

Figure 71:
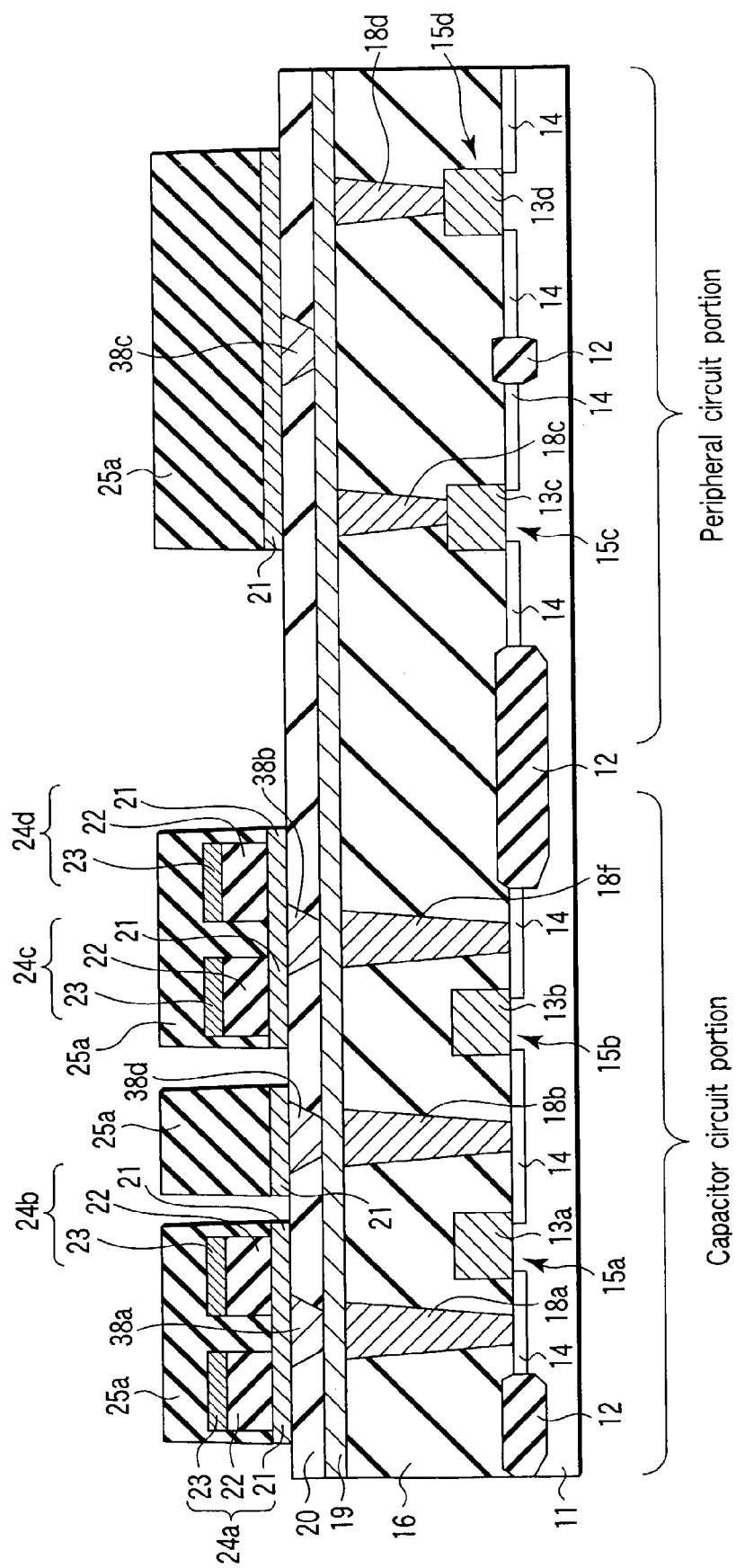
Figure 72:
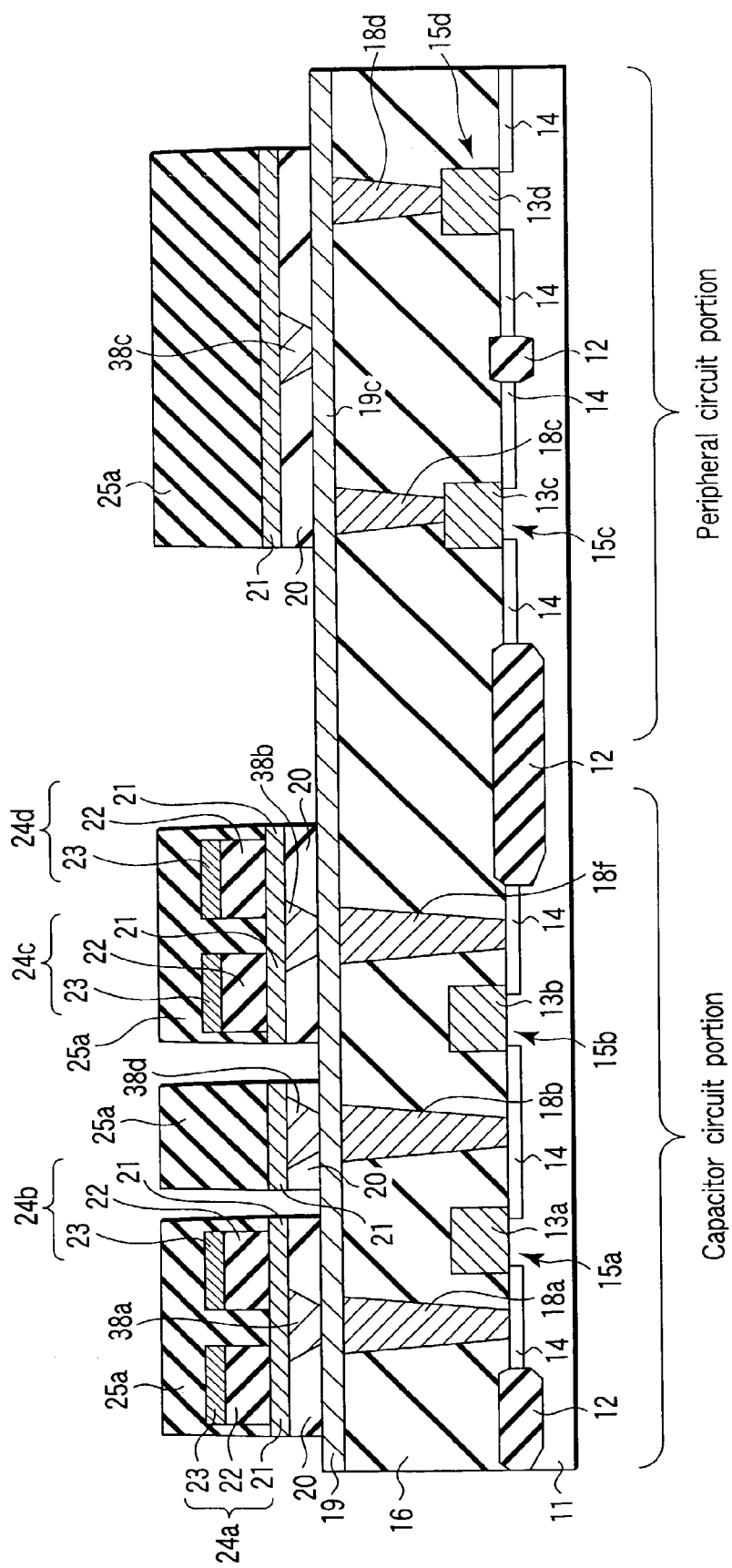
Figure 73:
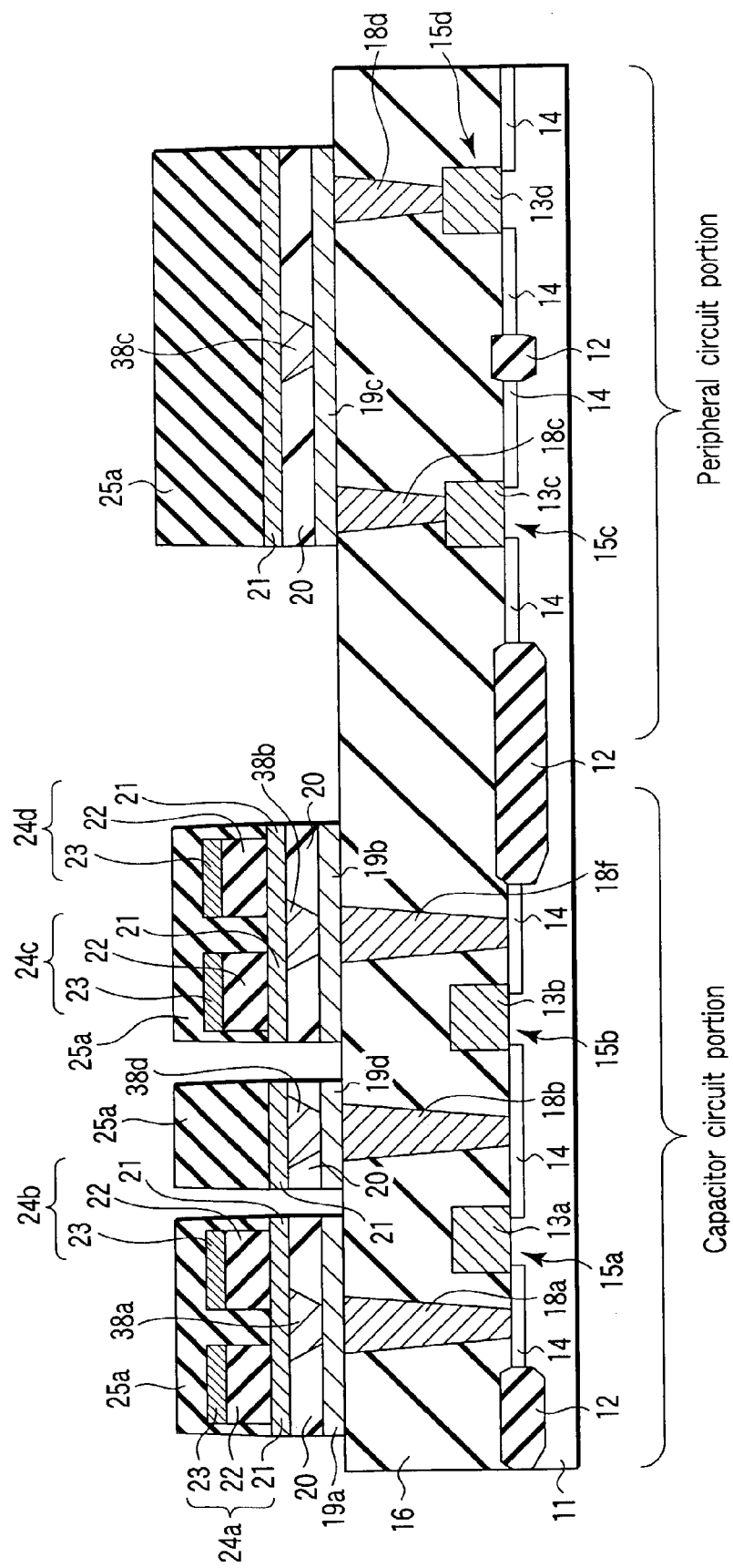

In the next step, the lower electrode 21 is patterned with the patterned interlayer insulating film 25*a* used as a mask, as shown in FIG. 71, followed by patterning the interlayer insulating film 20 with the patterned interlayer insulating film 25*a* used as a mask, as shown in FIG. 72. Further, the material layer 19 is patterned with the patterned interlayer insulating film 25*a* used as a mask so as to form the conductive oxygen barrier films 19*a*, 19*b*, 19*c* and 19*d*, as shown in FIG. 73.

Figure 75:
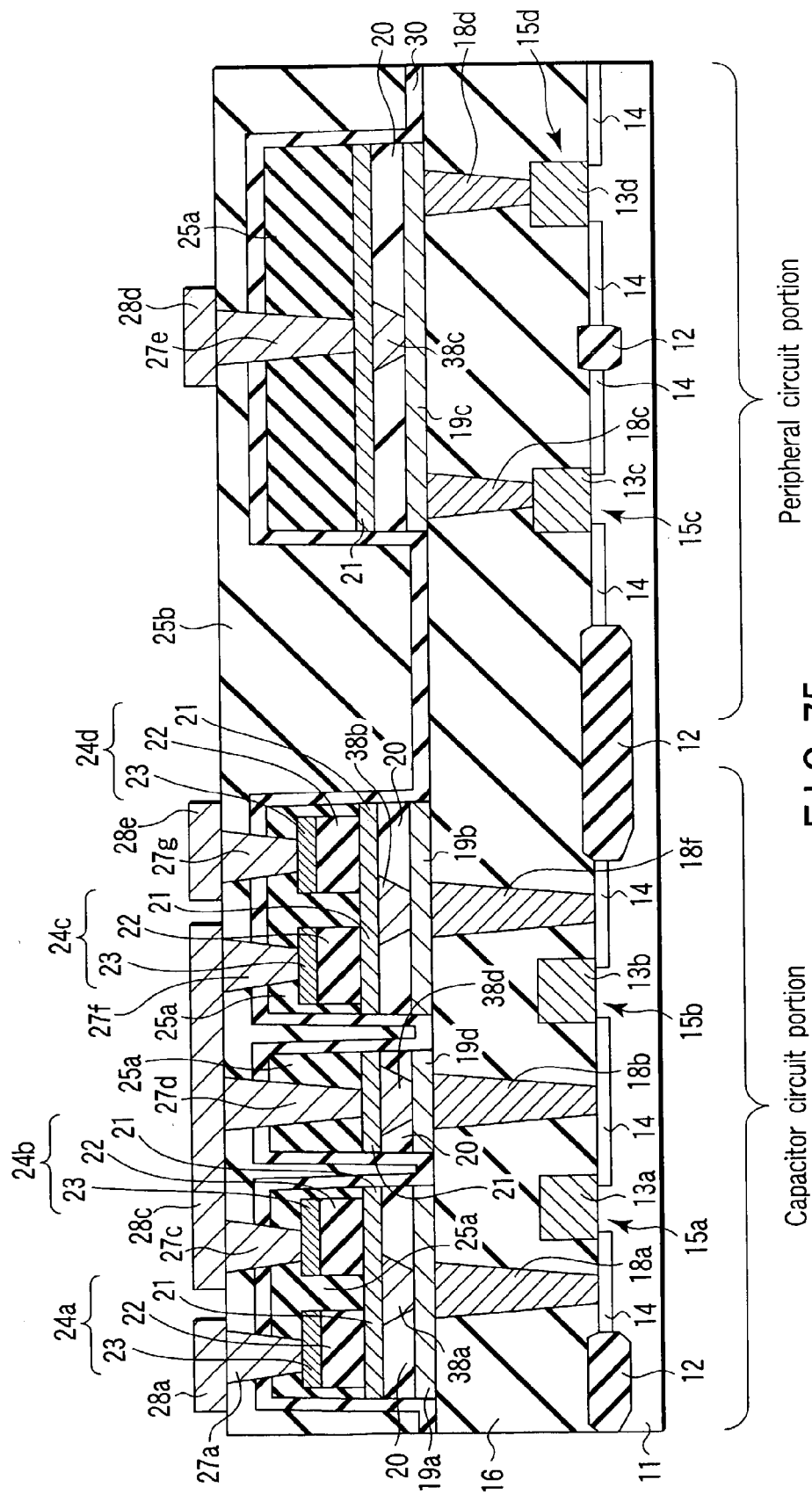

In the next step, an insulating barrier film 30 is formed to cover the interlayer insulating films 25*a*, 16 as shown in FIG. 74. Further, an interlayer insulating film 25*b* is formed on the insulating oxygen barrier film 30, as shown in FIG. 75, followed by selectively removing the interlayer insulating films 25*a*, 25*b* and the insulating oxygen barrier film 30 so as to form contact holes and subsequently filling each of these contact holes with a metallic material so as to form contacts 27*a*, 27*c*, 27*d*, 27*e*, 37*f*, 27*d*.

It should be noted that the contact 27*a* is connected to the upper electrode 23 of the ferroelectric capacitor 24*a*. The contact 27*c* is connected to the upper electrode 23 of the ferroelectric capacitor 24*b*. The contact 27*d* is connected to the wiring layer 21'. The contact 27*f* is connected to the upper electrode 23 of the ferroelectric capacitor 24*c*. The contact 27*g* is connected to the upper electrode 23 of the ferroelectric capacitor 24*d*. Further, the contact 27*e* is connected to the wiring for the peripheral circuit portion (conductive oxygen barrier film 19*c*).

Then, a wiring material layer is formed to cover the contacts 27*a*, 27*c*, 27*d*, 27*e*, 27*f*, 27*g* and the interlayer insulating film 25, followed by patterning the wiring material layer so as to form wirings 28*a*, 28*c*, 28*d* and 28*e*.

It should be noted that the wiring 28*a* is connected to the contact 27*a*, the wiring 28*c* is connected to the contacts 27*c*, 27*d*, 27*f*, the wiring 29*e* is connected to the contact 27*g*, and the wiring 28*d* is connected to the contact 27*e*.

According to the seventeenth embodiment of the present invention, it is possible to obtain the effects similar to those obtained in the eighth embodiment. It should also be noted that, in the seventeenth embodiment, the conductive oxygen barrier films 19*a*, 19*b*, 19*d* and the lower electrode 21 are patterned simultaneously. It follows that the patterning can be achieved easily, compared with the case where the conductive oxygen barrier films 19*a*, 19*b*, 19*d* are patterned separately from the patterning step of the lower electrode 21.

It should also be noted that, in the seventeenth embodiment of the present invention, the contact 38*d* is formed on the conductive oxygen barrier film 19*d*. As a result, it is possible to make the aspect ratio of the contact 27*d* smaller than that for the eighth embodiment. It follows that it is possible to suppress the defective situation in the buried state of the contact material.

Figure 76:
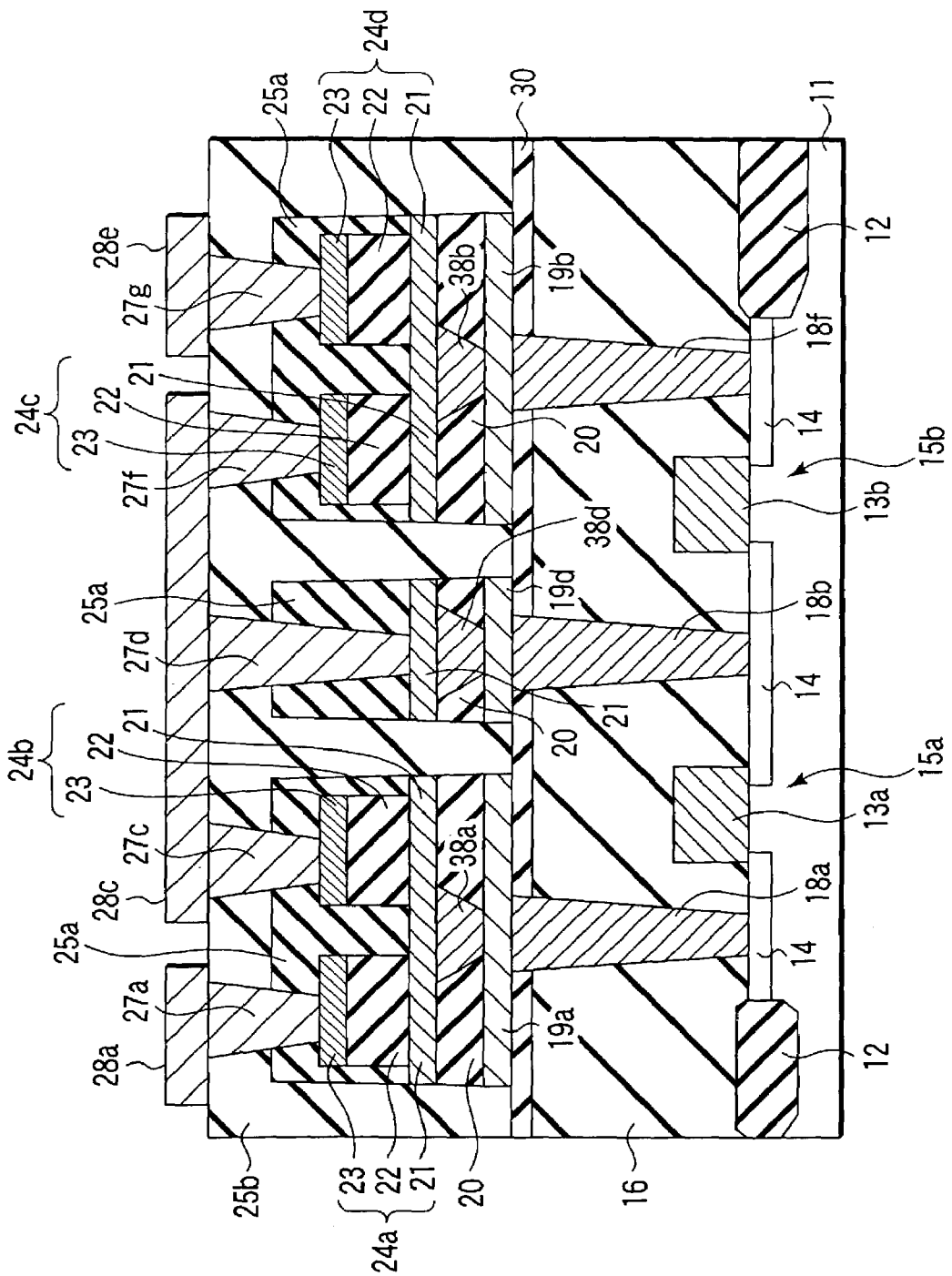
FIG. 76 is a cross sectional view showing the construction of another semiconductor memory device according to the seventeenth embodiment of the present invention.

Incidentally, it is possible to form the insulating oxygen barrier film 30 below the conductive oxygen barrier films 19*a*, 19*b*, 19*d*, as shown in FIG. 76.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a semiconductor substrate;
a first transistor formed on the semiconductor substrate and including a first gate electrode and first and second diffusion layers;
a first contact connected to the first diffusion layer;
a first conductive oxygen barrier film having a lower surface, a side surface, and an upper surface defining the first conductive oxygen barrier film, the lower surface being electrically connected and larger than an upper surface of the first contact;
a first connecting member formed directly above the first conductive oxygen barrier film and connected to the first conductive oxygen barrier film;
a first ferroelectric capacitor formed on the first connecting member and including a first lower electrode, a first upper electrode and a first ferroelectric film interposed between the first lower electrode and the first upper electrode, the first connecting member being in contact with the first lower electrode and not being in direct contact with the first ferroelectric film;
a second transistor formed on the semiconductor substrate and including a second gate electrode, the second diffusion layer and a third diffusion layer;
a second contact connected to the third diffusion layer;
a second conductive oxygen barrier film electrically connected to the second contact, covering at least an upper surface of the second contact, and having an area larger than an area of the upper surface of the second contact;
a second connecting member formed on the second conductive oxygen barrier film and connected to the second conductive oxygen barrier film; and
a second ferroelectric capacitor formed on the second connecting member and including a second lower electrode, a second upper electrode and a second ferroelectric film interposed between the second lower electrode and the second upper electrode, the second connecting member being in contact with the second lower electrode and not being in direct contact with the second ferroelectric film, the first and second upper electrodes being connected to the second diffusion layer.

2. The semiconductor memory device according to claim 1, wherein the first conductive oxygen barrier film is formed of a material containing one of Ir, IrO$_2$, Ru, and RuO$_2$.

3. The semiconductor memory device according to claim 1, wherein the first connecting member includes:
a first wiring formed above the first ferroelectric capacitor;
a second contact connected to the first wiring and to the first lower electrode; and
a third contact connected to the first wiring and to the first conductive oxygen barrier film.

4. The semiconductor memory device according to claim 1, further comprising a second ferroelectric capacitor including a second upper electrode, the first lower electrode and a second ferroelectric film interposed between the second upper electrode and the first lower electrode, wherein the first lower electrode is shared by the first and second ferroelectric capacitors.

5. The semiconductor memory device according to claim 1, further comprising:
a first insulating film formed on the semiconductor substrate and on the first transistor and having the first conductive oxygen barrier film formed on a part of the upper surface of the first insulating film; and
a first insulating oxygen barrier film formed on the first insulating film and on the first conductive oxygen barrier film.

6. The semiconductor memory device according to claim 1, further comprising:
a first insulating film formed on the semiconductor substrate and on the first transistor; and
a first insulating oxygen barrier film formed on the first insulating film and having the first conductive oxygen barrier film formed on a part of the upper surface of the first insulating oxygen barrier film.

7. The semiconductor memory device according to claim 1, further comprising:
a first insulating film formed on the semiconductor substrate and on the first transistor and having an upper surface equal to the upper surface of the first conductive oxygen barrier film; and
a first insulating oxygen barrier film formed on the first insulating film and on the first conductive oxygen barrier film.

8. The semiconductor memory device according to any one of claims 5 to 7, wherein the first insulating oxygen barrier film is formed of a material containing one of Al$_2$O$_3$, SiN, SiON, TiO$_2$ and PZT.

9. The semiconductor memory device according to claim 1, further comprising a side wall insulating film formed on each of the side surfaces of the first ferroelectric capacitor, wherein the first connecting member is provided by a contact formed in self-alignment with the side wall insulating film.

10. The semiconductor memory device according to claim 5, wherein the side wall insulating film is formed of a material containing one of Al$_2$O$_3$, SiN, SiON, TiO$_2$ and PZT.

11. The semiconductor memory device according to claim 1, further comprising:
a third contact connected to the third diffusion layer;
a third conductive oxygen barrier film electrically connected to the third contact and covering at least the upper surface of the third contact; and
a third connecting member connected to the third conductive oxygen barrier film and to the first and second upper electrodes.

12. The semiconductor memory device according to claim 1, wherein the first and second connecting members are formed of a material containing one of Pt, Ir, IrO$_2$, Ru, RuO$_2$, and SRO.

13. The semiconductor memory device according to claim 11, wherein the first connecting member comprises:
a first wiring;
a second contact connected to the first wiring and to the first lower electrode;
a third contact connected to the first wiring; and
a fourth contact connected to the third contact and to the first conductive oxygen barrier film.

14. The semiconductor memory device according to claim 13, wherein the fourth connecting member is formed of a material containing one of Pt, Ir, IrO$_2$, Ru, RuO$_2$, and SRO.

15. The semiconductor memory device according to claim 13, wherein the fourth contact and the second connecting member are formed of the same material.

16. The semiconductor memory device according to claim 11, wherein the second connecting member is provided by a contact or a wiring.

17. The semiconductor memory device according to claim 16, wherein the wiring has edge portions and a central portion, the side surfaces of the edge portions of the wiring being coincident with the side surfaces of the edge portions of the second electrode, and the central portion of the wiring being recessed from the edge portions and being in contact with the second conductive oxygen barrier film.

18. The semiconductor memory device according to claim 16, wherein the wiring is equal to the first upper electrode in the planar shape.

19. The semiconductor memory device according to claim 1, further comprising:
   a second contact connected to the second diffusion layer;
   a second conductive oxygen barrier film electrically connected to the second contact and covering at least the upper surface of the second contact;
   a second ferroelectric capacitor including a second upper electrode, a second lower electrode, and a second ferroelectric film interposed between the second upper and the second lower electrodes; and
   a second connecting member electrically connected to the second conductive oxygen barrier film, and the first lower and the second lower electrodes.

20. The semiconductor memory device according to claim 19, wherein shapes of the first lower electrode, the first upper electrode and the first ferroelectric film are the same to each other in a plan view, and shapes of the second upper electrode, the second lower electrode and the second ferroelectric film are the same to each other in the plan view.

21. The semiconductor memory device according to claim 1, further comprising:
   a second transistor formed on the semiconductor substrate and including a second gate electrode, the second diffusion layer and a third diffusion layer;
   a second contact connected to the second diffusion layer;
   a second conductive oxygen barrier film electrically connected to the second contact and covering at least the upper surface of the second contact;
   a second ferroelectric capacitor including a second lower electrode, a second upper electrode, and a second ferroelectric film interposed between the second lower and the second upper electrodes;
   a second connecting member connected to the second lower electrode and to the second conductive oxygen barrier film;
   a first side wall insulating film formed on each of the both side surfaces of the first ferroelectric capacitor;
   a second side wall insulating film formed on each of the both side surfaces of the second ferroelectric capacitor; and
   a third connecting member connected to the first upper electrode and to the second conductive oxygen barrier film, formed in self-alignment with the first and second side wall insulating films, and formed of a single contact.

22. The semiconductor memory device according to claim 1, further comprising:
   a second contact connected to the second diffusion layer;
   a second conductive oxygen barrier film electrically connected to the second contact, covering at least the upper surface of the second contact, and being equal to the first upper electrode in the planar shape; and
   a second connecting member connected to the second conductive oxygen barrier film and to the first upper electrode.

23. The semiconductor memory device according to claim 22, wherein the first connecting member further comprises:
   a first wiring formed above the first ferroelectric capacitor;
   a third contact connected to the first wiring and to the first lower electrode;
   a third connecting member formed on the first conductive oxygen barrier film and formed of a material identical to the material of the second connecting member;
   a second wiring formed on the third connecting member, formed of a material identical to the material of the first upper electrode, and having a planar shape equal to the planar shape of the first conductive oxygen barrier film; and
   a fourth contact connected to the first wiring and to the second wiring.

24. The semiconductor memory device according to claim 1, further comprising a second conductive oxygen barrier film formed in a peripheral circuit portion and used as a wiring.

25. The semiconductor memory device according to claim 1, wherein a plurality of cells are connected in series, and the first and second diffusion layers of the first transistor being connected, respectively, to the first lower and the first upper electrodes of the first ferroelectric capacitor in each cell.

26. The semiconductor memory device according to claim 11, wherein the first to third conductive oxygen barrier films are formed at the same level.

27. The semiconductor memory device according to claim 1, further comprising:
   a third ferroelectric capacitor including the first lower electrode, a third upper electrode and a third ferroelectric film interposed between the first lower electrode and the third upper electrode, and
   a fourth ferroelectric capacitor including the second lower electrode, a fourth upper electrode and a fourth ferroelectric film interposed between the second lower electrode and the fourth upper electrode,
   wherein the first lower electrode is shared by the first and third ferroelectric capacitors, and the second lower electrode is shared by the second and fourth ferroelectric capacitors.

* * * * *